United States Patent
Nelson et al.

(10) Patent No.: US 10,749,535 B2
(45) Date of Patent: Aug. 18, 2020

(54) APPARATUS AND METHODS FOR DISTRIBUTED TIMING USING DIGITAL TIME STAMPS FROM A TIME-TO-DIGITAL CONVERTER

(71) Applicant: Analog Devices, Inc., Norwood, MA (US)

(72) Inventors: Reuben P. Nelson, Vancouver (CA); Neil E. Weeks, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 14 days.

(21) Appl. No.: 16/011,970

(22) Filed: Jun. 19, 2018

(65) Prior Publication Data

US 2019/0004563 A1 Jan. 3, 2019

Related U.S. Application Data

(60) Provisional application No. 62/526,172, filed on Jun. 28, 2017.

(51) Int. Cl.
*G06F 1/12* (2006.01)
*H03L 7/081* (2006.01)
(Continued)

(52) U.S. Cl.
CPC .............. *H03L 7/0814* (2013.01); *G06F 1/10* (2013.01); *G06F 1/12* (2013.01); *H03L 7/0807* (2013.01);
(Continued)

(58) Field of Classification Search
CPC combination set(s) only.
See application file for complete search history.

(56) References Cited

U.S. PATENT DOCUMENTS

| | | |
|---|---|---|
| 4,031,317 A | 6/1977 | McCain et al. |
| 4,635,000 A | 1/1987 | Swanberg |

(Continued)

FOREIGN PATENT DOCUMENTS

| | | |
|---|---|---|
| CN | 102591197 A | 7/2012 |
| CN | 102594341 A | 7/2012 |

(Continued)

OTHER PUBLICATIONS

Extended European Search Report for International Application No. 18178638.5 dated Nov. 26, 2018 in 11 pages.

(Continued)

*Primary Examiner* — Raymond N Phan
(74) *Attorney, Agent, or Firm* — Knobbe, Martens, Olson & Bear, LLP

(57) ABSTRACT

Apparatus and methods for clock synchronization and frequency translation are provided herein. Clock synchronization and frequency translation integrated circuits (ICs) generate one or more output clock signals having a controlled timing relationship with respect to one or more reference signals. The teachings herein provide a number of improvements to clock synchronization and frequency translation ICs, including, but not limited to, reduction of system clock error, reduced variation in clock propagation delay, lower latency monitoring of reference signals, precision timing distribution and recovery, extrapolation of timing events for enhanced phase-locked loop (PLL) update rate, fast PLL locking, improved reference signal phase shift detection, enhanced phase offset detection between reference signals, and/or alignment to phase information lost in decimation.

20 Claims, 37 Drawing Sheets

(51) Int. Cl.
*H03L 7/08* (2006.01)
*G06F 1/10* (2006.01)
*H03L 7/10* (2006.01)
*H04B 1/16* (2006.01)
*H03K 5/00* (2006.01)

(52) U.S. Cl.
CPC ...... *H03K 2005/00143* (2013.01); *H03L 7/10* (2013.01); *H03L 2207/50* (2013.01); *H04B 1/16* (2013.01)

(56) References Cited

U.S. PATENT DOCUMENTS

| | | | |
|---|---|---|---|
| 4,827,225 A | 5/1989 | Lee | |
| 5,036,294 A | 7/1991 | McCaslin | |
| 5,388,127 A | 2/1995 | Scarpa | |
| 5,481,573 A | 1/1996 | Jacobowitz et al. | |
| 5,604,468 A | 2/1997 | Gillig | |
| 5,644,271 A | 7/1997 | Mollov et al. | |
| 5,719,514 A | 2/1998 | Sato | |
| 5,757,238 A | 5/1998 | Ferraiolo et al. | |
| 5,821,817 A | 10/1998 | McCorkle | |
| 5,832,048 A | 11/1998 | Woodman, Jr. | |
| 5,982,210 A | 11/1999 | Rogers | |
| 6,259,293 B1 | 7/2001 | Hayase et al. | |
| 6,336,191 B1 | 1/2002 | Smolders et al. | |
| 6,337,589 B1 | 1/2002 | Ooishi | |
| 6,535,946 B1 | 3/2003 | Bryant et al. | |
| 6,570,457 B2 | 5/2003 | Fischer | |
| 6,608,863 B1 | 8/2003 | Onizawa et al. | |
| 6,650,187 B1 | 11/2003 | Riddle et al. | |
| 6,650,721 B1 | 11/2003 | Janesch et al. | |
| 6,664,827 B2 | 12/2003 | O'Leary et al. | |
| 6,760,346 B1 | 7/2004 | Suemura et al. | |
| 6,788,154 B2 | 9/2004 | Maneatis | |
| 6,819,157 B2 | 11/2004 | Cao et al. | |
| 6,943,610 B2 | 9/2005 | Saint-Laurent | |
| 7,042,972 B2 | 5/2006 | Fahim | |
| 7,050,521 B1 | 5/2006 | Alavi | |
| 7,126,429 B2 | 10/2006 | Mitric | |
| 7,191,355 B1 | 3/2007 | Ouellette et al. | |
| 7,369,002 B2 | 5/2008 | Spijker et al. | |
| 7,382,169 B2 | 6/2008 | Nikolov et al. | |
| 7,388,419 B2 | 6/2008 | Gk et al. | |
| 7,400,555 B2 | 7/2008 | Franch et al. | |
| 7,415,090 B2 | 8/2008 | Jeong | |
| 7,511,543 B2 | 3/2009 | Friedman et al. | |
| 7,529,295 B1 | 5/2009 | Nezami | |
| 7,643,513 B2 | 1/2010 | Yang et al. | |
| 7,656,985 B1 | 2/2010 | Aweya et al. | |
| 7,714,669 B2 | 5/2010 | Gotz et al. | |
| 7,746,178 B1 | 6/2010 | Humphreys et al. | |
| 7,888,973 B1 | 2/2011 | Rezzi et al. | |
| 7,941,689 B2 | 5/2011 | Hwang et al. | |
| 7,978,111 B2 | 7/2011 | Sun et al. | |
| 8,022,849 B2 | 9/2011 | Zhang et al. | |
| 8,058,915 B2 | 11/2011 | Chiu et al. | |
| 8,077,822 B2 | 12/2011 | Sun et al. | |
| 8,139,704 B2 | 3/2012 | Heinrich | |
| 8,253,454 B2 | 8/2012 | Lin | |
| 8,271,223 B2 | 9/2012 | Rawlins et al. | |
| 8,355,239 B2 | 1/2013 | Hammerschmidt et al. | |
| 8,362,815 B2 | 1/2013 | Pavlovic et al. | |
| 8,378,724 B2 | 2/2013 | David et al. | |
| 8,390,356 B2 | 3/2013 | Shinde | |
| 8,437,441 B2 | 5/2013 | Lin et al. | |
| 8,471,611 B2 | 6/2013 | Sfikas et al. | |
| 8,643,410 B1 | 2/2014 | Bhargava et al. | |
| 8,643,414 B1 | 2/2014 | Navid | |
| 8,669,816 B2 | 3/2014 | Chen et al. | |
| 8,941,424 B2 | 1/2015 | Jin | |
| 8,957,712 B2 | 2/2015 | Tang et al. | |
| 9,065,627 B2 | 6/2015 | Aweya et al. | |
| 9,197,466 B2 | 11/2015 | Tarighat Mehrabani | |
| 9,484,855 B2 | 11/2016 | Cheyne et al. | |
| 9,548,750 B2 | 1/2017 | Tertinek et al. | |
| 9,564,908 B2 | 2/2017 | Song et al. | |
| 9,596,073 B1 | 3/2017 | Reyes et al. | |
| 9,628,094 B2 | 4/2017 | Lotfy et al. | |
| 9,742,549 B1 | 8/2017 | Wang et al. | |
| 9,768,867 B2 | 9/2017 | Baggen et al. | |
| 9,859,903 B2 | 1/2018 | Unruh et al. | |
| 9,923,710 B2 | 3/2018 | Chan et al. | |
| 10,623,006 B2 | 4/2020 | Nelson | |
| 2001/0036240 A1 | 11/2001 | Gossmann et al. | |
| 2002/0131538 A1 | 9/2002 | Staszewski et al. | |
| 2002/0190764 A1 | 12/2002 | Nichols | |
| 2002/0199124 A1 | 12/2002 | Adkisson | |
| 2003/0120456 A1 | 6/2003 | Watson, Jr. et al. | |
| 2003/0197537 A1 | 10/2003 | Saint-laurent | |
| 2004/0146098 A1 | 7/2004 | Eliezer et al. | |
| 2006/0104398 A1 | 5/2006 | Su et al. | |
| 2007/0296473 A1 | 12/2007 | Oh | |
| 2008/0046771 A1 | 2/2008 | Hsu | |
| 2009/0116313 A1 | 5/2009 | Jang | |
| 2009/0119533 A1 | 5/2009 | Kim et al. | |
| 2009/0262878 A1 | 10/2009 | Sun et al. | |
| 2010/0244971 A1 | 9/2010 | Zhu et al. | |
| 2011/0032013 A1 | 2/2011 | Nelson et al. | |
| 2011/0140737 A1 | 6/2011 | Rivoir | |
| 2011/0148490 A1 | 6/2011 | Lee et al. | |
| 2011/0221486 A1 | 9/2011 | Hirata et al. | |
| 2011/0249718 A1 | 10/2011 | Zerbe | |
| 2012/0013406 A1 | 1/2012 | Zhu et al. | |
| 2012/0112806 A1 | 5/2012 | Dayi | |
| 2012/0139597 A1 | 6/2012 | Blondel et al. | |
| 2012/0161829 A1 | 6/2012 | Fernald | |
| 2013/0002317 A1 | 1/2013 | Frantzeskakis et al. | |
| 2013/0093471 A1 | 4/2013 | Cho et al. | |
| 2013/0106476 A1 | 5/2013 | Joubert et al. | |
| 2014/0145770 A1* | 5/2014 | Kropp | H03L 7/0814 327/158 |
| 2014/0210532 A1 | 7/2014 | Jenkins | |
| 2014/0320181 A1 | 10/2014 | Mitric et al. | |
| 2015/0109042 A1 | 4/2015 | Ma | |
| 2015/0372690 A1 | 12/2015 | Tertinek et al. | |
| 2016/0352506 A1* | 12/2016 | Huang | H04L 7/0332 |
| 2017/0005665 A1 | 1/2017 | Swaminathan et al. | |
| 2017/0194971 A1 | 7/2017 | Yonezawa | |
| 2017/0353171 A1 | 12/2017 | Ito et al. | |
| 2017/0366333 A1 | 12/2017 | Chan et al. | |
| 2018/0102779 A1* | 4/2018 | Behel | H03K 5/1508 |
| 2018/0267480 A1 | 9/2018 | Mahajan et al. | |
| 2019/0004565 A1 | 1/2019 | Nelson | |
| 2019/0007052 A1 | 1/2019 | Nelson | |
| 2019/0007055 A1 | 1/2019 | Nelson | |
| 2020/0076439 A1 | 3/2020 | Weeks et al. | |

FOREIGN PATENT DOCUMENTS

| | | |
|---|---|---|
| EP | 1 912 361 A1 | 4/2008 |
| JP | 2006-503480 A | 1/2006 |
| JP | 2006-109357 A | 4/2006 |
| JP | 2013-500614 A | 1/2013 |
| WO | WO 2004/036341 A2 | 4/2004 |

OTHER PUBLICATIONS

AD9542, Analog Devices Data Sheet "Quad Input, Five-Output, Dual DPLL Synchronizer and Adaptive Clock Translator," dated Sep. 2017, in 61 pages.

AD9543, Analog Devices Data Sheet "Quad Input, 10-Output, Dual DPLL/IEEE 1588 Synchronizer and Jitter Cleaner," dated Oct. 2017, in 66 pages.

AD9545, Analog Devices Data Sheet Quad Input, 10-Output, Dual DPLL/IEEE 1588 1 pp. Synchronizer and Jitter Cleaner, dated Oct. 2018, in 169 pages.

Office Action with Translation Issued for Japanese Application No. 2018-121770 dated Jul. 12, 2019 in 10 pages.

AD9544, Analog Devices Data Sheet Quad Input, 10-Output, Dual DPLL, 1 pps. Synchronizer and Jitter Cleaner, Oct. 2017, in 62 pages.

(56) References Cited

OTHER PUBLICATIONS

AD9545, Analog Devices Data Sheet Quad Input, 10-Output, Dual DPLL/IEEE 1588 1 pp. Synchronizer and Jitter Cleaner, Apr. 2018, in 157 pages.

Agilent Technologies "Understanding Jitter and Wander Measurements and Standards" Second Edition, Feb. 2003, in 140 pages.

Chapter 10 "Timing Issues in Digital Circuits," Apr. 2002, in 58 pages.

Chen et al. "A Low-Power 2.4-GHz CMOS GFSK Transceiver With a Digital Demodulator Using Time-to-Digital Conversion" IEEE Transactions on Circuits and Systems—I: Regular Papers, vol. 56, No. 12, Dec. 2009, in 11 pages.

Hanumolu et al., "Digitally-Enhanced Phase-Locking Circuits" IEEE 2007 Custom Integrated Circuits Conference (CICC), Oct. 2007, in 8 pages.

Levine, J., "Measuring Time and Comparing Clocks" NIST and University of Colorado, Jul. 2016, in 53 pages.

Microchip Technology Inc., MCP37211-200 and MCP37D11-200 "200 Msps, 12-Bit Low-Power A DC with 8-Channel MUX," Aug. 2016, in 143 pages.

Patel et al., "Comparative Study of PLL, DDS and DDS-based PLL Synthesis Techniques for Communication System" International Journal of Electronics Engineering, Jun. 2010, in 7 pages.

Samarah et al., "A Digital Phase-Locked Loop With Calibrated Coarse and Stochastic Fine TDC" IEEE Solid State Circuits Society, Jun. 2013, in 4 pages.

Scott et al., "Phase Noise of Integer-N and Fractional-N PLL Synthesizers," printed Oct. 2, 2018 in 8 pages.

Sullivan et al., "Characterization of Clocks and Oscillators" National Institute of Standards and Technology, Mar. 1990, in 357 pages.

Texas Instruments, CGS700 "AN-1006 Phase-Locked Loop Based Clock Generators" Literature No. SNOA351, Jun. 1995, in 8 pages.

Weigandt, T., "Low-Phase-Noise, Low-Timing-Jitter Design Techniques for Delay Cell Based VCOs and Frequency Synthesizers" A dissertation submitted in partial satisfaction of the requirements for the degree of Doctor of Philosophy in Engineering—Electrical Engineering and Computer Sciences, University of California Berkeley, Spring 1998, in 222 pages.

\* cited by examiner

APPARATUS AND METHODS FOR DISTRIBUTED TIMING USING DIGITAL TIME STAMPS FROM A TIME-TO-DIGITAL CONVERTER

CROSS-REFERENCE TO RELATED APPLICATIONS

The present application claims priority to U.S. Provisional Patent Application No. 62/526,172, filed Jun. 28, 2017, and titled "APPARATUS AND METHODS FOR CLOCK SYNCHRONIZATION AND FREQUENCY TRANSLATION," the entirety of which is hereby incorporated herein by reference.

FIELD OF THE DISCLOSURE

Embodiments of the invention relate to electronic devices, and more particularly, to circuitry for clock and signal synthesis.

BACKGROUND

A wide variety of electronic systems operate based on timing of clock signals. For instance, examples of electronic circuitry that operate based on clock signal timing include, but are not limited to, analog-to-digital converters (ADCs), digital-to-analog converters (DACs), wireline or optical data communication links, and/or radio frequency front-ends.

SUMMARY OF THE DISCLOSURE

Apparatus and methods for clock synchronization and frequency translation are provided herein. Clock synchronization and frequency translation integrated circuits (ICs) generate one or more output clock signals having a controlled timing relationship with respect to one or more reference signals. The teachings herein provide a number of improvements to clock synchronization and frequency translation ICs, including, but not limited to, reduction of system clock error, reduced variation in clock propagation delay, lower latency monitoring of reference signals, precision timing distribution and recovery, extrapolation of timing events for enhanced phase-locked loop (PLL) update rate, fast PLL locking, improved reference signal phase shift detection, enhanced phase offset detection between reference signals, and/or alignment to phase information lost in decimation.

In one aspect, an integrated circuit (IC) with system clock compensation is provided. The IC includes a system clock generation circuit configured to generate a system clock signal based on a system reference signal, one or more circuit blocks having timing controlled by the system clock signal, and a system clock compensation circuit configured to generate one or more compensation signals operable to compensate the one or more circuit blocks for an error of the system clock signal.

In certain embodiments, the system clock compensation circuit includes an error model configured to generate an estimate of the error of the system clock signal based on one or more operating conditions. In a number of embodiments, the error model is configured to receive a temperature signal indicating a temperature condition. In various embodiments, the error model is configured to receive a vibration signal indicating a vibration condition. In several embodiments, the error model is configured to receive a supply voltage signal indicating a supply voltage condition. In accordance with several embodiments, the IC is configured to receive one or more coefficients of the error model over an interface. According to some embodiments, the system clock compensation circuit further includes a system clock error calculation circuit configured to digitally generate the one or more compensation signals based on the estimate from the error model. In accordance with various embodiments, the error model includes a polynomial model.

In some embodiments, the IC further includes a clock difference calculation circuit configured to provide the system clock compensation circuit with an estimate of the error of the system clock signal based on comparing the system clock signal to a stable reference signal. In several embodiments, the clock difference calculation circuit includes a digital phase-locked loop (DPLL).

In various embodiments, the system clock compensation circuit is configured to generate the one or more compensation signals based on combining a closed-loop estimate of the error of the system clock signal with an open-loop estimate of the error the system clock signal.

In a number of embodiments, the one or more circuit blocks includes at least one of a time-to-digital converter (TDC), a filter, a DPLL, a numerically controlled oscillator (NCO), or a reference monitor.

In several embodiments, the error of the system clock signal includes at least one of a frequency stability error or a frequency accuracy error.

In various embodiments, the system clock generation circuit includes a system clock phased-locked loop (PLL).

In another aspect, an electronic system with system clock compensation is provided. The electronic system includes a clock source configured to generate a system reference signal, and an IC including a system reference pin configured to receive the system reference signal, a system clock generation circuit configured to generate a system clock signal based on the system reference signal, one or more circuit blocks having timing controlled by the system clock signal, and a system clock compensation circuit configured to generate one or more compensation signals operable to compensate the one or more circuit blocks for an error of the system clock signal.

In some embodiments, the system clock compensation circuit includes an error model configured to generate an estimate of the error of the system clock signal based on one or more operating conditions. According to several embodiments, the error model is configured to receive a temperature signal indicating a temperature condition. In a number of embodiments, the IC includes an internal temperature sensor configured to generate the temperature signal. In accordance with various embodiments, the electronic system further includes an external temperature sensor configured to generate the temperature signal. According to a number of embodiments, the error model is configured to receive a vibration signal indicating a vibration condition. In accordance with a number of embodiments, the error model is configured to receive a supply voltage signal indicating a supply voltage condition. According to various embodiments, the IC further includes an interface configured to receive one or more coefficients of the error model. According to some embodiments, the system clock compensation circuit further includes a system clock error calculation circuit configured to digitally generate the one or more compensation signals based on the estimate from the error model. In several embodiments, the error model includes a polynomial model.

In some embodiments, the IC further includes a clock difference calculation circuit configured to provide the system clock compensation circuit with an estimate of the error of the system clock signal based on comparing the system clock signal to a stable reference signal. According to several embodiments, the clock difference calculation circuit includes a DPLL.

In various embodiments, the system clock compensation circuit is configured to generate the one or more compensation signals based on combining a closed-loop estimate of the error of the system clock signal with an open-loop estimate of the error the system clock signal.

In several embodiments, the one or more circuit blocks includes at least one of a TDC, a filter, a DPLL, an NCO, or a reference monitor.

According to some embodiments, the system clock generation circuit includes a system clock PLL.

In a number of embodiments, the clock source includes at least one of an oscillator or a resonator.

In another aspect, a method of system clock compensation is provided. The method includes generating a system clock signal based on a system reference signal, controlling timing of one or more circuit blocks using the system clock signal, and digitally compensating the one or more circuit blocks for an error of the system clock signal.

In various embodiments, the method further includes estimating the error of the system clock signal based on one more operating conditions using a model, and generating one or more digital compensation signals that control the one or more circuit blocks based on the estimated error.

In several embodiments, the method further includes estimating the error of the system clock signal based on comparing the system clock signal to a stable reference signal, and generating one or more digital compensation signals that control the one or more circuit blocks based on the estimated error.

According to a number of embodiments, digitally compensating the one or more circuit blocks includes compensating at least one a TDC, a filter, a DPLL, an NCO, or a reference monitor.

In another aspect, an electronic system includes an IC including a timing circuit configured to generate an output signal based on timing of an input reference signal, an output pin configured to receive the output signal from the timing circuit, and a delay compensation circuit configured to provide one or more compensation signals to the timing circuit. The electronic system further includes a signal path configured to route the output signal from the output pin to a destination node. The one or more compensation signals are operable to digitally compensate the timing circuit for a variation in delay of the signal path.

In some embodiments, the delay compensation circuit includes a delay model configured to generate an estimate of the variation in delay based on one or more operating conditions. In various embodiments, the delay model is configured to receive a temperature signal indicating a temperature condition. According to a number of embodiments, the IC further includes an interface configured to receive one or more coefficients of the delay model. In several embodiments, the delay compensation circuit further includes a delay error calculation circuit configured to digitally generate the one or more compensation signals based on the estimate from the delay model. In accordance with certain embodiments, the delay model includes a polynomial model. According to various embodiments, the delay model is further configured to account for an internal delay of the IC.

In a number of embodiments, the electronic system further includes a return path of the output signal, and the IC further includes a return path pin configured to receive a returned signal from the return path, and a delay difference detector configured to provide the delay compensation circuit with an estimate of the delay of the signal path based on comparing the output signal to the returned signal. In various embodiments, the IC further includes a delay error calculation circuit configured to generate the one or more compensation signals based on accounting for a round trip delay of the output signal from the output pin to the return pin.

In several embodiments, the timing circuit includes a DPLL. In according with certain embodiments, at least one of the one or more compensation signals is configured to provide a digital adjustment to the DPLL.

In various embodiments, the timing circuit includes at least one digitally-controllable delay element configured to receive at least one of the compensation signals.

In another aspect, an IC with compensation for signal path delay variation is provided. The IC includes a timing circuit configured to generate an output signal based on timing of an input reference signal, an output pin configured to provide the output signal to a destination node via a signal path, and a delay compensation circuit configured to generate one or more compensation signals operable to digitally compensate the timing circuit for a variation in delay of the signal path to thereby control a phase of the output signal at the destination node relative to a phase of the input reference signal.

In some embodiments, the delay compensation circuit includes a delay model configured to generate an estimate of the variation in delay based on one or more operating conditions. In accordance with certain embodiments, the delay model is configured to receive a temperature signal indicating a temperature condition. In various embodiments, the IC further includes an interface configured to receive one or more coefficients of the delay model. In several embodiments, the delay compensation circuit further includes a delay error calculation circuit configured to digitally generate the one or more compensation signals based on the estimate from the delay model. In a number of embodiments, the delay model includes a polynomial model. According to various embodiments, the delay model is further configured to account for an internal delay of the IC.

In certain embodiments, the IC further includes a return path pin configured to receive a returned signal from the signal path, and a delay difference detector configured to provide the delay compensation circuit with an estimate of the delay of the signal path based on comparing the output signal to the returned signal. According to various embodiments, the IC further includes a delay error calculation circuit configured to generate the one or more compensation signals based on accounting for a round trip delay of the output signal from the output pin to the return pin.

In several embodiments, the timing circuit includes a DPLL. According to various embodiments, at least one of the one or more compensation signals is configured to provide a digital adjustment to the DPLL.

In a number of embodiments, the timing circuit includes at least one digitally-controllable delay element configured to receive at least one of the compensation signals.

In another aspect, a method of signal path delay compensation in an electronic system is provided. The method includes generating an output signal based on an input reference signal using a timing circuit of an IC, providing the output signal from an output pin of the IC to a destination node via a signal path, and digitally compensating the timing circuit for variation in delay of the signal path to thereby control a phase of the output signal at the destination node relative to a phase of the input reference signal.

In a number of embodiments, the method further includes estimating the variation in delay based on one more operating conditions using a delay model, and generating one or more digital compensation signals for digitally compensating the timing circuit based on the estimated error.

In several embodiments, the method further includes receiving a return signal on a return signal pin of the IC, estimating the variation in delay based on comparing the output signal to the return signal, and generating one or more digital compensation signals for digitally compensating the timing circuit based on the estimated error.

In some embodiments, digitally compensating the timing circuit includes providing a phase adjustment to a DPLL.

In another aspect, an IC with compensation for signal path delay variation is provided. The IC includes a timing circuit configured to generate an output signal based on timing of an input reference signal, a signal path configured to provide the output signal to a destination node, and a delay compensation circuit configured to generate one or more compensation signals operable to digitally compensate the timing circuit for a variation in delay of the signal path to thereby control a phase of the output signal at the destination node relative to a phase of the input reference signal.

In certain embodiments, the delay compensation circuit includes a delay model configured to generate an estimate of the variation in delay based on one or more operating conditions. In a number of embodiments, the delay model is configured to receive a temperature signal indicating a temperature condition. According to several embodiments, the IC further includes an interface configured to receive one or more coefficients of the delay model. In some embodiments, the delay compensation circuit further includes a delay error calculation circuit configured to digitally generate the one or more compensation signals based on the estimate from the delay model. According to various embodiments, the delay model includes a polynomial model. In accordance with several embodiments, the delay model is further configured to account for an internal delay of the IC.

In a number of embodiments, the timing circuit includes a DPLL. According to several embodiments, at least one of the one or more compensation signals is configured to provide a digital adjustment to the DPLL.

In various embodiments, the timing circuit includes at least one digitally-controllable delay element configured to receive at least one of the compensation signals.

In another aspect, an IC with reference monitoring is provided. The IC includes a clock measurement circuit configured to generate a plurality of digital measurements of a reference clock signal based on timing of a system clock signal, and a reference monitor configured to generate a monitor output signal indicating whether the reference clock signal is within a tolerance of one or more tolerance parameters. The reference monitor includes a statistical processing circuit configured to process the plurality of digital measurements to generate an estimate of measurement uncertainty, and to control a latency of the reference monitor in generating the monitor output signal based on the estimate of measurement uncertainty.

In some embodiments, the statistical processing circuit is configured to compute a variance of the plurality of digital measurements over a time window. According to a number of embodiments, the one or more tolerance parameters includes a nominal period and a period offset limit, and the statistical processing circuit is further configured to control the latency based on comparing the variance to the period offset limit.

In a number of embodiments, the statistical processing circuit is further configured to determine a number of samples of the reference clock signal sufficient to estimate a period of the reference clock signal within a confidence interval.

In various embodiments, the one or more tolerance parameters includes a jitter limit.

According to a number of embodiments, the statistical processing circuit is further configured to generate a plurality of estimates of measurement uncertainty associated with a plurality of partially overlapping time windows.

In several embodiments, the statistical processing circuit is configured to compute a mean and a variance of the plurality of digital measurements over a time window.

In some embodiments, the clock measurement circuit includes a TDC configured to generate a plurality of digital time stamps representing a plurality of transition times of the reference clock signal. According to various embodiments, the IC further includes a DPLL configured to process the plurality of digital time stamps.

In another aspect, a method of reference monitoring in a clock system is provided. The method includes generating a plurality of digital measurements of a reference clock signal based on timing of a system clock signal, processing the plurality of digital measurements to generate an estimate of measurement uncertainty using a reference monitor, and controlling a measurement latency of the reference monitor based on the estimate of measurement uncertainty.

In various embodiments, the method further includes detecting whether the reference clock signal is within a tolerance of one or more tolerance parameters using the reference monitor.

In several embodiments, processing the plurality of digital measurements includes computing a variance of the plurality of digital measurements over a time window.

In a number of embodiments, processing the plurality of digital measurements includes determining a number of samples of the reference clock signal sufficient to estimate a period of the reference clock signal within a confidence interval.

In various embodiments, generating the plurality of digital measurements includes generating a plurality of digital time stamps representing a plurality of transition times of the reference clock signal.

In another aspect, a reference signal monitoring system with dynamically controlled latency is provided. The reference signal monitoring system includes a TDC configured to generate a plurality of digital time stamps representing a plurality of transition times of a reference clock signal, and a reference monitor configured to generate a monitor output signal indicating a status of the reference clock signal. The reference monitor is configured to process the plurality of digital time stamps to generate an estimate of measurement uncertainty, and to control a latency of the reference monitor in generating the monitor output signal based on the estimate of measurement uncertainty.

In a number of embodiments, the reference monitor is further configured to compute a variance of the plurality of digital time stamps over a time window. According to various embodiments, the reference monitor is further configured to control the latency based on comparing the variance to a period offset limit.

In several embodiments, the reference monitor is further configured to determine a number of samples of the reference clock signal sufficient to estimate a period of the reference clock signal within a confidence interval.

In various embodiments, the monitor output signal indicates whether the reference clock signal is within a jitter limit.

According to a number of embodiments, the reference monitor is further configured to generate a plurality of estimates of measurement uncertainty associated with a plurality of partially overlapping time windows.

In another aspect, a distributed timing system is provided. The distributed timing system includes a source IC configured to detect a timing of a signal based on a common reference signal, and to generate a digital timing signal that digitally represents the timing of the signal. The distributed timing system further includes a digital interface electrically coupled to the source IC, and a destination IC configured to receive the digital timing signal from the digital interface. The destination IC is configured to recover the signal based on the digital timing signal and the common reference signal.

In various embodiments, the source IC includes a TDC configured to generate a plurality of digital time stamps representing a plurality of transition times of the signal, and a format conversion circuit configured to generate the digital timing signal based on the plurality of digital time stamps. According to a number of embodiments, the source IC further includes a synchronization circuit configured to synchronize the TDC and the format conversion circuit based on the common reference signal. In several embodiments, the distributed timing system further includes a system clock PLL configured to generate a system clock signal for the synchronization circuit based on a local system reference signal.

In some embodiments, the digital interface is a serial interface.

In several embodiments, the distributed timing system further includes one or more additional source ICs configured to provide one or more additional digital timing signals to the digital interface.

In a number of embodiments, the destination IC includes a format conversion circuit configured to process the digital timing signal to generate a plurality of digital time stamps representing a plurality of transition times of the signal. According to certain embodiments, the distributed timing system further includes a DPLL configured to recover the signal based on the plurality of digital time stamps. In several embodiments, the source IC further includes a synchronization circuit configured to synchronize the format conversion circuit based on the common reference signal. According to some embodiments, the distributed timing system further includes a system clock PLL configured to generate a system clock signal for the synchronization circuit based on a local system reference signal.

In certain embodiments, the distributed timing system further includes one or more additional destination ICs configured to receive the digital timing signal from the timing interface, and to recover the signal based on the digital timing signal and the common reference signal.

In a number of embodiments, the destination IC recovers a frequency of the signal.

In various embodiments, the destination IC recovers both a frequency of the signal and a phase of the signal.

In another aspect, a clock synchronization and frequency translation IC is provided. The IC includes a first pin configured to receive a digital timing signal representing a timing of a signal, a format conversion circuit configured to process the digital timing signal to generate a plurality of reference digital time stamps indicating a plurality of transition times of the signal, and a DPLL configured to recover the signal from the plurality of reference digital time stamps.

In a number of embodiments, the DPLL recovers a frequency of the signal.

In various embodiments, the DPLL recovers both a frequency of the signal and a phase of the signal.

In some embodiments, the IC further includes a second pin configured to receive a common reference signal, and a synchronization circuit configured to synchronize the format conversion circuit based on the common reference signal. According to several embodiments, the IC further includes a third pin configured to receive a system reference signal, and a system clock PLL configured to generate a system clock signal for the synchronization circuit based on a system reference signal.

In another aspect, a method of distributed timing is provided. The method includes detecting timing of a signal based on a common reference signal using a first IC, generating a digital representation of the detected timing using the first IC, transmitting the digital representation of the detected timing from the first IC to a second IC over a digital interface, and recovering the signal in the second IC based on the digital representation of the detected timing and the common reference signal.

In various embodiments, generating the digital representation of the detected timing includes using a TDC to generate a plurality of digital time stamps representing a plurality of transition times of the signal.

According to a number of embodiments, recovering the signal in the second IC includes processing the digital representation of the detected timing to generate a plurality of reference digital time stamps representing a plurality of transition times of the signal. In certain embodiments, recovering the signal in the second IC further includes using a DPLL to recover the signal from the plurality of reference digital time stamps.

In several embodiments, recovering the signal in the second IC includes recovering both a frequency of the signal and a phase of the signal.

In another aspect, a distributed timing system is provided. The distributed timing system includes a source device configured receive a common time-base signal and to generate a digital data signal representing a timing of a signal. The distributed timing system further includes a data hub configured to receive the digital data signal, and a destination device configured to receive the digital data signal from the data hub, and to recover the signal based on the common time-base signal and the digital data signal.

In a number of embodiments, the distributed timing system further includes one or more additional destination devices configured to receive the digital data signal from the data hub, and to recover the signal based on the common time-base signal and the digital data signal.

In several embodiments, the distributed timing system further includes one or more additional source devices configured to generate one or more digital data signals representing timing of one or more signals, and to provide the one or more digital data signals to the data hub.

In various embodiments, the source device is configured to receive a first local oscillator signal that controls local timing at the source device, and the destination device is configured to receive a second local oscillator signal that controls timing at the destination device.

In a number of embodiments, the destination device recovers a frequency of the signal.

In several embodiments, the destination device recovers both a frequency of the signal and a phase of the signal.

In another aspect, a method of phase detection in a DPLL is provided. The method includes generating a digital representation of a first timing event of an input clock signal to a phase detector, generating a digital representation of a second timing event of the input clock signal, extrapolating a first extrapolated timing event based on adjusting the digital representation of the second timing event by a time interval between the second timing event and the first timing event, and providing phase detection using the first extrapolated timing event.

In various embodiments, the input clock signal includes a reference clock signal to the DPLL.

In a number of embodiments, the input clock signal includes a feedback clock signal to the DPLL.

In several embodiments, extrapolating the first extrapolated timing event includes backwards extrapolation.

In some embodiments, extrapolating the first extrapolated timing event includes forward extrapolation.

In various embodiments, the method further includes using a TDC to generate the digital representations of the first and second timing events.

In certain embodiments, the method further includes estimating the time interval from the input clock signal.

In accordance with a number of embodiment, the method further includes determining the time interval based on an ideal periodicity of the timing events of the input clock signal.

In several embodiments, the method further includes generating a digital representation of a third timing event of the input clock signal, and extrapolating a second extrapolated timing event based on adjusting the digital representation of the third timing event by a time interval between the third timing event and the first timing event.

In some embodiments, the first timing event corresponds to an edge associated with a carrier frequency of the input clock signal, and the second timing event corresponds to an edge associated with a sub-carrier frequency of the input clock signal.

In several embodiments, the first timing event conveys phase information of the input clock signal, and the second timing event conveys frequency information of the input clock signal.

In another aspect, a DPLL includes a first timing detector configured to generate a first plurality of digital representations of timing of a first clock signal, and the first plurality of digital representations include a first digital representation of a first timing event and a second digital representation of a second timing event. The DPLL further includes a second timing detector configured to generate a second plurality of digital representations of timing of a second clock signal, and a phase detector configured to provide phase detection based on the first plurality of digital representations and the second plurality of digital representations. The phase detector is configured to generate a first extrapolated timing event based on adjusting the second digital representation by a time interval between the second timing event and the first timing event, and the phase detector is configured to provide phase detection based on the first extrapolated timing event.

In a number of embodiments, the first clock signal is a reference clock signal to the DPLL, and the second clock signal is a feedback clock signal to the DPLL.

In various embodiments, the first clock signal is a feedback clock signal to the DPLL, and the second clock signal is a reference clock signal to the DPLL.

In several embodiments, the phase detector is configured to generate the first extrapolated timing event based on backwards extrapolation.

In some embodiments, the phase detector is configured to generate the first extrapolated timing event based on forward extrapolation.

According to certain embodiments, the first timing detector includes a first TDC and the second timing detector includes a second TDC.

In a number of embodiments, the phase detector is configured to estimate the time interval based on the first plurality of digital representations and the second plurality of digital representations.

In several embodiments, the phase detector is configured to determine the time interval based on an ideal periodicity of the first clock signal.

According to some embodiments, the first plurality of digital representations includes a third digital representation of a third timing event, and the phase detector is further configured to generate a second extrapolated timing event based on adjusting the digital representation of the third timing event by a time interval between the third timing event and the first timing event.

In a number of embodiments, the first timing event corresponds to an edge associated with a carrier frequency of the first clock signal, and the second timing event corresponds to an edge associated with a sub-carrier frequency of the first clock signal.

In accordance with various embodiments, the first timing event conveys phase information of the first clock signal, and the second timing event conveys frequency information of the first clock signal.

In another aspect, a method of locking frequency and phase with high speed is provided. The method includes detecting a frequency offset between a reference signal and a feedback signal of a PLL, compensating for the frequency offset by providing a frequency offset correction to the PLL with a feedback loop of the PLL opened, compensating for a phase offset between the reference signal and the feedback signal by providing a phase offset correction after the frequency offset correction, and compensating for a residual error of the PLL by locking the feedback signal to the reference signal with the feedback loop of the PLL closed.

In a number of embodiments, detecting the frequency offset includes subtracting an initial phase offset from an output of a digital phase detector, and detecting the frequency offset based on a residual phase offset of the digital phase detector.

In several embodiments, compensating for the frequency offset includes controlling a loop filter output value.

In some embodiments, detecting the frequency offset includes comparing a derivative of successive phase measurements of the reference clock signal to a derivate of successive phase measurements of the feedback clock signal. According to certain embodiments, the method further includes calculating a fractional frequency error based on the comparison. In various embodiments, compensating for the frequency offset includes normalizing the fractional frequency error by a control word of an NCO, and updating the NCO based on the normalized frequency error. In accordance with several embodiments, compensating for the frequency offset includes gradually transitioning an output frequency of the PLL with a controlled rate of change.

In a number of embodiments, compensating for the phase offset includes synchronizing a feedback divider of the PLL based on timing of the reference clock signal.

In some embodiments, compensating for the phase offset includes gradually providing phase adjustment to limit an output frequency deviation of the PLL.

In accordance with certain embodiments, detecting the frequency offset includes detecting the frequency offset using a reference monitor.

In several embodiments, compensating for the phase offset includes providing an open loop phase correction to the PLL.

In a number of embodiments, compensating for the phase offset includes providing a closed loop phase correction to the PLL.

In various embodiments, compensating for the residual error of the PLL includes decreasing a loop bandwidth of the PLL over time.

In another aspect, an IC providing locking of frequency and phase with high speed is provided. The IC includes a DPLL including a digital phase detector configured to compare a reference signal and a feedback signal. The IC further includes a frequency offset detection circuit configured to detect a frequency offset between the reference signal and the feedback signal, and a loop controller configured to provide a frequency offset correction to the DPLL with a feedback loop of the DPLL opened. The loop controller is further configured to compensate for a phase offset between the reference signal and the feedback signal by providing a phase offset correction after the frequency offset correction, and to compensate for a residual error of the DPLL by locking the feedback signal to the reference signal with the feedback loop of the DPLL closed.

In a number of embodiments, the frequency offset detection circuit is configured to detect the frequency offset by subtracting an initial phase offset from an output of the digital phase detector, and to detect the frequency offset based on a residual phase offset of the digital phase detector.

In several embodiments, the loop controller is configured to provide the frequency offset correction based on controlling a loop filter output value of a loop filter of the DPLL.

In certain embodiments, the frequency offset detection circuit is configured to detect the frequency offset by comparing a derivative of successive phase measurements of the reference clock signal to a derivate of successive phase measurements of the feedback clock signal.

In various embodiments, the loop controller is configured to compensate for the frequency offset based on normalizing a fractional frequency error by a control word of an NCO, and updating the NCO based on the normalized frequency error.

In a number of embodiments, the loop controller is further configured to gradually transition an output frequency of the DPLL with a controlled rate of change.

In several embodiments, the loop controller is further configured to synchronize a feedback divider of the DPLL based on timing of the reference clock signal.

In some embodiments, the loop controller is configured to compensate for the residual error of the DPLL based on decreasing a loop bandwidth of the DPLL over time.

In another aspect, an IC with reference phase shift detection is provided. The IC includes a phase shift detector configured to detect a phase shift of a reference signal based on timing of a system clock signal. The phase shift detector is configured generate a phase detection signal indicating the detected phase shift based on observing the reference signal over a plurality of cycles of the system clock signal.

In a number of embodiments, the phase shift detector includes a phase error differentiation circuit configured to differentiate a phase error observed on one or more cycles of the plurality of cycles.

In several embodiments, the phase shift detector includes a windowed accumulation circuit configured to accumulate two or more observations of the reference signal captured over the plurality of cycles.

In some embodiments, the phase shift detector includes a majority processing circuit configured to generate the phase detection cycle based on majority processing of two or more observations of the reference signal captured over the plurality of cycles.

In a number of embodiments, the IC further includes a PLL configured to receive the reference signal.

In another aspect, an IC with phase offset detection is provided. The IC includes a phase offset detector configured to detect a phase offset between a first reference signal and a second reference signal. The phase offset detector is configured generate a phase offset signal indicating the detected phase offset based on observing a phase difference between the first reference signal and the second reference signal over a plurality of cycles of a system clock signal.

In several embodiments, the IC further includes a PLL configured to receive at least one of the first reference signal or the second reference signal. According to some embodiments, the IC further includes a multiplexer configured to provide the first reference signal or the second reference signal. In accordance with various embodiments, the phase offset detector is configured to provide a phase adjustment to the PLL using the phase offset signal.

In certain embodiments, the phase offset detector receives a first plurality of digital representations of timing of the first reference signal, and a second plurality of digital representations of the second reference signal.

In a number of embodiments, the IC further includes a first TDC configured to generate the first plurality of digital representations, and a second TDC configured to generate the second plurality of digital representations.

In another aspect, a DPLL is provided. The DPLL includes a divider configured to divider an input clock signal to generate a divided clock signal having a first timing event and a second timing event. The DPLL further includes a phase detector configured to provide phase detection based on the divided clock signal. The phase detector includes an interpolation circuit configured to generate an interpolated timing event between the first timing event and the second timing event, and the phase detector is configured to provide phase detection based on the interpolated timing event.

In some embodiments, the interpolated timing event corresponds to a timing event lost by decimation of the input clock signal by the divider.

In several embodiments, the input clock signal is a reference clock signal to the DPLL.

In certain embodiments, the input clock signal is a feedback clock signal to the DPLL.

DETAILED DESCRIPTION OF EMBODIMENTS

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art.

Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. Thus, it will be understood that certain embodiments can include more elements than illustrated in a drawing and/or a subset of the elements illustrated in a drawing. Further, some embodiments can incorporate any suitable combination of features from two or more drawings. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim or equivalent thereof.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to a variety of electronic systems. The detailed description and drawings are merely illustrative of the disclosure rather than limiting, the scope of the disclosure being defined by the appended claims and equivalents thereof.

Figure 1:
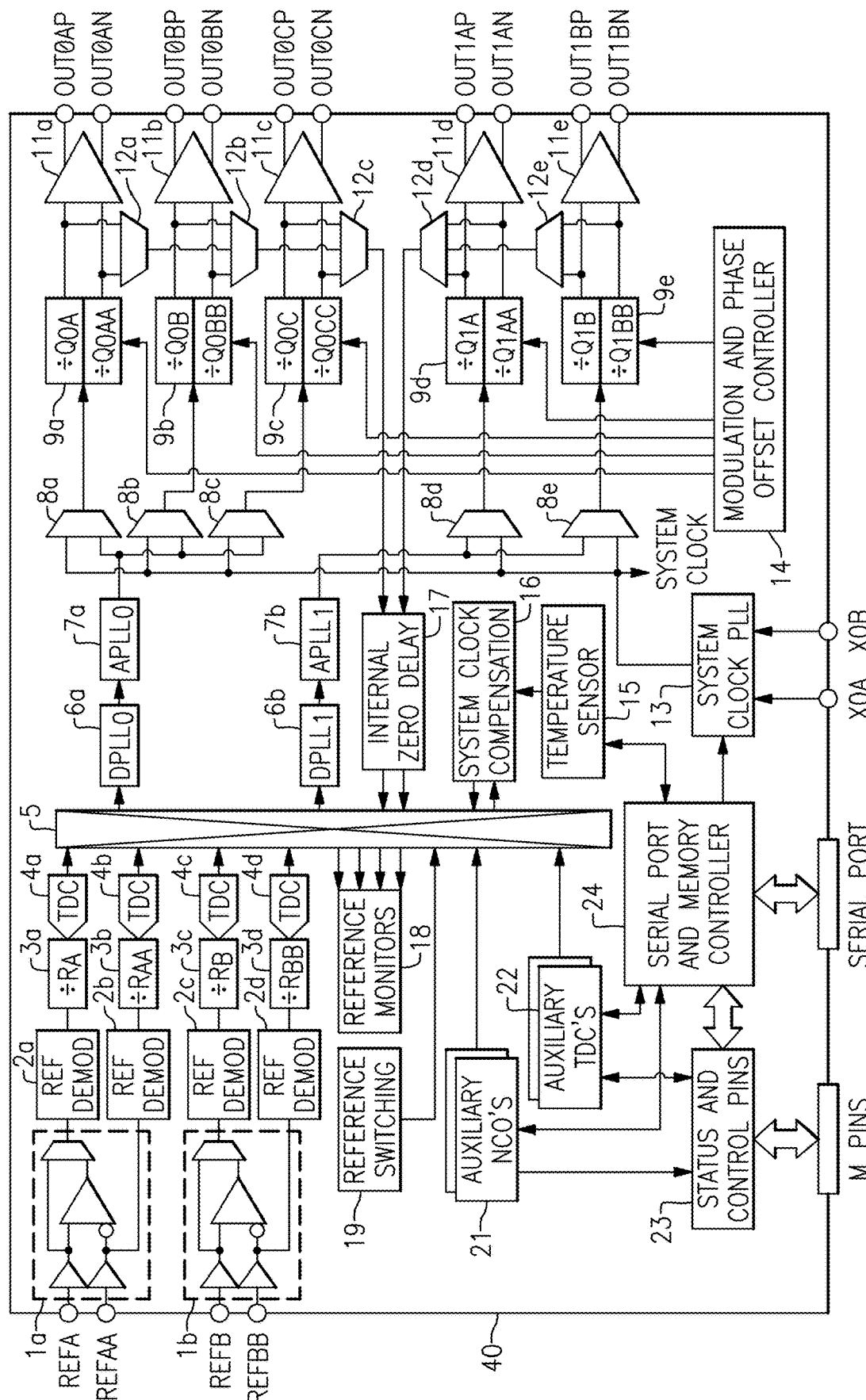
FIG. 1 is a schematic diagram of one embodiment of a clock synchronization and frequency translation integrated circuit (IC).

FIG. 1 is a schematic diagram of one embodiment of a clock synchronization and frequency translation integrated circuit (IC) 40. The clock synchronization and frequency translation IC 40 illustrates one embodiment of an IC that can be implemented in accordance with one or more features of the present disclosure. However, the teachings herein are applicable to other implementations of electronic systems, including, but not limited to, other implementations of ICs. An IC is also referred to herein as a semiconductor chip or semiconductor die.

In the illustrated embodiment, the clock synchronization and frequency translation IC 40 includes a first input reference control circuit 1a, a second input reference control circuit 1b, a first reference clock demodulator 2a, a second reference clock demodulator 2b, a third reference clock demodulator 2c, a fourth reference clock demodulator 2d, a first reference divider 3a, a second reference divider 3b, a third reference divider 3c, a fourth reference divider 3d, a first time-to-digital converter (TDC) 4a, a second TDC 4b, a third TDC 4c, a fourth TDC 4d, a digital cross point multiplexer 5, a first digital phase-locked loop (DPLL) 6a, a second DPLL 6b, a first analog phase-locked loop (APLL) 7a, a second APLL 7b, a first output clock multiplexer 8a, a second output clock multiplexer 8b, a third output clock multiplexer 8c, a fourth output clock multiplexer 8d, a fifth output clock multiplexer 8e, a first output divider 9a, a second output divider 9b, a third output divider 9c, a fourth output divider 9d, a fifth output divider 9e, a first clock output driver 11a, a second clock output driver 11b, a third clock output driver 11c, a fourth clock output driver 11d, a fifth clock output driver 11e, a first feedback clock multiplexer 12a, a second feedback clock multiplexer 12b, a third feedback clock multiplexer 12c, a fourth feedback clock multiplexer 12d, a fifth feedback clock multiplexer 12e, a system clock PLL 13, a modulation and phase offset controller 14, a temperature sensor 15, a system clock compensation circuit 16, an internal zero delay control circuit 17, reference monitors 18, a reference switching circuit 19, auxiliary numerically controlled oscillators (NCOs) 21, auxiliary TDCs 22, a status and control pins interface 23, and a serial port and memory controller 24.

As shown in FIG. 1, the clock synchronization and frequency translation IC 40 further includes various pins or pads, including input reference pins (REFA, REFAA, REFB, REFBB), system reference pins (XOA, XOB), output clock pins (OUT0AP, OUT0AN, OUT0BP, OUT0BN, OUT0CP, OUT0CN, OUT1AP, OUT1AN, OUT1BP, OUT1BN), serial port pins (SERIAL PORT), and multifunction pins (M PINS). For clarity of the figures, certain pins have been omitted from FIG. 1, such as pins used for power and ground.

Although one example of circuitry and pins is shown for a clock synchronization and frequency translation chip, other implementations and circuitry and/or pins can be used.

The input reference pins (REFA, REFAA, REFB, REFBB) receive input reference signals (for instance reference clock signals or other phase and/or frequency reference signals), which are handled by the input reference control circuits 1a-1b. The input reference control circuits 1a-1b can be used to provide input reference selection, inversion, and/or a wide variety of other processing. In certain implementations, the input reference control circuits 1a-1b are configurable to process either differential or singled-ended input reference signals, thereby enhancing the flexibility of the IC 40.

In certain implementations, one or more of the input reference pins (REFA, REFAA, REFB, REFBB) receives a reference clock signal having a carrier frequency and an embedded subcarrier frequency. Such a reference clock signal includes a low frequency clock signal embedded within a high frequency carrier.

Providing a reference clock signal with an embedded subcarrier can provide a number of advantages. For example, in applications including a chassis with timing cards and line cards, the carrier frequency can convey desired frequency information while the subcarrier frequency can convey desired phase information.

The reference demodulators 2a-2d serve to extract phase information associated with a subcarrier frequency of a reference clock signal. For example, when enabled, a reference demodulator recovers modulation events corresponding to periodic phase variations appearing on certain edges of the input reference clock signal. A reference clock signal with an embedded subcarrier frequency can be generated in a variety of ways, including, but not limited to, by another instantiation of a clock synchronization and frequency translation IC.

Accordingly, the reference demodulators 2a-2d serve to extract modulation events embedded in a received input reference clock signal in applications including an embedded subcarrier frequency.

The reference dividers 3a-3d operate to provide division to a corresponding input reference signal. In the illustrated embodiment, the reference dividers 3a-3d operate using programmable divisor values. For instance, desired divisor values can be programmed into the IC 40 by a user via the serial port. By including the reference dividers 3a-3d, flexibility of the chip is enhanced by providing control over the frequencies of input reference signals. For example, the reference dividers 3a-3d can be used to reduce the reference frequencies to values suitable for the input frequency range of the TDCs 4a-4d.

The TDCs 4a-4d provide time-to-digital conversion of the divided reference signals from the reference dividers 3a-3d, respectively. In particular, each of the TDCs 4a-4d operates to observe the timing of a corresponding reference signal, and to generate digital time stamps identifying when edge transitions (for instance, rising and/or falling edges) of the reference signal occur.

The digital cross point multiplexer 5 operates to route various signals throughout the IC 40 as desired. Although certain inputs and outputs are illustrated in FIG. 1, the digital cross point multiplexer 5 can be adapted to route a wide variety of signals throughout the IC 40. Furthermore, the digital cross point multiplexer 5 is also connected to various pins and interfaces of the IC 40, and thus can be used, for example, to send or receive signals via the serial port pins (SERIAL PORT) and/or multifunction pins (M PINS).

The digital cross point multiplexer 5 is digitally programmable to provide connectivity desired for a particular application or implementation. In a first example, the digital cross point multiplexer 5 provides digital time stamps from the output of one or more of the TDCs 4a-4d to the first DPLL 6a and/or the second DPLL 6b. In a second example, the digital cross point multiplexer 5 provides digital time stamps from the output of one or more of the TDCs 4a-4d to the reference monitors 18. In a third example, the digital cross point multiplexer 5 connects the auxiliary NCOs 21 and/or auxiliary TDCs 22 to the DPLLs 6a, 6b and/or other circuitry of the IC 40.

With continuing reference to FIG. 1, the first DPLL 6a processes digital time stamps received from the digital cross point multiplexer 5 to generate a first DPLL output clock signal, which serves as an input to the first APLL 7a. Additionally, the APLL 7a provides frequency translation and/or jitter cleanup to generate a first APLL output clock signal. Similarly, the second DPLL 6b processes digital time stamps received from the digital cross point multiplexer 5 to generate a second DPLL output clock signal, which the second APLL 7b uses as a reference for generating a second APLL output clock signal.

The output clock multiplexers 8a-8e are used for selecting and distributing output clock signals from the first APLL 7a, the second APLL 7b, and/or the system clock PLL 13 to the output dividers 9a-9e. The output dividers 9a-9e provide programmable division to the output clock signals chosen by the output clock multiplexers 8a-8e, respectively. In the illustrated embodiment, the output clock dividers 9a-9e also operate with a controllable phase delay and/or burst control to support a burst clocking specification, such as JESD204B. The output dividers 9a-9e also support modulation of the location of edges of the output clocks signals (for instance, rising or falling edges) to support insertion of a subcarrier into a higher frequency carrier clock signal. Thus, the output dividers 9a-9e can also be used to generate a clock signal with an embedded subcarrier frequency, which can be demodulated by a reference demodulator (for instance, reference demodulators 2a-2d) of another instantiation of the IC 40.

The divided output clock signals from the dividers 9a-9e are provided to the clock output drivers 11a-11e, respectively, which drive the output clock pins (OUT0AP, OUT0AN, OUT0BP, OUT0BN, OUT0CP, OUT0CN, OUT1AP, OUT1AN, OUT1BP, OUT1BN). Furthermore, the divided output clock signals are also provided to the feedback clock multiplexers 12a-12e, which can be used to provide one or more selected clock signals to the internal zero delay control circuit 17 and/or other clock feedback path(s).

As shown in FIG. 1, the internal zero delay control circuit 17 is connectable via the digital cross point multiplexer 5 to the DPLLs 6a, 6b and/or other circuitry and/or pins of the IC 40. The internal zero delay control circuit 17 aids in controlling an output phase at the output clock pins (OUT0AP, OUT0AN, OUT0BP, OUT0BN, OUT0CP, OUT0CN, OUT1AP, OUT1AN, OUT1BP, OUT1BN) relative to an input phase of the input reference signals received on the input reference pins (REFA, REFAA, REFB, REFBB). For example, the internal zero delay control circuit 17 can be used to operate the IC 40 as a PLL with about zero degrees of phase delay between the input phase and the output phase.

The system clock PLL 13 receives one or more system reference signals from the system reference pins (XOA, XOB). Additionally, the system clock PLL 13 uses the system reference signal to generate a system clock signal that controls timing of the IC 40. Although not illustrated in FIG. 1 for clarity of the figure, the system clock signal can be used to control timing of a wide variety of circuits of the IC 40, including, but not limited to, the reference demodulators 2a-2d, the TDCs 4a-4d, the DPLLs 6a-6b, the reference monitors 18, the reference switching circuit 19, and/or the auxiliary TDCs 22.

The modulation and phase offset controller 14 provides a wide variety of functionality. For example, the modulation and phase offset controller 14 can control a division rate and/or phase delay of the output dividers 9a-9e, thereby controlling frequency and phase of the output clock signals. The modulation and phase offset controller 14 of FIG. 1 also controls clock bursting for supporting gapped-clock applications. Furthermore, the modulation and phase offset controller 14 controls modulation of the location of output clock edges to selectively insert a subcarrier into a higher frequency carrier clock signal. Implementing the modulation and phase offset controller 14 in this manner aids in generating a reference clock signal having a carrier frequency and an embedded subcarrier frequency.

The temperature sensor 15 operates to generate a temperature indication signal indicating a temperature of the IC 40, for instance, a temperature condition near or local to the system clock PLL 13. In the illustrated embodiment, the temperature indication signal is provided to the system clock compensation circuit 16, which operates to generate compensation signals for compensating one or more circuit blocks of the IC 40 for error of the system clock signal arising from temperature variation.

With continuing reference to FIG. 1, the reference monitors 18 operate to detect whether or not one or more of the reference clock signals received on the input reference pins (REFA, REFAA, REFB, REFBB) are reliable. For example, the IC 40 can be programmed with tolerance data (for instance, via the serial port) associated with a tolerated amount of reference clock jitter permitted for a particular application. Additionally, the reference monitors 18 can process digital time stamps from the TDCs 4a-4d to determine whether or not a particular one of the input reference clock signals are reliably operating within the allotted tolerance.

The reference switching circuit 19 aids in controlling which input reference clock signals are provided as inputs to the DPLLs 6a-6b. For example, in a variety of applications, multiple reference clock signals are provided for redundancy and/or other reasons. Additionally, when a particular reference clock signal is unavailable or becomes unreliable, the reference clock signal can be switched. In certain implementations, a DPLL is temporarily operated open loop in a holdover mode during reference switching, thereby stabilizing the output clock signals generated by the IC 40 and preventing sudden output frequency changes.

The auxiliary NCOs 21 and the auxiliary TDCs 22 operate to provide on-chip NCOs and TDCs for a wide variety of functions, thereby expanding the flexibility and/or range of applications that the IC 40 can be used in.

The status and control pins interface 23 operates as an interface for transmitting and receiving signals over the multi-functional pins (M PINS).

The serial port and memory controller 24 is coupled to a serial port or interface, such as a serial peripheral interface (SPI) or inter-integrated circuit (I$^2$C) interface. The serial port and memory controller 24 can be used for a wide variety of functions, including, but not limited to, for receiving data from the user associated with programming or configuring the IC 40 in a desired manner.

The clock synchronization and frequency translation IC 40 can be used to control clocking and timing in a wide variety of applications. In one example, the IC 40 provides jitter cleanup and synchronization in GPS, PTP (IEEE-1588), and/or SyncE applications. In a second example, the clock synchronization and frequency translation IC 40 is included in a base station (for instance, a femtocell or picocell) to control clocking for baseband and radio. In a third example, the clock synchronization and frequency translation IC 40 controls mapping/demapping for a transport network, such as an optical transport network (OTN), while providing jitter cleaning. In a fourth example, the clock synchronization and frequency translation IC 40 provides holdover, jitter cleanup, and phase transient control for Stratum 2, 3e, and 3 applications. In a fifth example, the clock synchronization and frequency translation IC 40 provides support for data conversion clocking, such as analog-to-digital (A/D) and/or digital-to-analog (D/A) conversion, for instance, for JESD204B support. In a sixth example, the clock synchronization and frequency translation IC 40 provides timing for wired infrastructure support, such as cable infrastructure and/or carrier Ethernet.

The clock synchronization and frequency translation IC 40 illustrates one embodiment of a semiconductor chip that can be implemented in accordance with one or more features discussed herein. However, the teachings herein are applicable to other implementations of electronic systems.

Figure 2A:
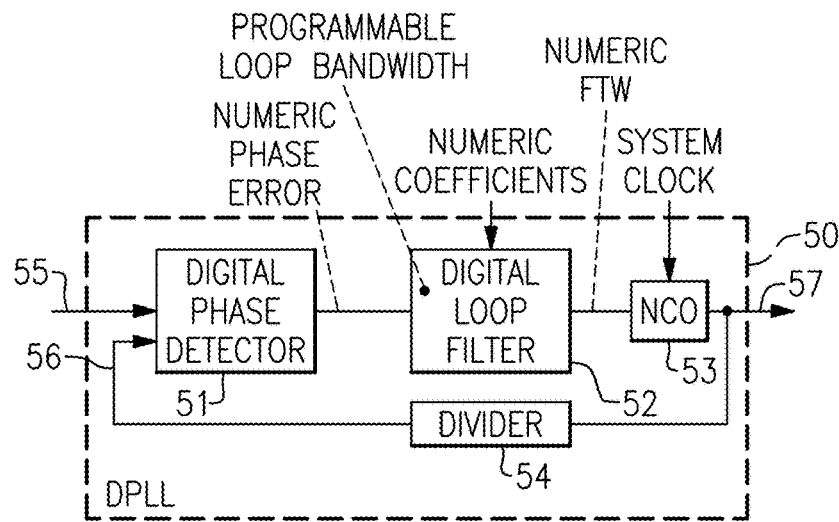
FIG. 2A is a schematic diagram of one implementation of a digital phase-locked loop (DPLL) for a clock synchronization and frequency translation IC.

FIG. 2A is a schematic diagram of one implementation of a DPLL 50 for a clock synchronization and frequency translation IC, such as the clock synchronization and frequency translation IC 40 of FIG. 1. The DPLL 50 includes a digital phase detector 51, a digital loop filter 52, an NCO 53, and a feedback divider 54.

The DPLL 50 of FIG. 2A illustrates one example of a DPLL suitable for use as the DPLLs 6a, 6b of FIG. 1. However, the DPLLs 6a, 6b of FIG. 1 can be implemented in other ways.

The digital phase detector 51 compares a digital reference signal 55 to a digital feedback signal 56 to generate a numeric phase error signal. In certain implementations, the digital phase detector 51 includes a TDC-based phase detector. In one example, a first TDC generates digital time stamps representing time instances at which the digital reference signal 55 transitions and a second TDC generates digital time stamps representing time instances at which the digital feedback signal 56 transitions, and the digital phase detector 51 processes the time stamps to generate the numeric phase error signal. In another example, the digital phase detector 51 generates a digital error signal based on comparing the digital reference signal 55 to the digital feedback signal 56, and a common TDC is used to generate time stamps representing transitions of the digital error signal.

The digital loop filter 52 provides digital filtering to the numeric phase error signal based on one or more numeric coefficients to generate a numeric frequency tuning word (FTW). As shown in FIG. 2A, the numeric FTW serves as an input to the NCO 53. In certain implementations, the digital loop filter 52 has a programmable loop bandwidth to enhance flexibility.

With continuing reference to FIG. 2A, the NCO 53 receives a system clock signal, such as from the system clock PLL 13 of FIG. 1. The NCO 53 generates a DPLL output clock signal 57 based on the system clock signal and a value of the numeric FTW. As the value of the numeric FTW changes, a frequency of the system clock signal changes correspondingly.

The feedback divider 54 generates the digital feedback signal 56 based on dividing the DPLL output clock signal 57. In certain implementations, the feedback divider 54 operates with a programmable divisor value to enhance flexibility.

In steady state, the DPLL 50 locks the phase of the digital reference signal 55 to the phase of the digital feedback signal 56.

Although FIG. 2A illustrates one implementation of a DPLL, DPLLs can be implemented in a wide variety of ways.

Figure 2B:
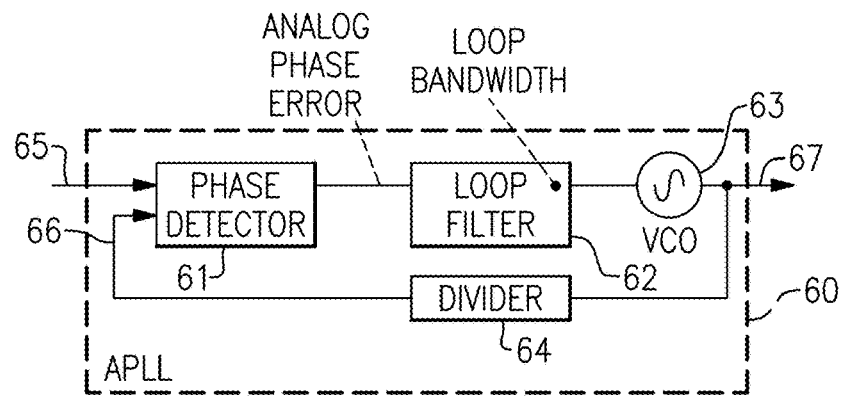
FIG. 2B is a schematic diagram of one implementation of an analog phase-locked loop (APLL) for a clock synchronization and frequency translation IC.

FIG. 2B is a schematic diagram of one implementation of an APLL 60 for a clock synchronization and frequency translation IC, such as the clock synchronization and frequency translation IC 40 of FIG. 1. The APLL 60 includes a phase detector 61, a loop filter 62, a voltage controlled oscillator (VCO) 63, and a feedback divider 64.

The APLL 60 of FIG. 2B illustrates one example of an APLL suitable for use as the APLLs 7a, 7b of FIG. 1. However, the APLLs 7a, 7b of FIG. 1 can be implemented in other ways.

The phase detector 61 operates to generate an analog phase error signal based on comparing a reference clock signal 65 to a feedback clock signal 66. In certain implementations, the reference clock signal 65 corresponds to the DPLL output clock signal 57 of FIG. 2A. The phase detector 61 can be implemented in a wide variety of ways. In one example, the phase detector 61 includes a phase-frequency detector/charge pump (PFD/CP) that controls a flow of current into or out of the loop filter 62 based on comparing the reference clock signal 65 to the feedback clock signal 66.

The loop filter 62 generates a control voltage used to control an oscillation frequency of the VCO 63. The loop filter 62 has a loop bandwidth, which can be fixed or controllable, based on implementation. The VCO 63 generates an APLL output clock signal 67, which is divided by the feedback divider 64 to generate the feedback clock signal 66. In certain implementations, the feedback divider 64 has a programmable divisor.

When in lock, the APLL 60 operates to phase-lock the feedback clock signal 66 to the reference clock signal 65. Additionally, a division rate of the divider 64 can be selected to control frequency translation of the APLL output clock signal 67 relative to the reference clock signal 65.

Although FIG. 2B illustrates one implementation of an APLL, APLLs can be implemented in a wide variety of ways.

Figure 2C:
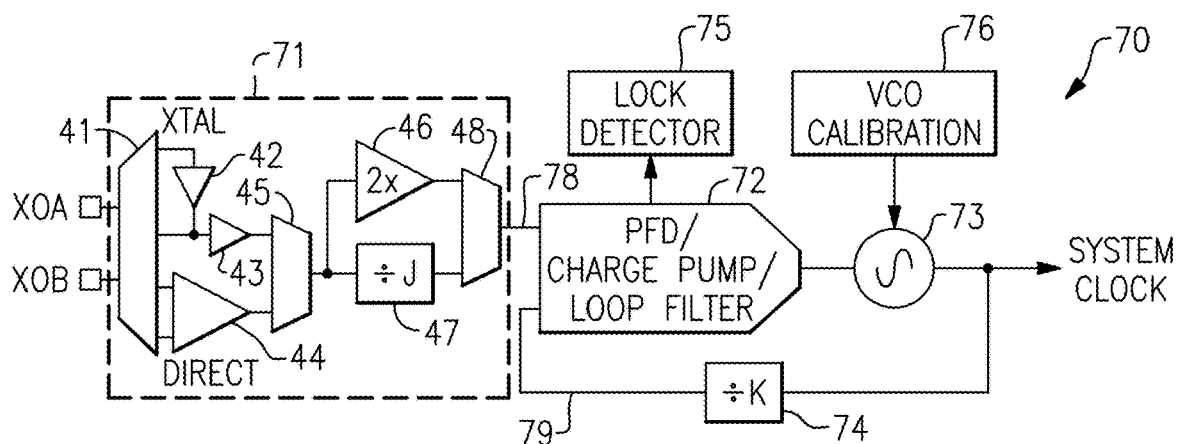
FIG. 2C is a schematic diagram of one implementation of a system clock phase-locked loop (PLL) for a clock synchronization and frequency translation IC.

FIG. 2C is a schematic diagram of one implementation of a system clock PLL 70 for a clock synchronization and frequency translation IC, such as the clock synchronization and frequency translation IC 40 of FIG. 1. The system clock PLL 70 includes a system reference control circuit 71, a PFD/CP/loop filter 72, a VCO 73, a feedback divider 74, a lock detector 75, and a VCO calibration circuit 76.

In the illustrated embodiment, the system reference control circuit 71 includes an input multiplexer 41, a maintaining amplifier 42, a first input amplifier 43, a second input amplifier 44, a multiplexer 45, a frequency doubling circuit 46, a divider 47 (divider by 1, 2, 4 or 8, in one implementation), and an output multiplexer 48.

The system clock PLL 70 of FIG. 2C illustrates one example of a system clock PLL suitable for use as the system clock PLL 13 of FIG. 1. However, the system clock PLL 13 of FIG. 1 can be implemented in other ways.

As shown in FIG. 2C, the PFD/CP/loop filter 72, VCO 73, and feedback divider 74 (divide by 4 to 255, in one implementation) operates as an integer-N frequency synthesizer that generates the system clock signal based on a system reference signal 78. In one example, the VCO operates with a frequency range of 2250 megahertz (MHz) to 2415 MHz. However, other frequency operating ranges are possible.

The system reference pins (XOA, XOB) serve in providing a desired system reference signal to the system clock PLL 70. In one example, a user can connect a crystal resonator to the XOA and/or XOB pins, and the maintaining amplifier 42 provides energy sufficient to maintain oscillations of the crystal resonator. In another example, a user can connect a single-ended and/or differential clock source (for instance, a temperature compensated crystal oscillator (TCXO) or oven controlled crystal oscillator (OXCO)) to the system reference pins, and the system reference control circuit 71 generates the system reference signal 78 based on a reference clock signal received from the clock source.

As shown in FIG. 2C, the system reference control circuit 71 can provide frequency translation of the system reference signal received on the system reference pins (XOA, XOB). For instance, in the illustrated embodiment, the system reference signal can be optionally doubled or divided. Implementing the system reference control circuit 71 in this manner provides flexibility in a range of system reference frequencies, while satisfying an operational input frequency range of the PFD/CP/loop filter 72 and/or frequency tuning range of the VCO 73.

The system clock PLL 70 of FIG. 2C includes the lock detector 75, which indicates when a feedback clock signal 79 from the feedback divider 74 is locked to the system reference signal 78.

With continuing reference to FIG. 2C, the system clock PLL 70 also includes the VCO calibration circuit 76, which operates to configure the VCO 73 for particular system clock parameters via a calibration sequence.

Although FIG. 2C illustrates one implementation of a system clock PLL, system clock PLLs can be implemented in a wide variety of ways.

Figure 3:
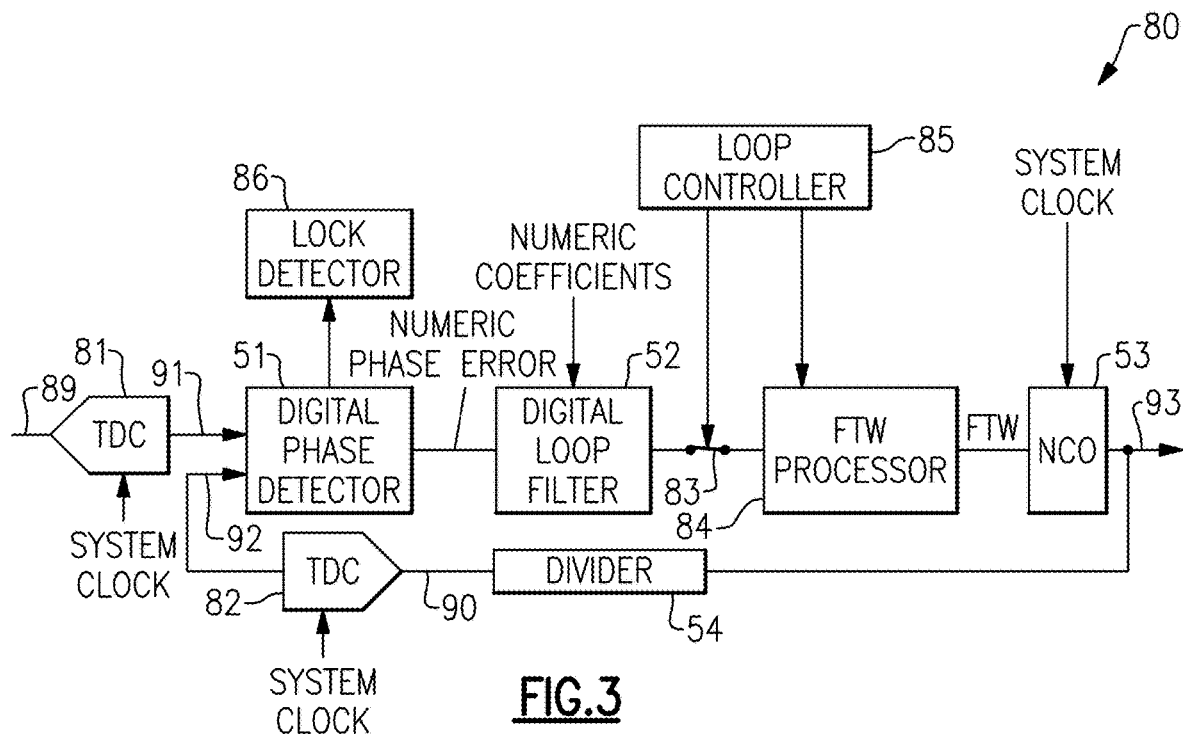
FIG. 3 is a schematic diagram of another implementation of a DPLL for a clock synchronization and frequency translation IC.

FIG. 3 is a schematic diagram of another implementation of a DPLL 80 for a clock synchronization and frequency translation IC, such as the clock synchronization and frequency translation IC 40 of FIG. 1. The DPLL 80 includes a digital phase detector 51, a digital loop filter 52, an NCO 53, and a feedback divider 54, which can be as described earlier with respect to FIG. 2A. The DPLL 80 further includes a reference TDC 81, a feedback TDC 82, a holdover switch 83, a FTW processor 84, a loop controller 85, and a lock detector 86.

The DPLL 80 illustrates another example of a DPLL suitable for use as the DPLLs 6a, 6b of FIG. 1, with the reference TDC 81 corresponding to one or more of the TDCs 4a-4d and/or auxiliary TDCs 22 of FIG. 1. However, the DPLLs 6a, 6b of FIG. 1 can be implemented in other ways.

The reference TDC 81 generates reference digital time stamps 91 representing time instances of transitions of an input reference signal 89. Additionally, the feedback TDC 82 generates feedback digital time stamps 92 representing time instances of transitions of a feedback signal 90 from the feedback divider 54. The digital phase detector 51 compares the reference digital time stamps 91 to the feedback digital time stamps 92 to generate a numeric phase error signal representing a phase error between the input reference signal 89 and the feedback signal 90.

The illustrated DPLL 80 also includes the lock detector 86, which generates a lock detect signal indicating whether or not the input reference signal 89 and the feedback signal 90 are locked to one another. The digital loop filter 52 processes the numeric phase error signal to generate a numeric FTW that is provided to the FTW processor 84 via the holdover switch 83.

As shown in FIG. 3, the loop controller 85 controls the holdover switch 83, thereby controlling whether or not the DPLL 80 operates closed loop or open loop. In the illustrated embodiment, the loop controller 85 controls an operating mode of the DPLL 80 to a selected operating mode chosen from multiple different operating modes including at least a phase-locking mode (closed loop) and a holdover mode (open loop). Furthermore, the loop controller 85 aids in providing seamless transition when transition from one operating mode to another operating mode.

For example, reference switchover occurs when the input reference signal 91 is changed from one input reference signal to another. For instance, the input reference signal 91 can be provided to the DPLL 80 by a selection circuit, such as a multiplexer, and the selected reference signal can be changed for a variety of reasons. When handling a reference switchover, the loop controller 85 can briefly enter a holdover mode, in which the holdover switch 83 is opened, new DPLL parameters are updated, and the FTW processor 84 operates with a holdover FTW from the loop controller 85. Thereafter, the holdover switch 83 is closed and the DPLL 80 operates closed-loop with the new input reference signal.

The loop controller 85 can also operate the DPLL 80 indefinitely in the holdover mode when all of the input references are invalid and/or when a user manually sets or forces the holdover mode, for instance, by programming via a serial port. In the holdover mode, the output frequency of the DPLL 80 remains substantially fixed, although instability of the system clock signal can lead to output frequency variation.

After recovery from the holdover mode, the loop controller 80 restores the DPLL to closed-loop operation and locks to the input reference signal, including recovery of loop parameters based on the profile settings for the new input reference signal after a switchover.

The FTW processor 84 processes a received FTW from the digital loop filter 52 or loop controller 85 to generate a FTW for the NCO 53. The FTW processor 84 can provide a number of functions, such as programmable delay, statistical processing (for instance, windowed averaging), and/or tuning word history.

Although FIG. 3 illustrates one implementation of a DPLL, DPLLs can be implemented in a wide variety of ways.

Figure 4:
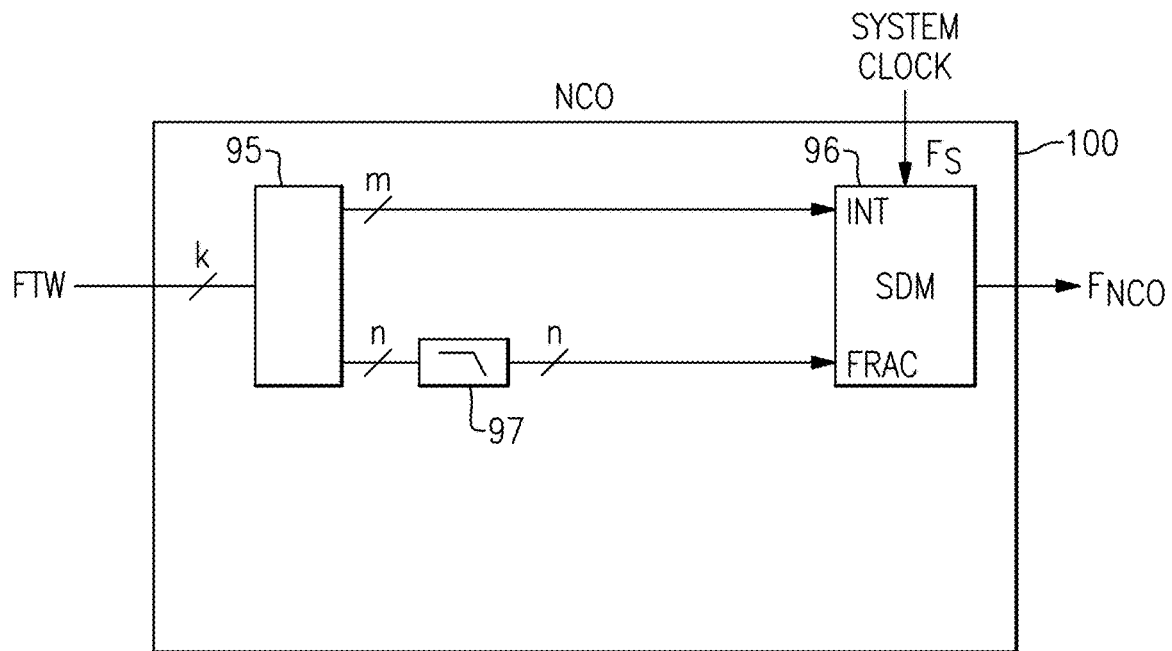
FIG. 4 is a schematic diagram of one implementation of a numerically controlled oscillator (NCO) for a clock synchronization and frequency translation IC.

FIG. 4 is a schematic diagram of one implementation of a NCO 100 for a clock synchronization and frequency translation IC, such as the clock synchronization and frequency translation IC 40 of FIG. 1. The NCO 100 generates an NCO output clock signal based on a system clock signal and an input FTW. The NCO 100 includes an FTW conversion circuit 95, a sigma delta modulator (SDM) 96, and a tuning word filter 97.

The NCO 100 illustrates one example of an NCO suitable for use in the DPLLs 6a, 6b of FIG. 1, for serving as the auxiliary NCOs 21 of FIG. 1, and/or for serving as the NCO 53 of FIGS. 2A and 3. However, NCOs can be implemented in other ways.

The FTW conversion circuit 95 converts the input FTW (k bits) into an integer tuning portion (m bits) and a fractional tuning portion (n bits). In one example, k is 48 bits, m is 4 bits, and n is 40 bits. However, other implementations are possible.

As shown in FIG. 4, the integer tuning portion is provided to an integer input to the SDM 96, and the fractional tuning portion is filtered by the tuning word filter 97 and thereafter provided to a fractional input to the SDM 96. The SDM 96 provides sigma-delta modulation to generate the NCO output clock signal ($F_{NCO}$) based on the system clock signal and values of the integer and fractional tuning portions.

Although FIG. 4 illustrates one implementation of an NCO, NCOs can be implemented in a wide variety of ways.

Figure 5:
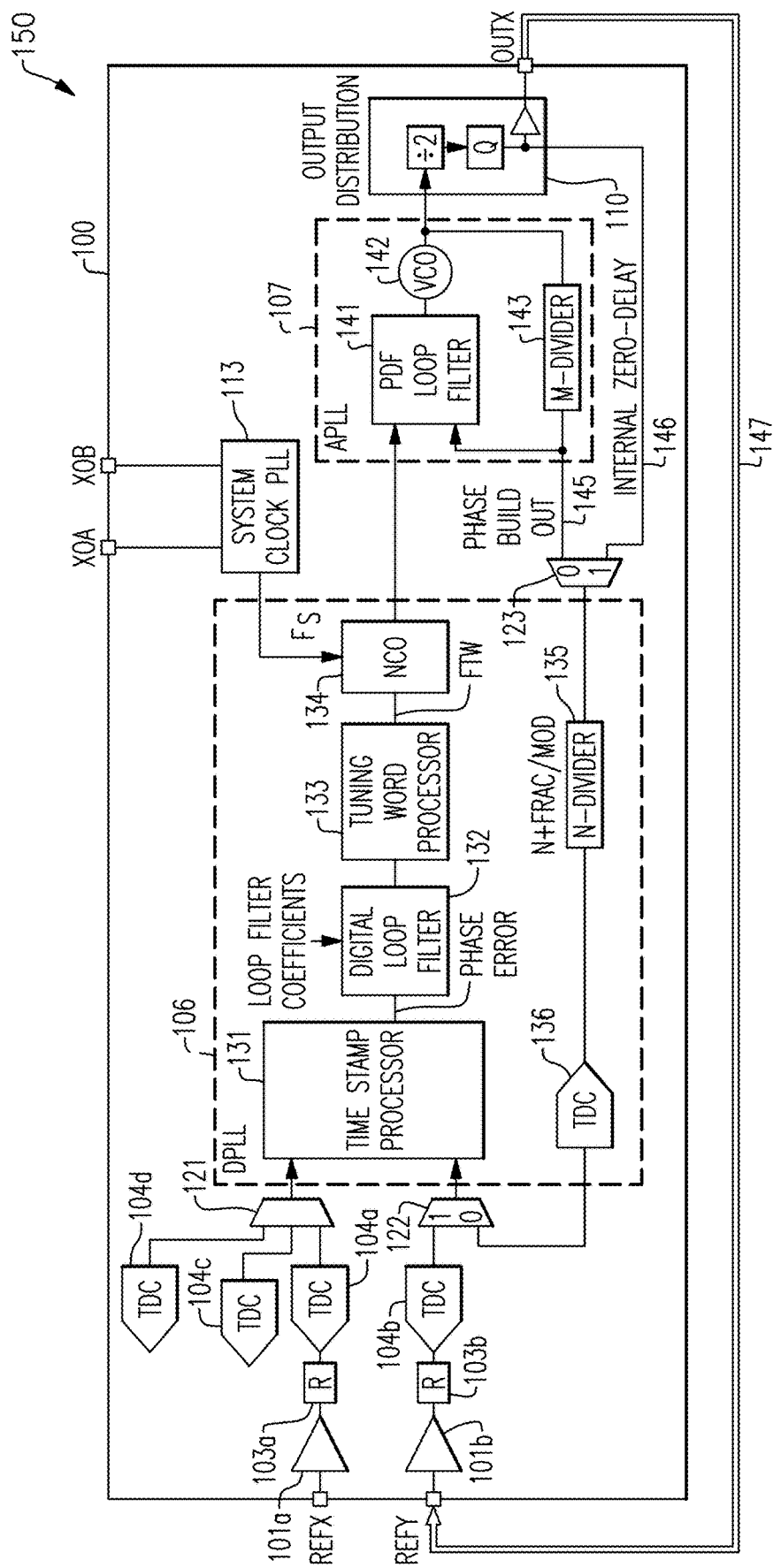
FIG. 5 is a schematic diagram of one implementation of frequency translation loops for a clock synchronization and frequency translation IC.

FIG. 5 is a schematic diagram of one implementation of frequency translation loops 150 for a clock synchronization and frequency translation IC 100. Although the frequency translation loops 150 are illustrated in the context of the IC 100 of FIG. 5, the clock synchronization and frequency translation IC 40 of FIG. 1 can also be adapted to include the frequency translation loops 150.

The IC 100 includes a first input reference buffer 101*a*, a second input reference buffer 101*b*, a first reference divider 103*a*, a second reference divider 103*b*, a first reference TDC 104*a*, a second reference TDC 104*b*, an auxiliary TDC 104*c*, another DPLL feedback TDC 104*d*, a DPLL 106, an APLL 107, an output clock distribution circuit 110, a system clock PLL 113, a first multiplexer 121, a second multiplexer 122, and a third multiplexer 123. The clock synchronization and frequency translation IC 100 further includes input reference pins (REFX, REFY), system reference pins (XOA, XOB), and a clock output pin (OUTX).

Although one example of circuitry and pins is shown for a clock synchronization and frequency translation chip, other implementations and circuitry and/or pins can be used.

The DPLL 106 includes a time stamp processor 131, a digital loop filter 132, a tuning word processor 133, an NCO 134, a feedback divider 135, and a feedback TDC 136. Additionally, the APLL 107 includes a PFD/loop filter 141, a VCO 142, and a feedback divider 153. In the embodiment shown in FIG. 5, the feedback divider 135 of the DPLL 106 receives an output clock signal from downstream via the third multiplexer 123, rather than directly from the DPLL's NCO.

In the illustrated embodiment, the DPLL 106 operates in part by comparing digital time stamps from a TDC selected by the first multiplexer 121 to digital time stamps from a TDC selected by the second multiplexer 122. Additionally, a DPLL output clock signal from the DPLL 106 serves as an input reference signal to the APLL 107. The APLL output clock signal from the APLL 107 in turn is provided to the output distribution circuit 110, which provides an output clock signal to the clock output pin OUTX.

As shown in FIG. 5, the DPLL 106 operates with a selectable feedback path to the time stamp processor 131. For example, the DPLL 106 includes a first feedback path 145 from the output of the feedback divider 143 of the APLL 107, a second feedback path 146 from the output distribution circuit 110, and a third feedback path 147 corresponding to an off-chip path from the clock output pin OUTX to the REFY input reference pin.

The multiplexers 122-123 can be used to select a desired feedback path, thereby helping to achieved an output-to-input phase alignment desirable for a particular application.

System Clock Compensation

Autonomous oscillators, such as those used to provide local frequency references, suffer from multiple impairments to their average and/or instantaneous accuracy. For example, the system reference signals received on the system reference pins (XOA, XOB) of FIGS. 1, 2C, and 5 can suffer from such frequency stability and accuracy errors.

The average frequency accuracy (or simply, accuracy) may be described as the center or nominal frequency, which may be offset from the ideal target frequency value. Short-term frequency accuracy can be viewed as a deviation from the average and thus as a relative frequency stability. In certain implementations, accuracy is a manufacturing constant that varies per device and stability is environmentally correlated. Environmental factors include, but are not limited to, temperature, mechanical acceleration (vibration), mechanical stress, and time (aging).

In certain implementations herein, an IC includes a system clock compensation circuit that generates one or more compensation signals for desensitizing various circuit blocks of the IC from actual variation in frequency in a system reference signal based on a time-varying estimate of the frequency error. By implementing the IC in this manner, the IC operates with less sensitivity to frequency variation in the system reference signal. For example, frequency stability and accuracy errors of a system clock signal generated from the system reference signal can be accommodated by desensitizing circuit blocks clocked by the system clock signal from such errors.

Thus, with a suitable model, accuracy and/or stability errors of an oscillator can be estimated. When a secondary frequency reference is available, the relative accuracy and/or stability can be alternatively or additionally measured. When the errors of the secondary reference are small, relative measurements can be used to estimate the primary reference's errors. The estimation techniques may be combined to improve their overall quality.

For example, let $\hat{E}_f(t)$ designate the LO's estimated fractional frequency error versus time; that is, for an ideal frequency, $f_0$, the actual frequency is $f(t) \approx f_0 \times (1+\hat{E}_f(t))$. Note that one or more other environmental factors that affect the oscillator may also be expressed as functions of time, so this is a general form and not restrictive of the underlying model or method of determining this value. Furthermore, $\hat{E}_f(t)$ is one expression of the LO's error, it may be represented in other forms and other units, such as an offset frequency or fractional period error.

One method of generating $\hat{E}_f(t)$ is to characterize the LO's frequency as a function of an environmental parameter, such as temperature, T (which is a time variant value, though the function of time notation is omitted for brevity). The characterization data can be fit to a polynomial function of a desired order, and $\hat{E}_f(t)$ expressed as $\hat{E}_f(T) = A_0 + A_1 \times T + A_2 \times T^2 + \ldots$ or as another suitable function. The function used for modeling can be extended to account for other parameters, such as aging, supply voltage, etc. Although an example with a polynomial is described, other functions are possible, such as functions associated with other numbers of variables and/or computational complexities.

Another method of determining the LO's frequency error is to measure the error relative to another clock signal which is designated as more accurate and/or more stable (this clock signal will be referred to as a stable clock or stable reference). Since the qualities which contribute to a good LO are not always found in conjunction with accuracy and stability, a clock that possesses these attributes, but would not be a good candidate as an LO, can be used to determine $\hat{E}_f(t)$.

The measurement can be achieved by a wide variety of techniques. In one example, the stable clock is applied as a reference to a digital phase lock loop (DPLL) operating at a rate derived (for instance, directly) from the LO. In various embodiments of DPLLs, the numeric control word generated by the loop is a time variant representation of the frequency ratio of the LO clock and the stable clock. Thus, the numerical control word can be processed to calculate a fractional frequency error and a corresponding compensation signal for compensating a particular circuit block for the fractional frequency error. One advantage of using a DPLL for detecting clock error is that the DPLL's loop applies a low-pass filter to the stable clock signal. This is a significant advantage when the stable clock exhibits substantial phase jitter, as the filter will reduce or minimize the noise in $\hat{E}_f(t)$.

One example of a component or circuit block that exhibits a direct dependence on oscillator frequency error is an NCO. Real time clocks (RTCs) are an application of NCOs. NCOs are generally constructed around one of two core elements, either an accumulator—commonly a phase accumulator such as used in a direct digital synthesizer (DDS), or a sigma-delta modulator (SDM), as used in a significant number of fractional-N PLLs. Given $\hat{E}_f(t)$, each of these core components can be compensated.

For instance, in an accumulator based NCO, the average output frequency of the component can be given by: $f_{nco}(t) = f(t) \times \text{control\_word} \div \text{control\_modulus}$, where control_word and control_modulus can be determined at design time and/or provided during operation. When it is desirable to generate an ideal frequency, $f_{nco\_ideal}$, which is not specifically ratio-metric to f(t), an ideal control word can be calculated, $\text{control\_word\_ideal} = \text{control\_modulus} \times f_{nco\_ideal} \div f_0$. Combining this with prior equations, and assuming that control_modulus is substantially constant, a compensated control word can be computing which yields $f_{nco}(t) \approx f_{nco\_ideal}$: control_word=control_word_ideal÷(1+$\hat{E}_f$(t)).

An SDM based NCO provides an average output frequency that can be given by: $f_{nco}(t) = f(t) \times \text{control\_modulus} \div \text{control\_word}$. This too can be solved for an equation giving a compensated control word, for instance, control_word=control_word_ideal×(1+$\hat{E}_f$(t)).

Another example of components with oscillator rate dependence are discrete time (sampled) filters, which have coefficients described as functions of the sample frequency. For instance, a single pole IIR filter has a coefficient, $\alpha$, which determines the −3 dB point of its frequency response, $f_c(t)$. This relationship is given by $f_c(t) \approx f(t) \times \alpha/(2\pi \times (1-\alpha))$, assuming $f_c(t) \ll f(t)$. For a fixed −3 dB point, $f_{c\_ideal}$, $\alpha = 2\pi \times f_{c\_ideal}/(f_0 \times (1+\hat{E}_f(t)))$.

Figure 6:
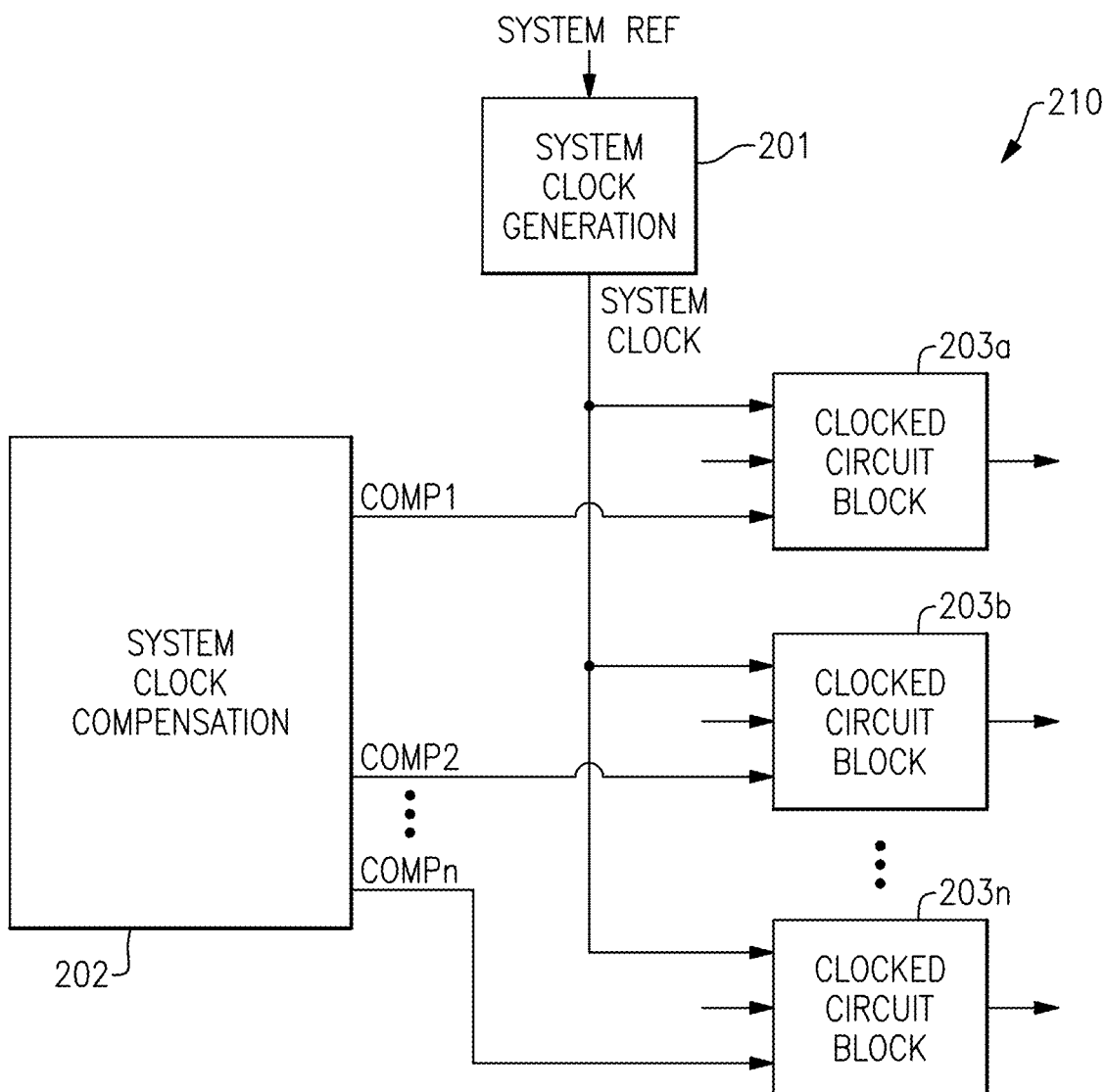
FIG. 6 is a schematic diagram of one embodiment of an electronic system with system clock compensation.

FIG. 6 is a schematic diagram of one embodiment of an electronic system 210 with system clock compensation. The electronic system 210 includes a system clock generation circuit 201, a system clock compensation circuit 202, and clocked circuit blocks 203a, 203b, ... 203n.

The electronic system 210 can represent a wide variety of electronic systems. In one embodiment, the electronic system 210 represents a portion of a semiconductor chip used for clock synchronization and/or frequency translation, such as the clock synchronization and frequency translation IC 40 of FIG. 1.

The system clock generation circuit 201 generates a system clock signal based on timing of a system reference signal. The system clock signal is used for controlling timing of a wide variety of circuitry, including clocked circuit blocks 203a, 203b, ... 203n, in this example.

The clocked circuit blocks 203a, 203b, ... 203n can represent a wide variety of components, including, but not limited to, filters (including, but not limited to, sampled filters), reference monitors, TDCs, DPLLs (including, but not limited to, all digital phase-locked loops or ADPLLs), and/or NCOs. Although an embodiment with three clocked circuit blocks is shown, more or fewer clocked circuit blocks can be compensated as indicated by the ellipses.

The system reference signal may be inaccurate and/or unstable, which can lead to a time dependent error of the system clock signal. For example, a system clock can have an error arising from an operating condition, such as temperature and/or another environmental factor. Absent compensation, the error in the system clock signal can lead to error in output signals generated by the clocked circuit blocks 203a, 203b, ... 203n.

The illustrated electronic system 210 includes the system clock compensation circuit 202, which generates compensation signals COMP1, COMP2, ... COMPn for compensating the clocked circuit blocks 203a, 203b, ... 203n from error the system clock signal. The system clock compensation circuit 202 can be implemented in a wide variety of ways, including implementations that provide open-loop compensation, closed-loop compensation, or a combination thereof.

In various embodiments, the compensation signals COMP1, COMP2, ... COMPn are digital signals, such that the system clock compensation circuit 202 digitally compensates one or more clocked circuit blocks for system clock error.

The system clock compensation scheme of FIG. 6 avoids a need to synthesize a clean clock signal from the system clock signal. Rather, system clock stability compensation can be provided by using the system clock signal as a timing source for circuit blocks, and compensating the circuit blocks for frequency errors of the system clock signal. Thus, frequency stability and accuracy errors of a system clock signal can be accommodated by digitally compensating the circuit blocks.

Figure 7:
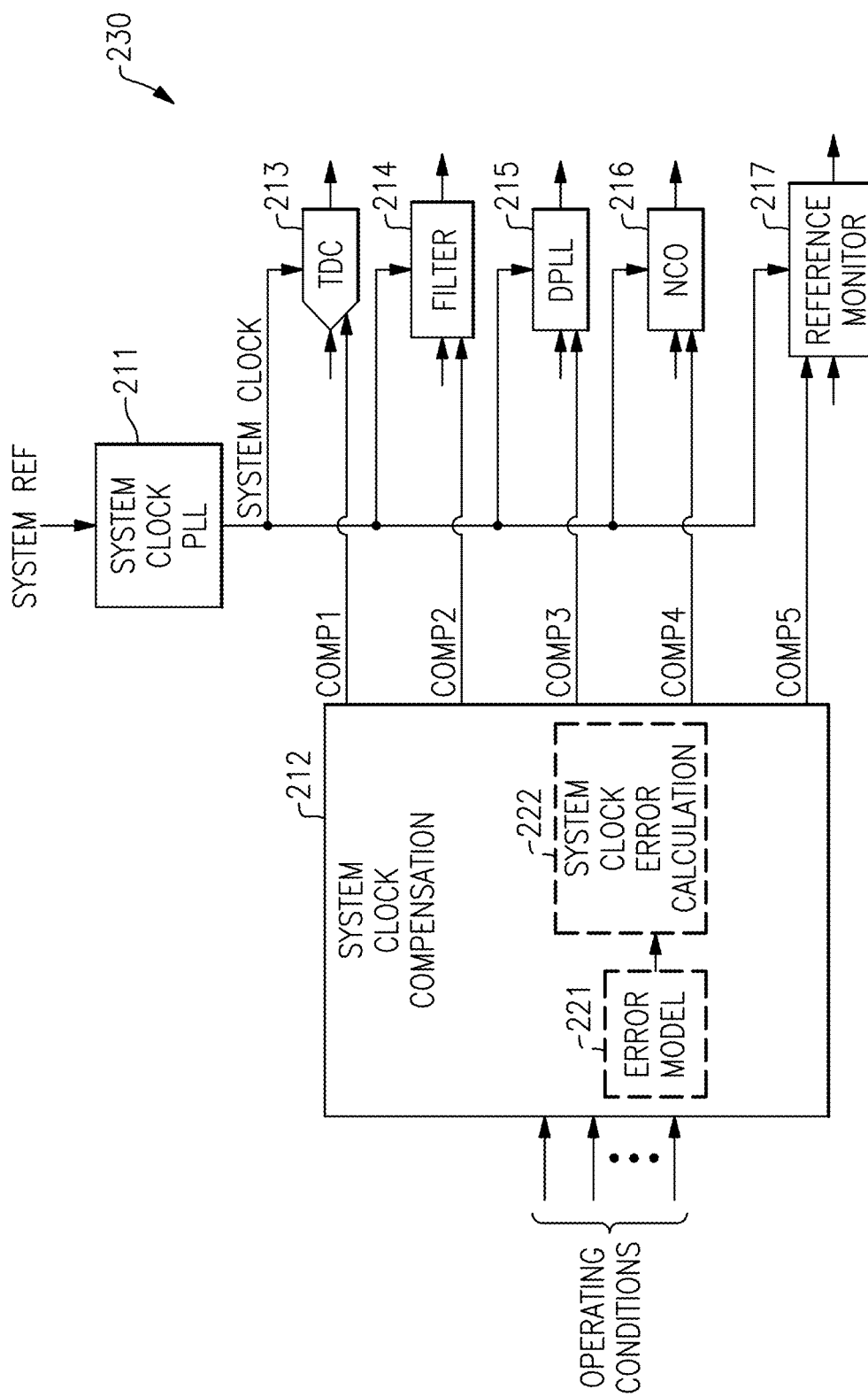
FIG. 7 is a schematic diagram of another embodiment of an electronic system with system clock compensation.

FIG. 7 is a schematic diagram of another embodiment of an electronic system 230 with system clock compensation. The electronic system 230 includes a system clock PLL 211, a system clock compensation circuit 212, a TDC 213, a filter 214, a DPLL 215, an NCO 216, and a reference monitor 217.

The electronic system 230 can represent a wide variety of electronic systems, for example, a portion of a clock synchronization and/or frequency translation IC.

The system clock PLL 211 generates a system clock signal based on timing of a system reference signal. The system clock PLL 211 can be implemented in a wide variety of ways, including, but not limited to, using the system clock PLL 70 of FIG. 2C.

The system clock signal is used for controlling timing of a wide variety of circuitry, including the TDC 213, the filter 214, the DPLL 215, the NCO 216, and the reference monitor 217, in this example. Although a specific example of clocked circuit blocks is shown, system clock compensation can be used to desensitize a wide variety of clocked circuit blocks from system clock error.

In the illustrated embodiment, the system clock compensation circuit 212 receives one or more signals indicating one or more operating conditions of the electronic system. Examples of operating conditions include supply voltage and/or environmental factors, such as temperature, mechanical acceleration (vibration), mechanical stress, and/or time (aging).

The system clock compensation circuit 212 further includes an error model 221, which generates a modeled system clock error based on the one or more signals indicating operating conditions. The system clock compensation circuit 212 further includes a system clock error calculation circuit 222, which processes the modeled system clock error to generate compensation signals for various circuit blocks. In this example, the circuit blocks include the TDC 213, the filter 214, the DPLL 215, the NCO 216, and the reference monitor 217. However, other circuit blocks and/or different combinations of circuit blocks can be compensated for error of a system clock signal. The system clock error calculation circuit 222 generates compensation signals of values suitable for compensating various clocked circuit blocks for an estimated system clock error.

The error model 221 can be implemented in a wide variety of ways. In one embodiment, the error model 221 corresponds to a polynomial model. However other types of models can be used.

Coefficients of the error model 221 can be obtained in a wide variety of ways. In one example, a user can program an IC (for instance, via the serial port of the IC 40 of FIG. 1) with model data suitable for modeling a particular frequency reference. In another example, the model coefficients are adaptively learned. In yet another example, model parameters are programmed into the device during factory test and/or manufacture.

Thus, the system clock compensation circuit 212 operates using the error model 221 to reduce sensitivity of various components to system clock error arising from a change in temperature, supply voltage, and/or other operating condition.

A system clock compensation circuit that provides compensation based on an error model can also be referred to herein as providing open-loop compensation for system clock error.

Figure 8:
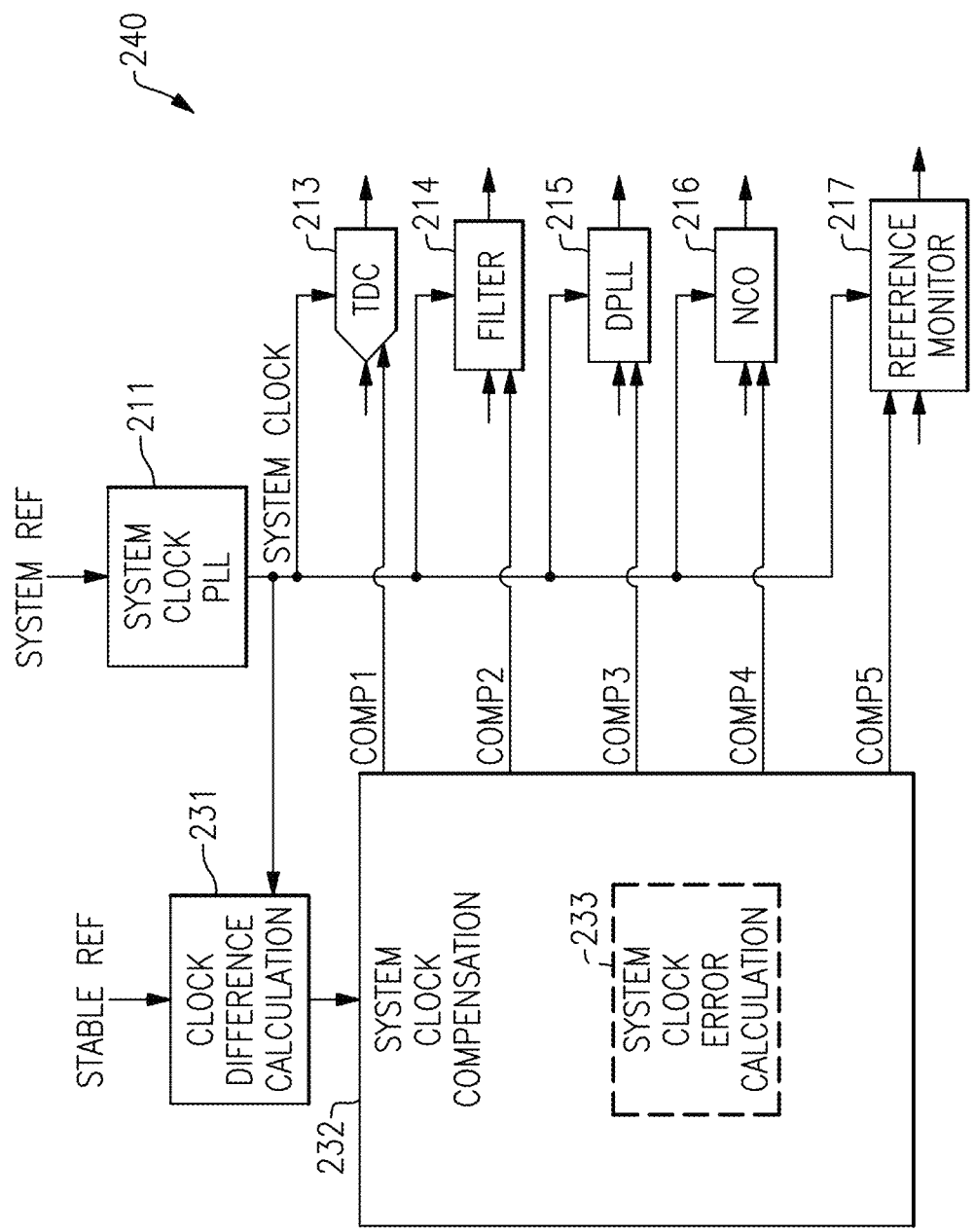
FIG. 8 is a schematic diagram of another embodiment of an electronic system with system clock compensation.

FIG. 8 is a schematic diagram of another embodiment of an electronic system 240 with system clock compensation. The electronic system 240 includes a system clock PLL 211, a TDC 213, a filter 214, a DPLL 215, an NCO 216, a reference monitor 217, a clock difference calculation circuit 231, and a system clock compensation circuit 232.

The electronic system 240 can represent a wide variety of electronic systems, for example, a portion of a clock synchronization and/or frequency translation IC.

In the illustrated embodiment, the electronic system 240 receives not only a system reference signal for the system clock PLL 211, but also a stable reference signal for the clock difference calculation circuit 231.

When a secondary reference signal is available (for instance, the stable reference signal shown in FIG. 8), the relative frequency accuracy and/or stability of the system clock signal can be measured relative to the secondary reference signal. When the frequency errors of the secondary reference signal are small, the relative measurements can be used to accurately estimate the system clock signal's error. The estimation technique may be combined with open-loop compensation to improve the overall accuracy of compensation.

As shown in FIG. 8, the clock difference calculation circuit 231 compares the stable reference signal to the system clock signal to generate a measured clock error signal. The clock difference calculation circuit 231 can be implemented in a wide variety of ways, such as by using a PLL. The measured clock error signal is processed by a system clock error calculation circuit 233 of the system clock compensation circuit 232 to generate compensation signals for one or more circuit blocks that are clocked by the system clock signal.

A system clock compensation circuit that provides compensation based on a measured clock error can also be referred to herein as providing closed-loop compensation for system clock error.

Figure 9:
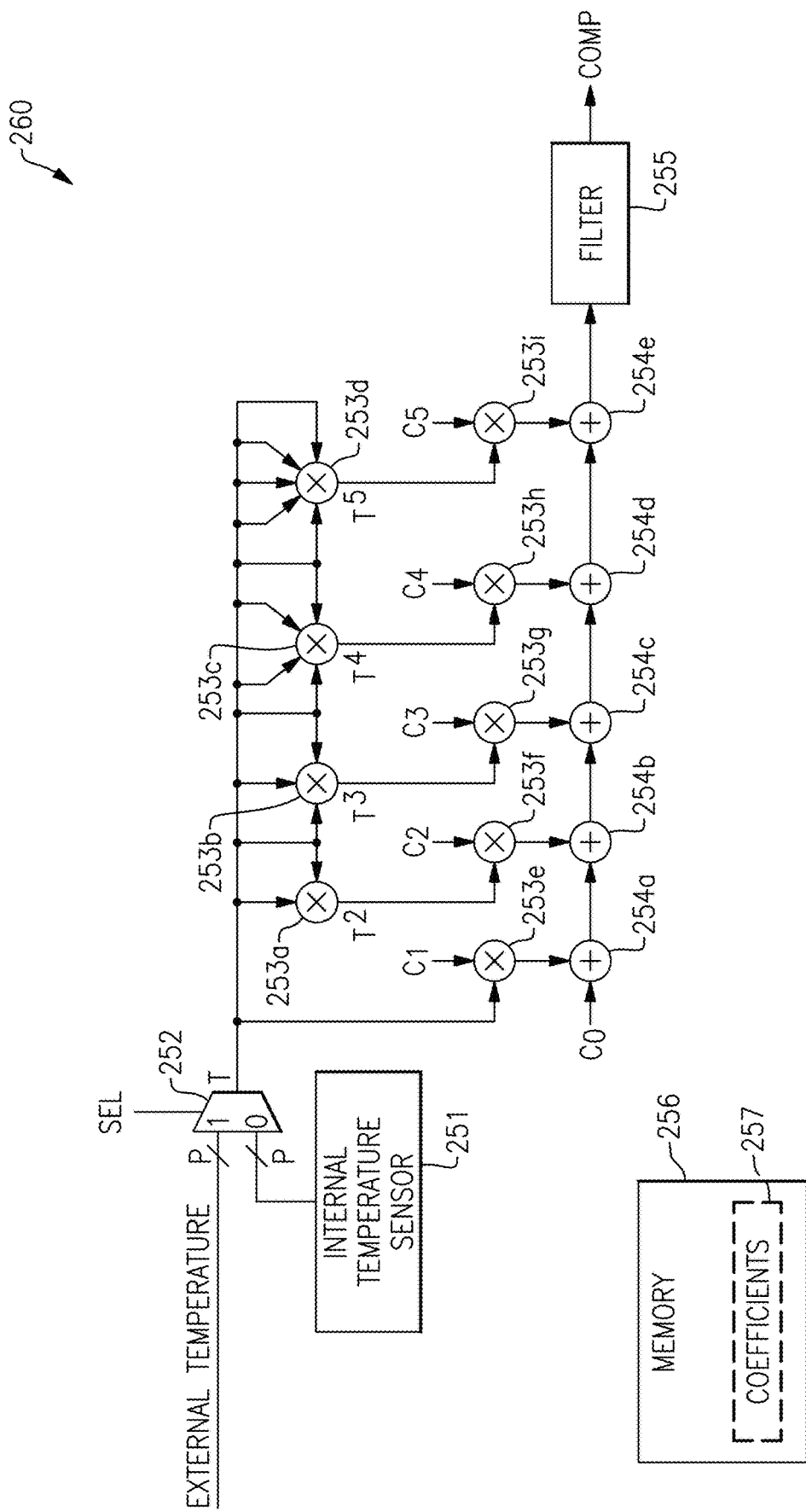
FIG. 9 is a schematic diagram of another embodiment of an electronic system with open loop system clock compensation.

FIG. 9 is a schematic diagram of another embodiment of an electronic system 260 with open loop system clock compensation. The electronic system 260 includes an internal temperature sensor 251, a multiplexer 252, multipliers 253a-253i, adders 254a-254e, a filter 255, and a memory 256.

The electronic system 260 can represent a wide variety of electronic systems, for example, a portion of a clock synchronization and/or frequency translation IC.

The electronic system 260 provides closed-loop system clock compensation by generating a digital compensation signal for compensating for a modeled system clock error arising from temperature. As shown in FIG. 9, the memory 256 stores model coefficients 257 for the error model, such as polynomial model coefficients C1, C2, C3, C4, and C5.

The memory 256 can be implemented using any type of elements that store data, including, but not limited to, volatile memory cells, non-volatile memory cells, registers, fuses, and/or any other suitable type of data storage elements.

As shown in FIG. 9, the multiplexer 252 is controlled by selection signal SEL. The multiplexer 252 selects between an external temperature value and a temperature value from the internal temperature sensor 251 as an input to the error model. The temperatures are P-bit digital signals, in this example. In one implementation, P is sixteen. However, other implementations are possible.

The error model uses the temperature input signal and the coefficients 257 to generate a model estimate, which is further processed by the filter 255 to generate the digital compensation signal. The filter 255 aids in mitigating noise injection, and in certain implementations has a user-controllable filtering characteristic.

The digital compensation signal is based on the value of the model at a particular temperature, and thus can vary with time as the temperature changes. The digital compensation signal is used by one or more circuit blocks to provide desensitization to stability and accuracy errors of the system clock signal. Although illustrated as generating one compensation signal, multiple compensation signals can be generated.

Although an example with temperature is shown, the teachings herein are applicable to compensation of system clock errors arising from other operating conditions, for instance, supply voltage and/or environmental factors. In another embodiment, an error model is configured to receive a vibration signal indicating a vibration condition. For example, an accelerometer can be used to detect vibration and provide the error model with a vibration signal indicating the amount of vibration present. In yet another embodiment, an error model is configured to receive a supply voltage signal indicating a supply voltage condition. In yet another embodiment, multiple indicators of operating conditions are provided to an error model.

Figure 10:
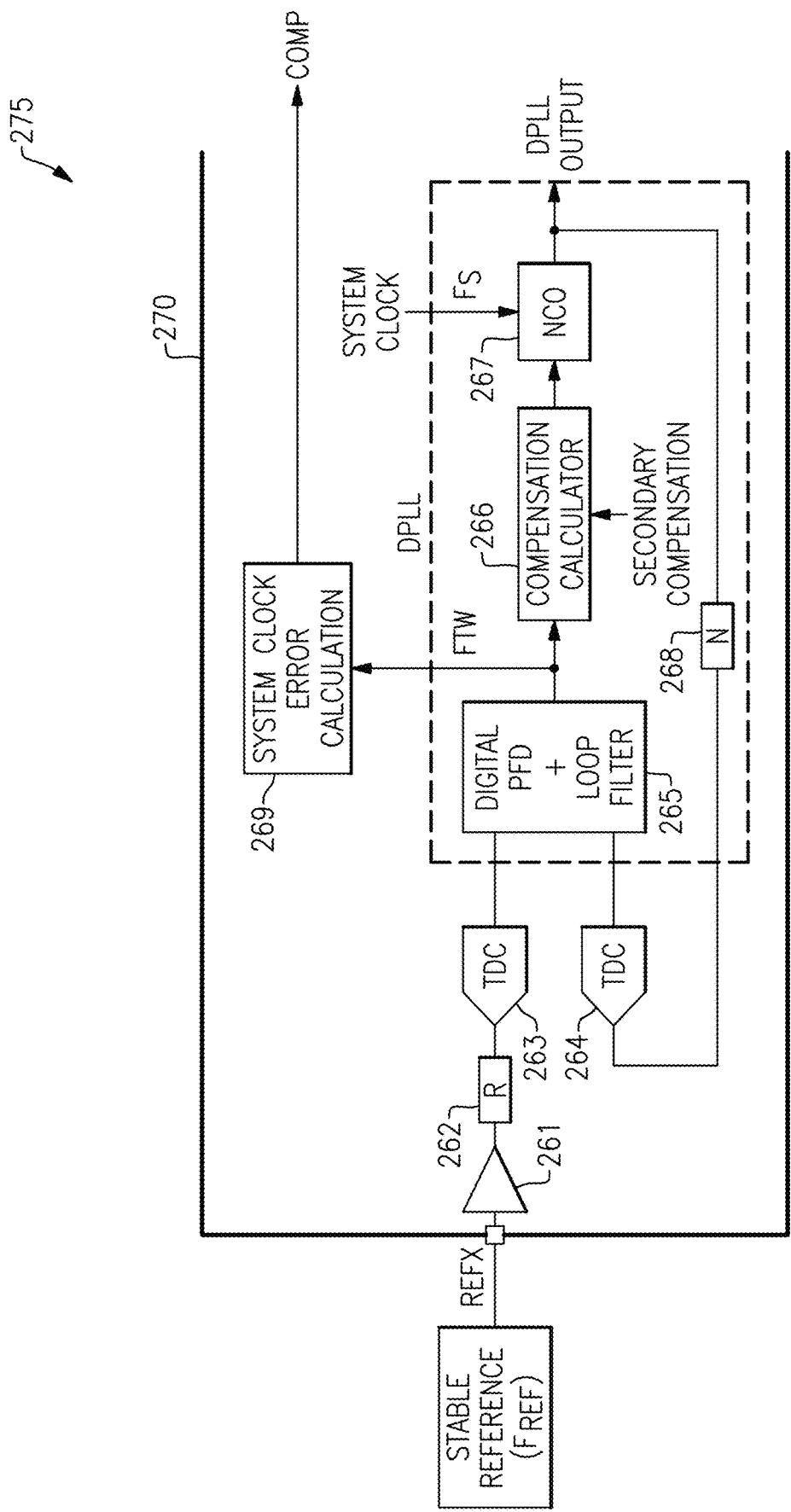
FIG. 10 is a schematic diagram of an IC with closed loop system clock compensation.

FIG. 10 is a schematic diagram of an IC 275 with closed loop system clock compensation. The IC 275 includes an input reference buffer 261, an input reference divider 262, a reference TDC 263, a feedback TDC 264, a digital PFD and loop filter 265, a compensation calculator 266, an NCO 267, a feedback divider 268, and a system clock error calculation circuit 269.

The IC 275 measures an error of the system clock signal based on comparing the system clock signal to a stable reference source using a DPLL. Thus, the DPLL of FIG. 10 serves to measure a clock error of the system clock signal relative to the stable reference signal, which is received from the REFX pin, in this example.

As shown in FIG. 10, FTWs from the DPLL are processed by the system clock error calculation circuit 269 to generate one or more compensation signals for circuit blocks of the IC 275.

The DPLL of FIG. 10 includes the compensation calculator 266, which processes the FTWs from the digital PFD and loop filer 265 to control the input FTW to the NCO 267.

In the illustrated embodiment, the compensation calculator 266 is also configured to receive a secondary compensation signal, which can be provided to further enhance accuracy of the clock error measurement. In one example, the secondary compensation signal is provided from an error model, thereby combining open-loop and closed-loop system clock compensation. In another example, the secondary compensation signal is provided from another PLL loop that compares the system clock signal to another stable reference signal.

Figure 11:
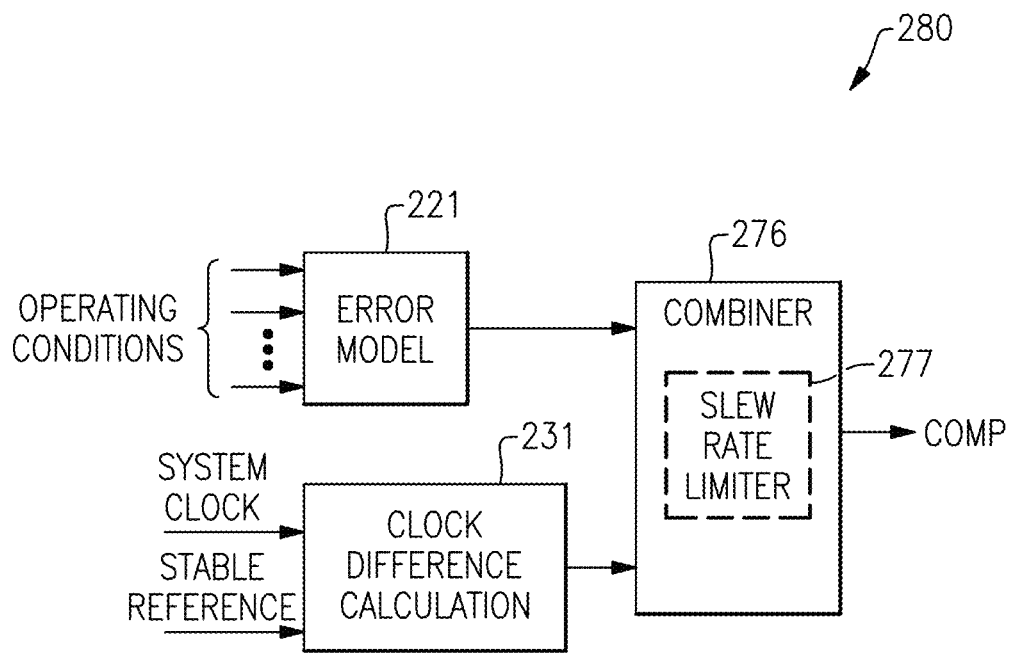
FIG. 11 is a schematic diagram of a system clock compensation circuit according to another embodiment.

FIG. 11 is a schematic diagram of a system clock compensation circuit 280 according to another embodiment. The system clock compensation circuit 280 includes an error model 221, a clock difference calculation circuit 231, and a combiner 276.

The error model 221 generates an open loop estimate of an error of the system clock signal based on values of one or more operating conditions (for instance, temperature, supply voltage, and/or other operating conditions). Additionally, the clock difference calculation circuit 231 generates a closed loop estimate of the error of the system clock signal based on comparing the system clock signal to the stable reference signal.

In the illustrated embodiment, the combiner 276 generates one or more compensation signals based on combining the estimates from the error model 221 and the clock difference calculation circuit 231. In certain implementations, a system clock compensation circuit includes a slew rate limiter 277 to limit a rate at which one or more compensation signals can change. For instance, the slew rate limiter 277 can be used to limit a maximum change in frequency and/or phase of an output clock signal generated by an IC.

The system clock compensation circuit 280 illustrates one example of a system clock compensation circuit that operates using a combination of open-loop compensation and closed-loop compensation.

Figure 12:
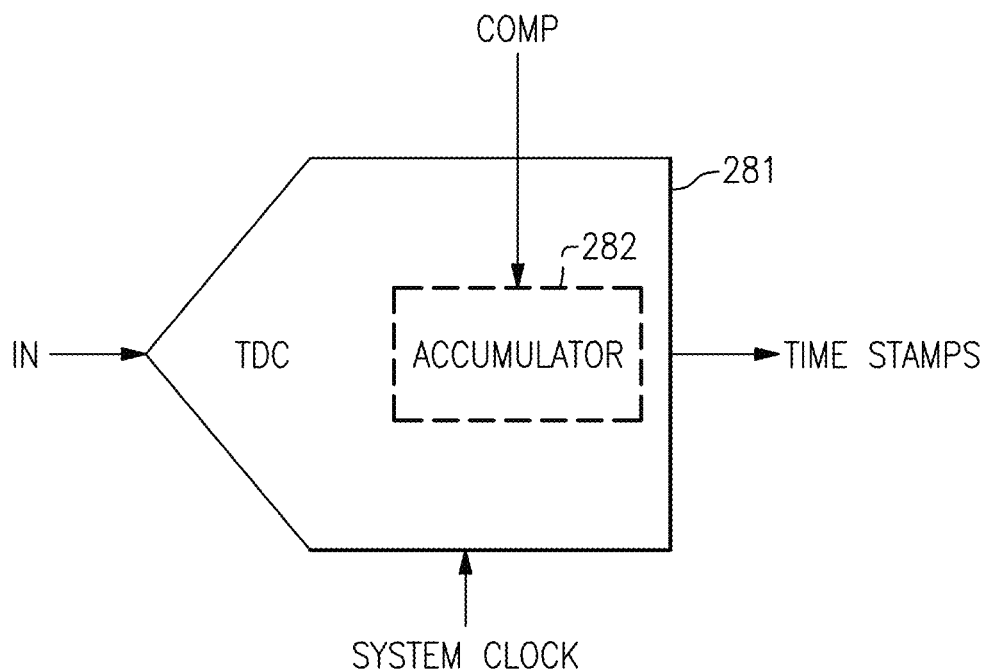
FIG. 12 is a schematic diagram of a TDC according to one embodiment.

FIG. 12 illustrates a schematic diagram of a TDC 281 according to one embodiment. The TDC 281 includes an accumulator 282 that receives a compensation signal COMP that controls an accumulation rate of the TDC 281.

The TDC 281 provides time-to-digital conversion of an input signal IN based on timing of a system clock signal. The TDC 281 generates digital time stamps representing time instances at which transitions (for instance, rising and/or falling edges) of the input signal occur.

The accumulator 282 is used in generating the digital time stamps representing the time instances of the input signal transitions. Additionally, the compensation signal COMP is used to vary a rate of the accumulator 282 to maintain the average accumulator slope substantially constant, thereby providing compensation based on instantaneous frequency error of the system clock signal. By implementing the TDC 281 in this manner, the digital time stamps can be substantially independent of temperature or other operating conditions.

By enhancing the performance of the TDC 281, a number of benefits can be achieved. In one example, the time stamps from the TDC 281 are used by a DPLL to control phase locking. By compensating the TDC 281 using the compensation signal, superior DPLL performance can be achieved. In another example, the time stamps from the TDC 281 can be processed by a reference monitor to determine whether or not a reference signal (for instance, an external clock signal provided by a user) is within a specified frequency accuracy. By providing a TDC that is desensitized to system clock error, the reference monitor can achieve reference monitoring with higher accuracy, lower latency, and/or at a resolution finer than a ppm variation of the system clock signal.

Figure 13:
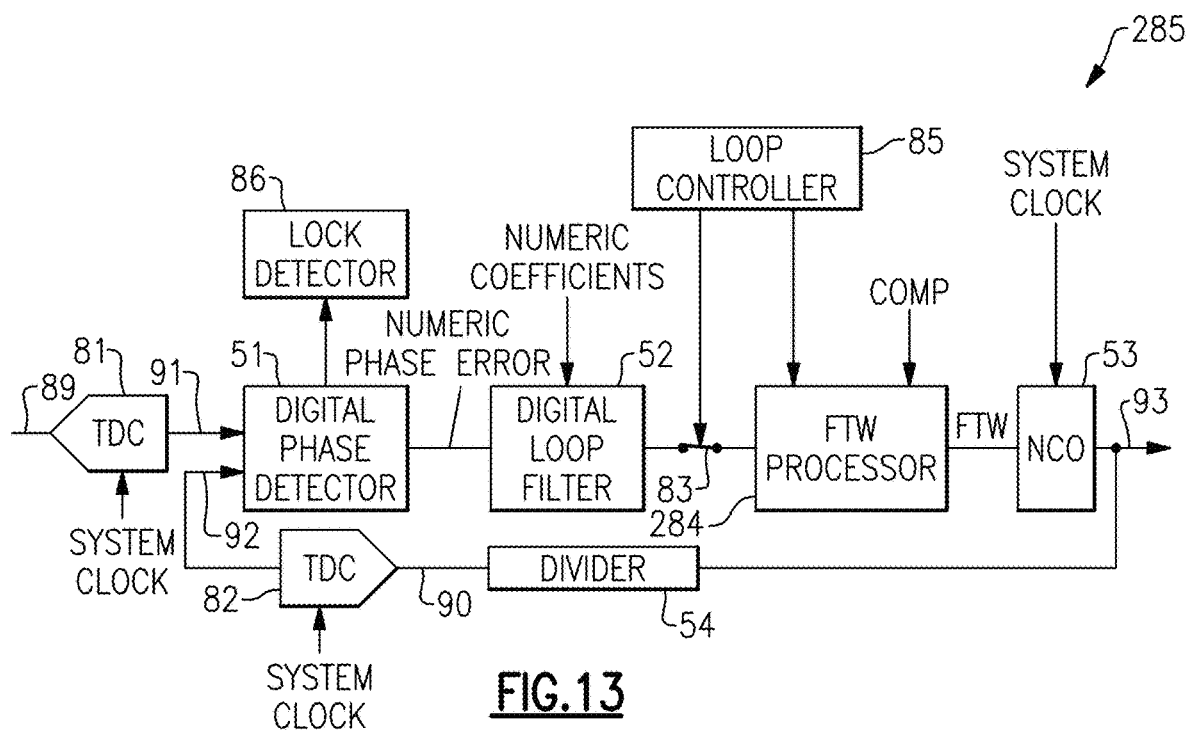
FIG. 13 is a schematic diagram of a DPLL according to another embodiment.

FIG. 13 is a schematic diagram of a DPLL 285 according to another embodiment. The DPLL 285 of FIG. 13 is similar to the DPLL 80 of FIG. 3, except that the DPLL 285 includes a FTW processor 284 that receives a compensation signal COMP from a system clock signal compensation circuit.

The compensation signal provides digital adjustment to the FTW. In one example, the compensation signal can be added to the input tuning word received by the FTW processor 284. Additionally, the compensation signal has a value selected to desensitize the FTW processor 284 to stability and accuracy errors of the system clock signal.

When a system clock signal is compensated for temperature and/or other operating conditions, a lower loop bandwidth for the DPLL 285 can be used, which results in better loop filtering of low frequency phase noise and/or relaxed constraints on a quality or precision of an input reference signal to the DPLL 285.

Thus, such compensation techniques allow a DPLL loop to provide filtering of loop noise and/or input reference noise without being constrained or limited by a need to filter for errors in the system clock signal.

Figure 14:
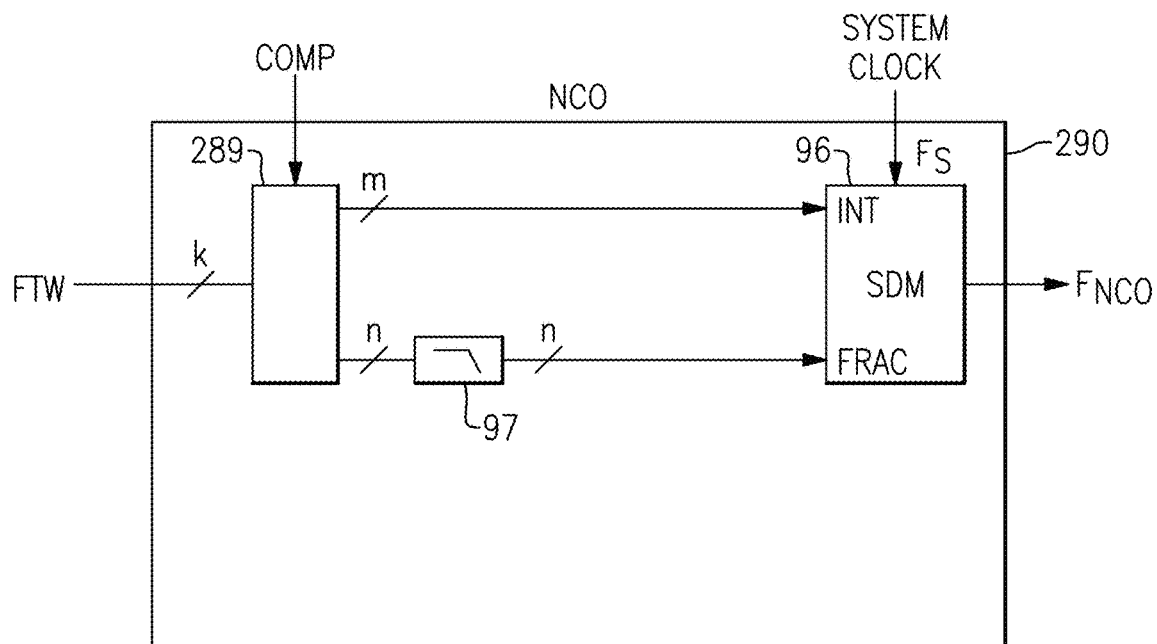
FIG. 14 is a schematic diagram of an NCO according to another embodiment.

FIG. 14 is a schematic diagram of an NCO 290 according to another embodiment. The NCO 290 of FIG. 14 is similar to the NCO 100 of FIG. 4, except that the NCO 290 includes an FTW processor 289 that receives a compensation signal from a system clock signal compensation circuit.

The NCO 290 generates an output clock signal based on the FTW and the system clock signal. Additionally, the compensation signal provides an adjustment or modification to the control word such that the NCO is compensated for error in the system clock signal arising from changes in temperature, supply voltage, and/or operating conditions.

Reducing Variation in Signal Propagation Delay

Signal propagation speeds through a signal path including active devices and/or transmission media can vary for a number of reasons. For example, a delay in signal propagation can vary with temperature, frequency, and/or other operating conditions.

In certain implementations herein, signal timing within an electronic system is adjusted based on modeled and/or measured propagation delay. By enhancing signal timing in this manner, a reduction in signal timing variation at one or more desired nodes or points within a system can be achieved.

While described in the context of controlling timing of a clock signal, the teachings herein are applicable to reducing variation in signal propagation delay of other kinds of signals. In one example, digital signals can be retimed to the timing of a clock signal, and thus can be indirectly controlled via that clock signal's timing.

Certain PLLs are configured such that there is a well-controlled phase difference between an input reference signal to the PLL and an output clock signal generated by the PLL. For example, zero-delay PLLs refer to PLLs in which a phase difference between the output clock signal and the input reference signal is about zero degrees. Zero-delay PLLs can operate without output frequency scaling, such that a phase difference of zero degrees is present for each cycle. Zero-delay PLLs can also operate with output frequency scaling, such that the zero phase points of the signals match on regular subsets of clock cycles.

A zero-delay PLL can minimize a phase difference between the output clock signal and input reference clock signal by matching the effective delay in the PLL's feedback path to equivalent portions of the reference and output signal paths.

The physical location where the phases nominally align can be adjusted by including all or part of the output signal path, or a replica thereof, within the feedback path. Alternately or additionally, a controllable timing element can be included in the PLL and used to shift a point of phase alignment.

When the reference signal path and output signal path vary in delay, the alignment will vary to a degree that is based on a quality of delay matching between these paths and the feedback path. For example, path matching can rely on the paths experiencing the same variation inducing stimulus and reacting equivalently. Generally, an (asymmetric) timing element in the PLL, such as a phase shifter, which is not equally represented in the path delays, will result in a non-equivalent reaction in the paths.

By including a timing control element (for instance, a controllable delay element) capable of live adjustment (for example, adjustment that changes over time during operation) into a signal path, new methods of achieving zero delay at a point in the system and of reducing delay variation at that point can be achieved. For example, the timing control element can be included in a PLL or any other suitable periodic signal path. For a periodic signal, any delay of multiple unit cycles is indistinguishable in certain applications, so the minimum insertion delay of an element may be effectively removed. Non-periodic signals are also subject to the same techniques with regard to reducing delay variation.

Signal delay to any point in the system may be modeled, empirically or otherwise, with any number of variables. Evaluating this delay model and applying the negative of the result to the timing control element can substantially control the net delay to zero or another desired phase value. When model variables change, the model evaluation and delay adjustment process can be repeated to maintain the desired delay. Furthermore, any delay sensitivities of the timing control element can be included in the delay model.

A wide variety of delay models can be used in accordance with the teachings herein. For example, delay models may span a wide range of complexity. In certain implementations, a zero variable model is used to correct for a nominal offset.

The delay models can compensate for variation in delay arising from a variety of sources. In one example, the delay model receives an input temperature signal indicating a temperature condition.

When compensating for temperature, a single locality in the system can be used to approximate the average response over a larger physical region and/or multiple temperature measurements can be used to account for gradient effects.

Additionally or alternatively to temperature, other variables can be modeled for impact on delay variation, such as device supply voltage(s) and/or signal format (i.e. CMOS, LVDS, etc.). Furthermore, even variables associated with timing measurements can be included. For example, a round trip delay time, such as measured by a time domain reflectometer or other suitable detector, can be used as a model variable. In contrast to zero delay PLLs whereby part of the feedback path encompasses a portion of the output path or a replica thereof, the model variable can be measured independent of the feedback path.

Delay adjustment can be provided by a wide variety of timing control elements capable of live adjustment. For example, certain DPLLs include delay adjustable circuitry. The origination point of a signal, such as an oscillator, can also be delay adjustable in certain implementations. Furthermore, certain NCOs, including but not limited to direct digital synthesizers (DDS), have adjustable delays.

In certain implementations, adjustment to a DPLL is controlled in a different manner depending on whether or not the timing loop of the DPLL is active. For example, an active loop's phase offset is subject to the dynamic response of the DPLL. In certain implementations, a DPLL includes an NCO, and a coordinated adjustment of the DPLL phase and NCO phase is provided for an active DPLL.

Figure 15:
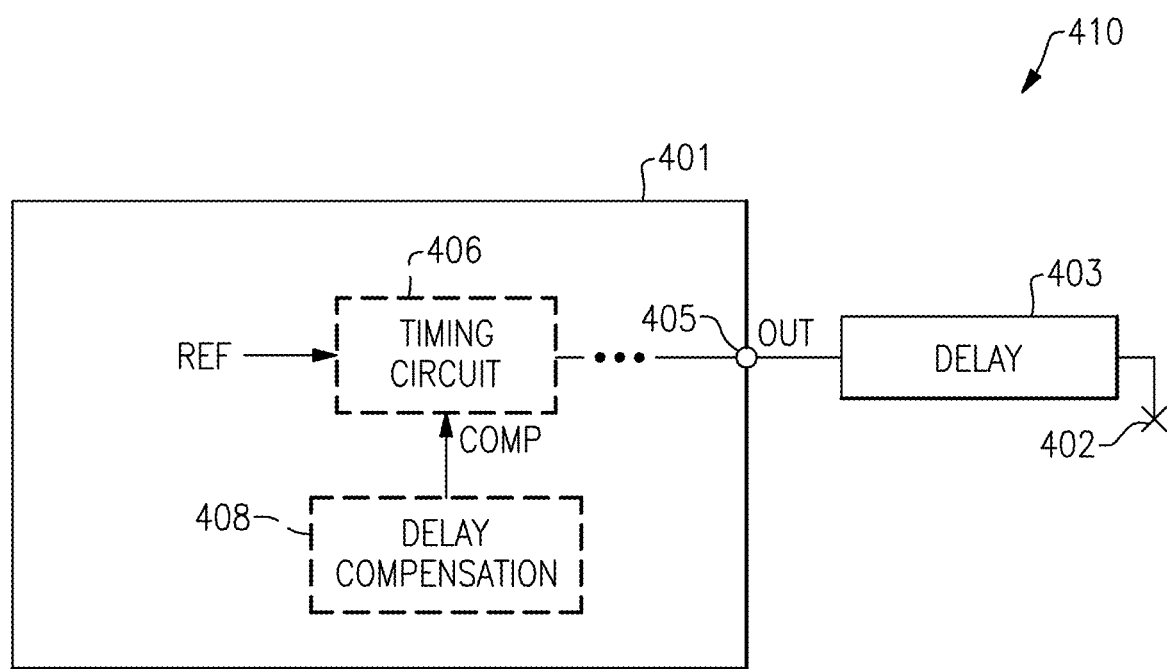
FIG. 15 is a schematic diagram of one embodiment of an electronic system with delay compensation.

FIG. 15 is a schematic diagram of one embodiment of an electronic system 410 with delay compensation. The electronic system 410 includes an IC 401 including an output pin 405, a timing circuit 406, and a delay compensation circuit 408. The timing circuit 406 generates an output signal (OUT) based on timing of a reference signal REF. Additionally, the output signal is provided to a destination node 402 via the output pin 405 and a path 403 with variable delay.

In certain implementations, the IC 410 is a clock synchronization and frequency translation IC, such as the clock synchronization and frequency translation IC 40 of FIG. 1. In such implementations, the timing circuit 406 can include a DPLL, and the output signal provided to the output pin 405 can correspond to an output clock signal.

The illustrated IC 410 includes the delay compensation circuit 408, which generates a compensation signal COMP that compensates the timing circuit 406 for a variation in the delay of the path 403. In certain implementations, the delay compensation circuit 408 further compensates for on-chip variation.

The delay compensation circuit 408 can compensate for variation in delay arising from temperature, supply voltage, and/or other operating conditions. In certain implementations, the compensation signal COMP is digital, such that the delay compensation circuit 408 provides digital adjustment for delay variation. Additionally, the value for digital adjustment is changed over time to compensate for variation in delay.

By implementing the IC 401 in this manner, a difference in phase between the output signal at the destination node 402 and input reference signal REF can be controlled to a desired value.

Figure 16:
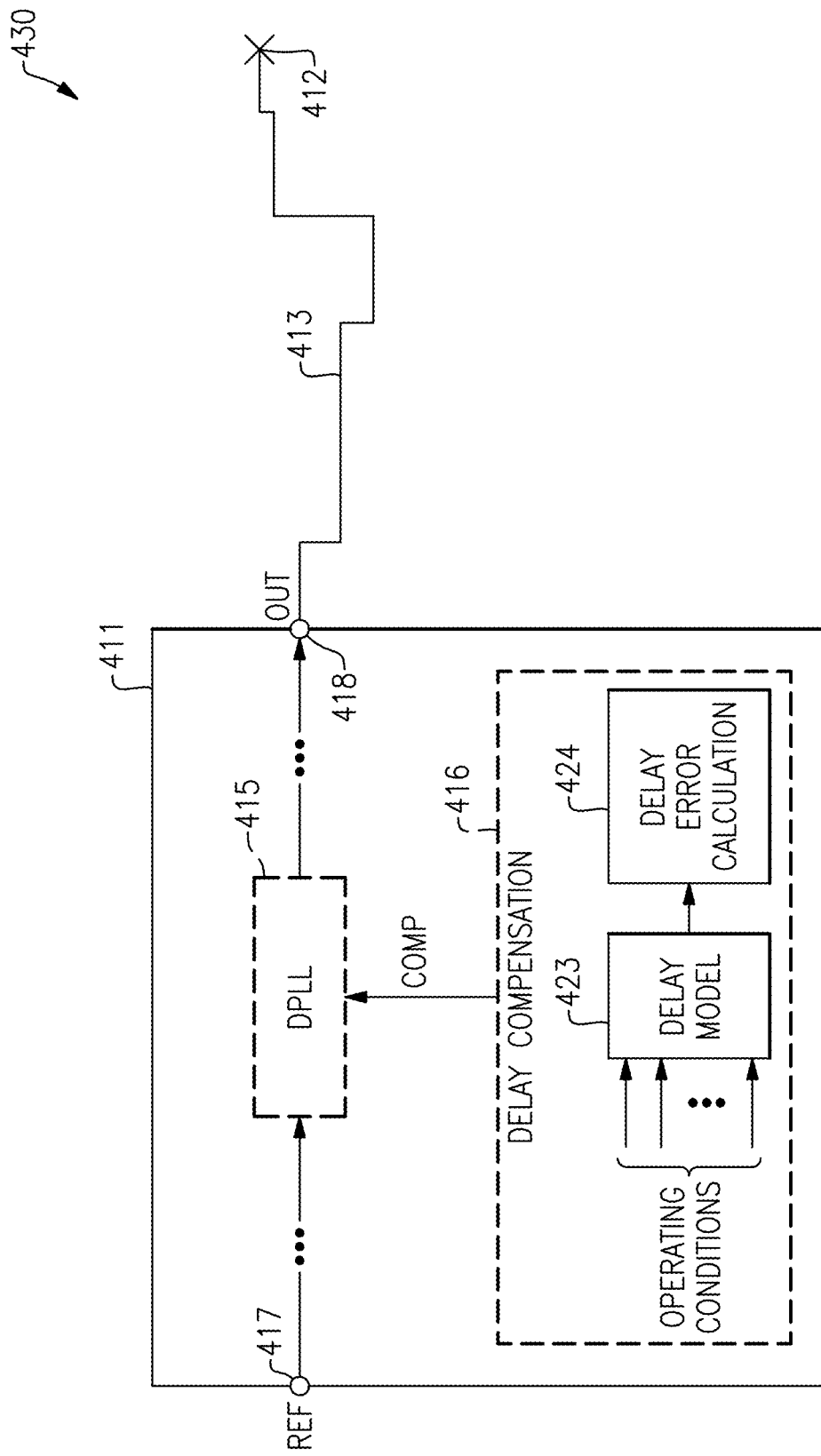
FIG. 16 is a schematic diagram of another embodiment of an electronic system with delay compensation.

FIG. 16 is a schematic diagram of another embodiment of an electronic system 430 with delay compensation. The electronic system 430 includes an IC 411 including a DPLL 415, a delay compensation circuit 416, an input reference pin 417, and an output clock pin 418. The DPLL 415 receiving an input reference signal REF from the input reference pin 417, and generates an output clock signal that is provided to the output clock signal pin 418. Although not illustrated in FIG. 16, various dividers, multiplexers, buffers, and/or other circuitry can be present between the DPLL 415 and the IC's pins. As shown in FIG. 16, the output clock signal is provided to a destination node 412 via an external signal path 413, which can have a delay that varies with one or more operating conditions. Although an example of providing delay compensation to an external signal path is shown, delay compensation can be provided to a signal path including internal elements, external elements, or a combination thereof. Thus, delay compensation is applicable to internal signal paths, external signal paths, and signal paths including both an internal portion and an external portion.

In certain implementations, the IC 411 is a clock synchronization and frequency translation IC, such as the clock synchronization and frequency translation IC 40 of FIG. 1.

A zero-delay PLL generates an output clock signal with substantially the same phase as an input reference clock signal from which the output clock signal is synthesized. However, a zero-delay PLL may not be suitable for certain applications. For example, a zero-delay PLL can be included on an IC, and a clock output signal from the IC can be provided over long trace and/or through other components (for instance, additional chips). Additionally, it can be desirable to match the phase at a certain point off chip to the phase of the input reference clock signal.

Such off-chip routes and components can have delays that vary with temperature, supply voltage, and/or other operating conditions. Although a zero-delay PLL may drive the inputs of its phase detector to about zero degrees, the phase at one or more points off chip may not have a desired phase relationship with respect to the input reference signal.

The illustrated IC 411 includes the delay compensation circuit 416, which generates a compensation signal that compensates the DPLL 415 for a variation in the delay of the signal path 413. In certain implementations, the delay compensation circuit 416 further compensates for on-chip variation.

In the illustrated embodiment, the delay compensation circuit 416 includes a delay model 423 and a delay error calculation circuit 424.

As shown in FIG. 16, the delay model 423 receives one or more signals indicating one or more operating conditions of the electronic system. Examples of operating conditions include supply voltage, signal format, and/or environmental conditions, such as temperature, moisture, and/or humidity.

The delay model 423 generates a modeled delay error based on the one or more signals indicating operating conditions. Additionally, the delay error calculation circuit 424 processes the modeled delay error to generate a compensation signal for compensating the delay of the DPLL 415. The delay compensation circuit 416 can provide delay adjustment using the compensation signal COMP in a wide variety of ways, including both within a loop of a DPLL and/or outside of such a loop.

The delay model 423 can be implemented in a wide variety of ways. In one embodiment, the delay model 423 corresponds to a polynomial model. However, other types of models can be used.

Coefficients of the delay model 423 can be obtained in a wide variety of ways. In one example, a user can program an IC (for instance, via the serial port of the IC 40 of FIG. 1) with model data suitable for modeling a particular external signal path, including transmission media and/or active components.

Thus, the delay compensation circuit 415 of FIG. 16 uses the delay model 423 to estimate the change in delay of the signal path 413 arising from a change in temperature, supply voltage, and/or other operating condition. Additionally, a corresponding digital adjustment is provided such that the delay is compensated for, and the desired clock signal phase is maintained at the desired off-chip destination node 412.

A delay compensation circuit that provides compensation based on an delay model can also be referred to herein as providing open-loop compensation for delay variation.

Figure 17:
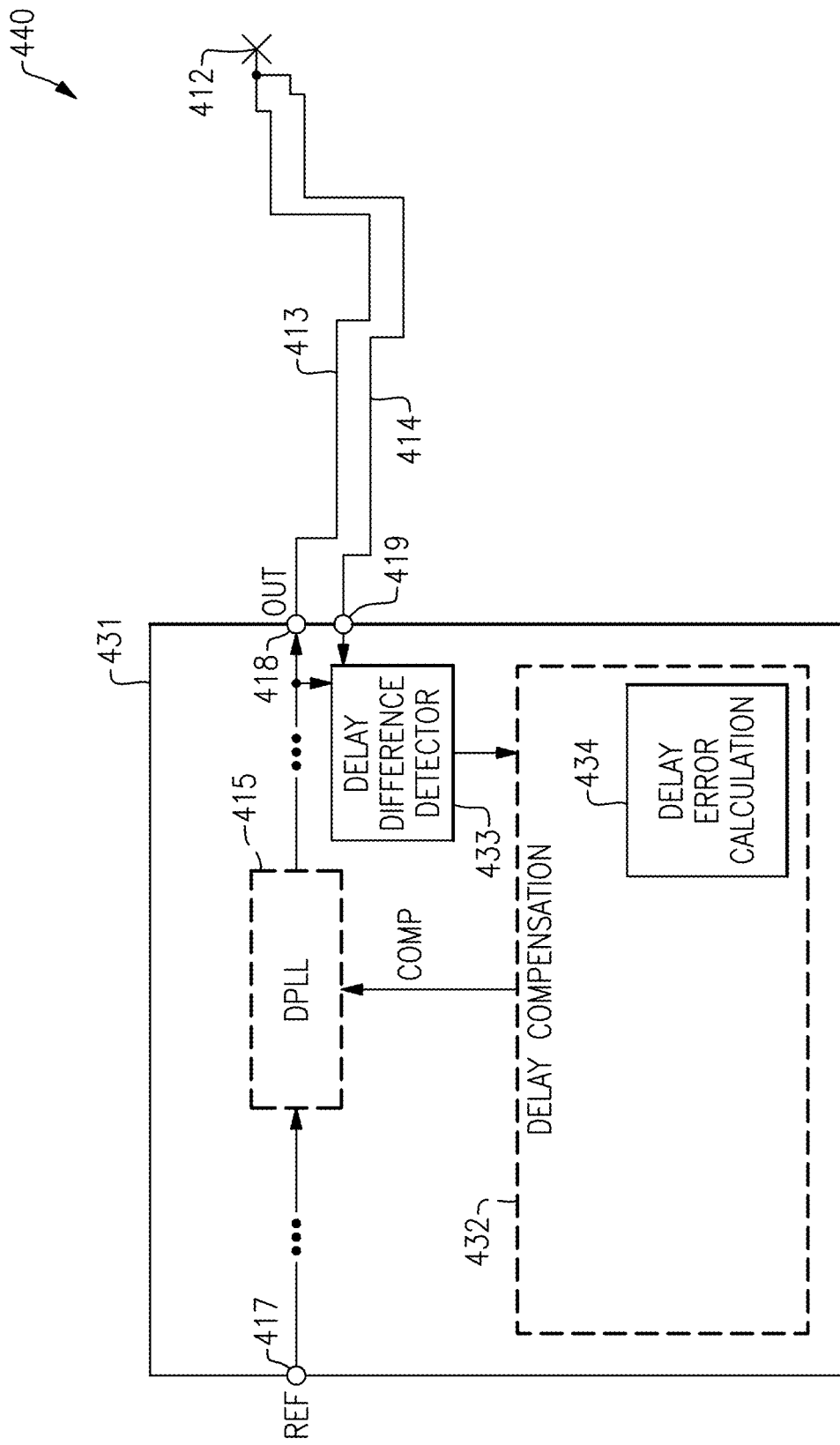
FIG. 17 is a schematic diagram of another embodiment of an electronic system with delay compensation.

FIG. 17 is a schematic diagram of another embodiment of an electronic system 440 with delay compensation. The electronic system 440 includes an IC 431 including an input reference pin 417, an output pin 418, a return path pin 419, a DPLL 415, a delay compensation circuit 432, and a delay difference detector 433. As shown in FIG. 17, the output clock signal is provided to a destination node 412 via an external signal path 413, which can have a delay that varies with one or more operating conditions. Additionally, a return path 414 is provided from at or near the destination node 412 to the return path pin 419.

In certain implementations, the IC 431 is a clock synchronization and frequency translation IC, such as the clock synchronization and frequency translation IC 40 of FIG. 1.

In the illustrated embodiment, the delay difference detector 433 measures or detects a delay difference between the output clock signal from the DPLL 415 and the return clock signal received on the return path pin 419. The delay difference detector 433 can be implemented in a variety of ways, such as using a TDC. The detected difference signal is processed by a delay error calculation circuit 434 of the delay compensation circuit 432.

The delay error calculation circuit 434 determines a delay error at the destination point 412 corresponding to a delay variation of the signal path 413 arising from temperature and/or other operating conditions. The delay error calculation circuit 434 takes into account a total path length from the output clock pin 418 to the return path pin 419. For example, in implementations in which a full round trip is made, the round trip total path length can be about twice that of the length of the signal path 413, and thus the delay error calculation circuit 434 can appropriately divide the detected delay error by a factor of about 2.

Accordingly, in certain implementations, variation in delay is compensated for using measured delay variation. In one example, a roundtrip trace can be routed from an output pin of a chip to an input pin of a chip to detect about twice of the off-chip delay. Additionally, about half such a delay can be digitally compensated for. In another example, a trace of shorter length is used to provide an estimation of only a portion or section of the off-chip delay.

The calculated delay error is used to generate a compensation signal COMP for the DPLL 415, such that the phase as the destination node 412 is controlled to a desired value. The delay compensation circuit 432 can provide delay adjustment using the compensation signal COMP in a wide variety of ways, including both within a loop of the DPLL 415 or outside of the DPLL's loop.

A delay compensation circuit that provides compensation based on a measured delay difference can also be referred to herein as providing closed-loop compensation for delay variation.

Figure 18:
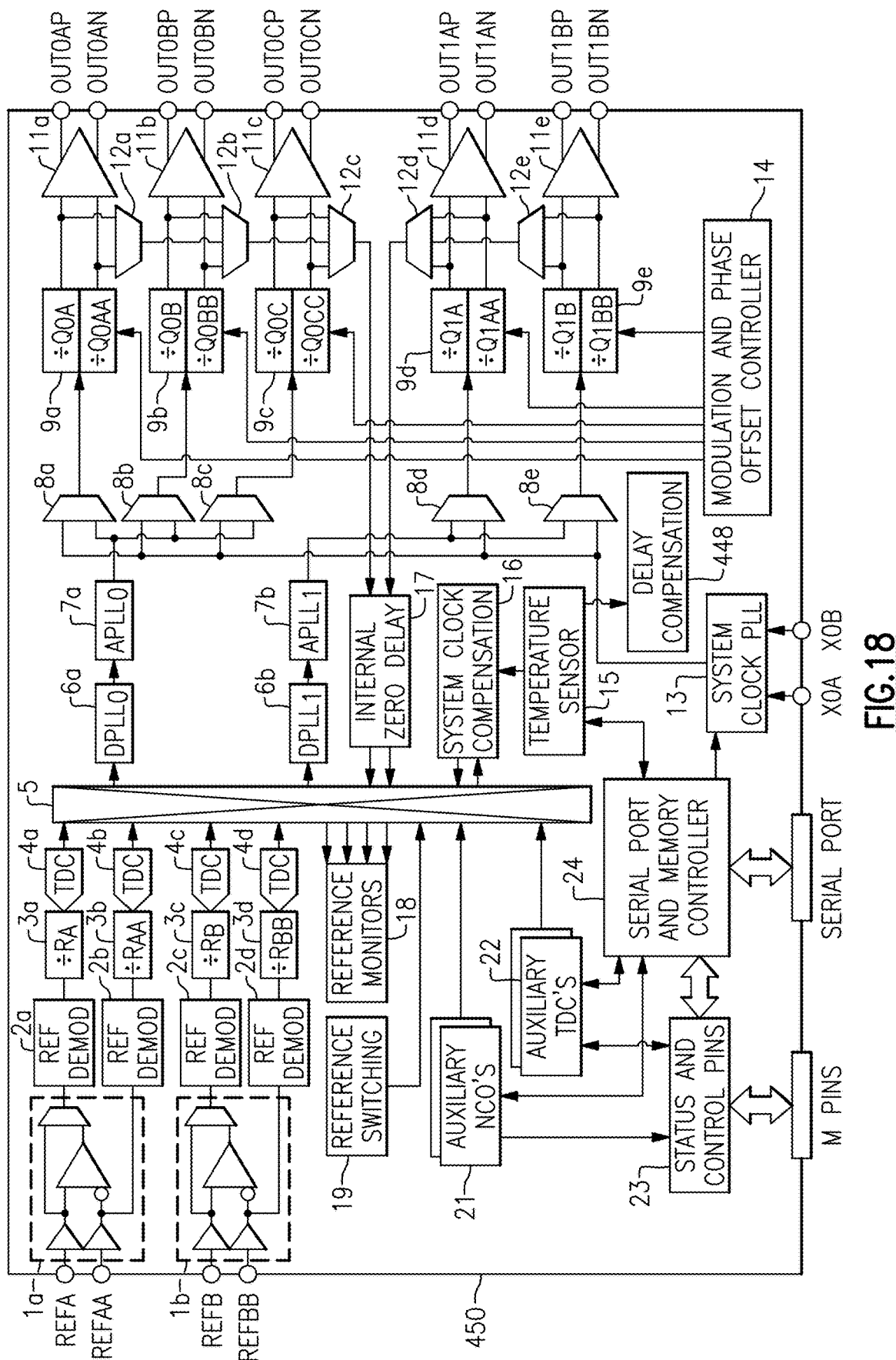
FIG. 18 is a schematic diagram of another embodiment of a clock synchronization and frequency translation IC.

FIG. 18 is a schematic diagram of another embodiment of a clock synchronization and frequency translation IC 450. The clock synchronization and frequency translation IC 450 of FIG. 18 is similar to the clock synchronization and frequency translation IC 40 of FIG. 1, except that the clock synchronization and frequency translation IC 450 further includes a delay compensation circuit 448. In this example, the delay compensation circuit 448 receives a temperature indication signal from the temperature sensor 15. In certain implementations, the delay compensation circuit 448 includes a delay model, which can be programmed by a user via the serial port.

Figure 19:
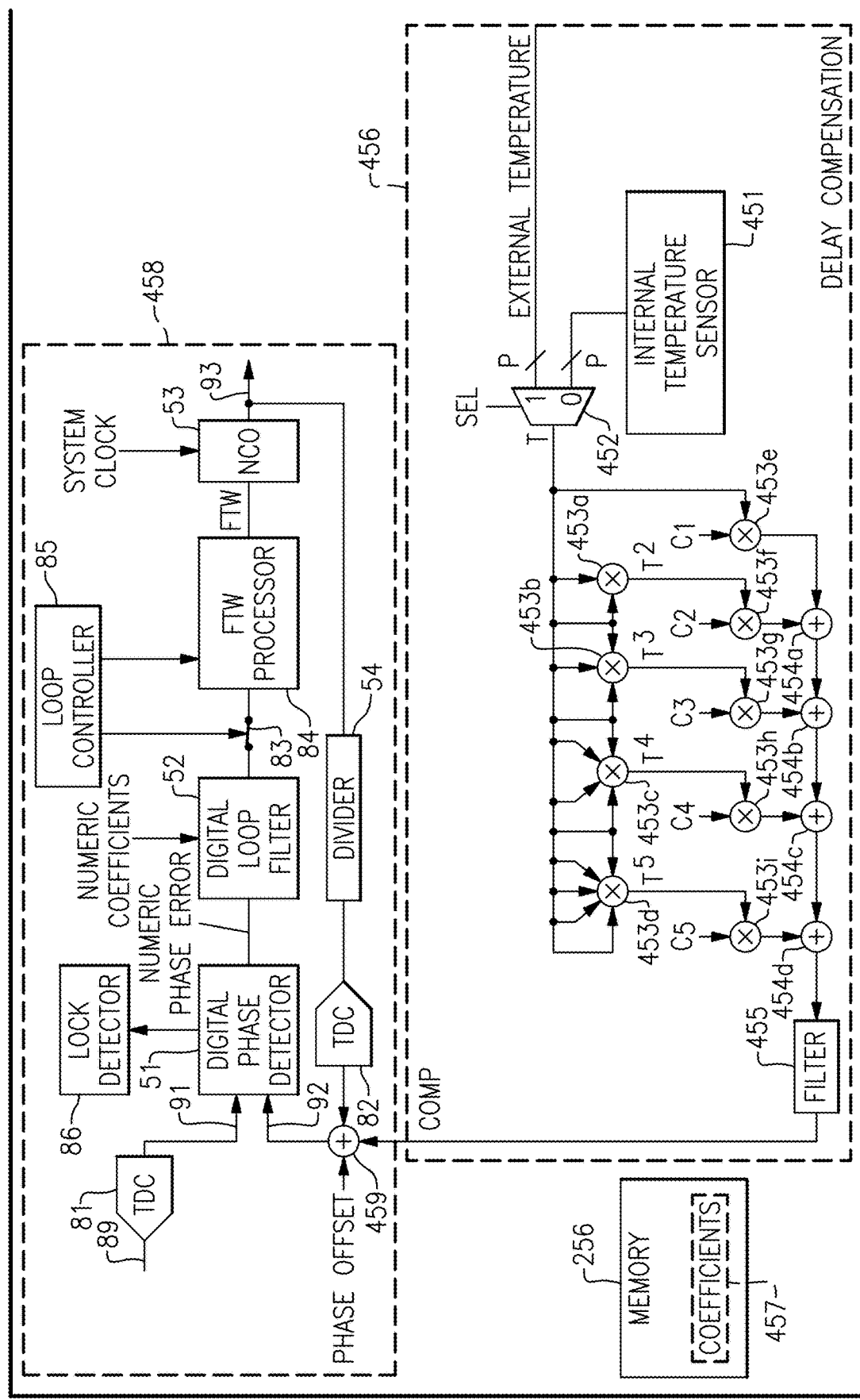
FIG. 19 is a schematic diagram of another embodiment of an IC with delay compensation.

FIG. 19 is a schematic diagram of another embodiment of an IC 460 with delay compensation. The IC 460 includes a memory 256, a delay compensation circuit 456, and a DPLL 458.

The delay compensation circuit 456 includes an internal temperature sensor 451, a multiplexer 452, multipliers 453*a*-453*i*, adders 454*a*-454*d*, and a filter 455. As shown in FIG. 19, the memory 256 stores model coefficients 457 for the delay model, such as polynomial model coefficients C1, C2, C3, C4, and C5. Additionally, the multiplexer 452 selects between an external temperature value and a temperature value from the internal temperature sensor 451 as an input to the error model. The error model uses the temperature input signal and the coefficients 457 to generate a model estimate, which is further processed by the filter 455 to generate the digital compensation signal COMP. The filter 455 aids in mitigating noise injection, and in certain implementations has a user-controllable filtering characteristic (for instance, controllable by data provided over a serial port). The digital compensation signal COMP is based on the value of the delay model at a particular temperature, and thus can vary with time as the temperature changes. Although illustrated as generating one compensation signal, multiple compensation signals can be generated.

Although an example with temperature is shown, the teachings herein are applicable to compensation of delay errors arising from other operating conditions, for instance, supply voltage, signal format, and/or environmental factors.

The DPLL 458 if FIG. 19 is similar to the DPLL 80 of FIG. 3, except that the DPLL 458 further includes an adder 459. In the illustrated embodiment, the adder 459 combines the feedback time stamps from the feedback TDC 82 with the digital compensation signal COMP and a user-controllable phase offset signal (PHASE OFFSET).

Although one example of providing phase adjustment to a DPLL is shown, a phase of a DPLL can be adjusted in a wide variety of ways, including adjustment within the DPLL's loop, adjustment outside of the DPLL's loop, or a combination thereof.

In one example, an output of the DPLL's phase detector is digitally adjusted based on a digital compensation signal. In another example, a reference input to a phase detector (for instance, values of digital time stamps) is digitally adjusted to provide phase adjustment. In yet another example, an explicit digitally-controllable delay element (for instance, a digitally-controlled delay line or DDL) is used for providing such adjustment.

Figure 20:
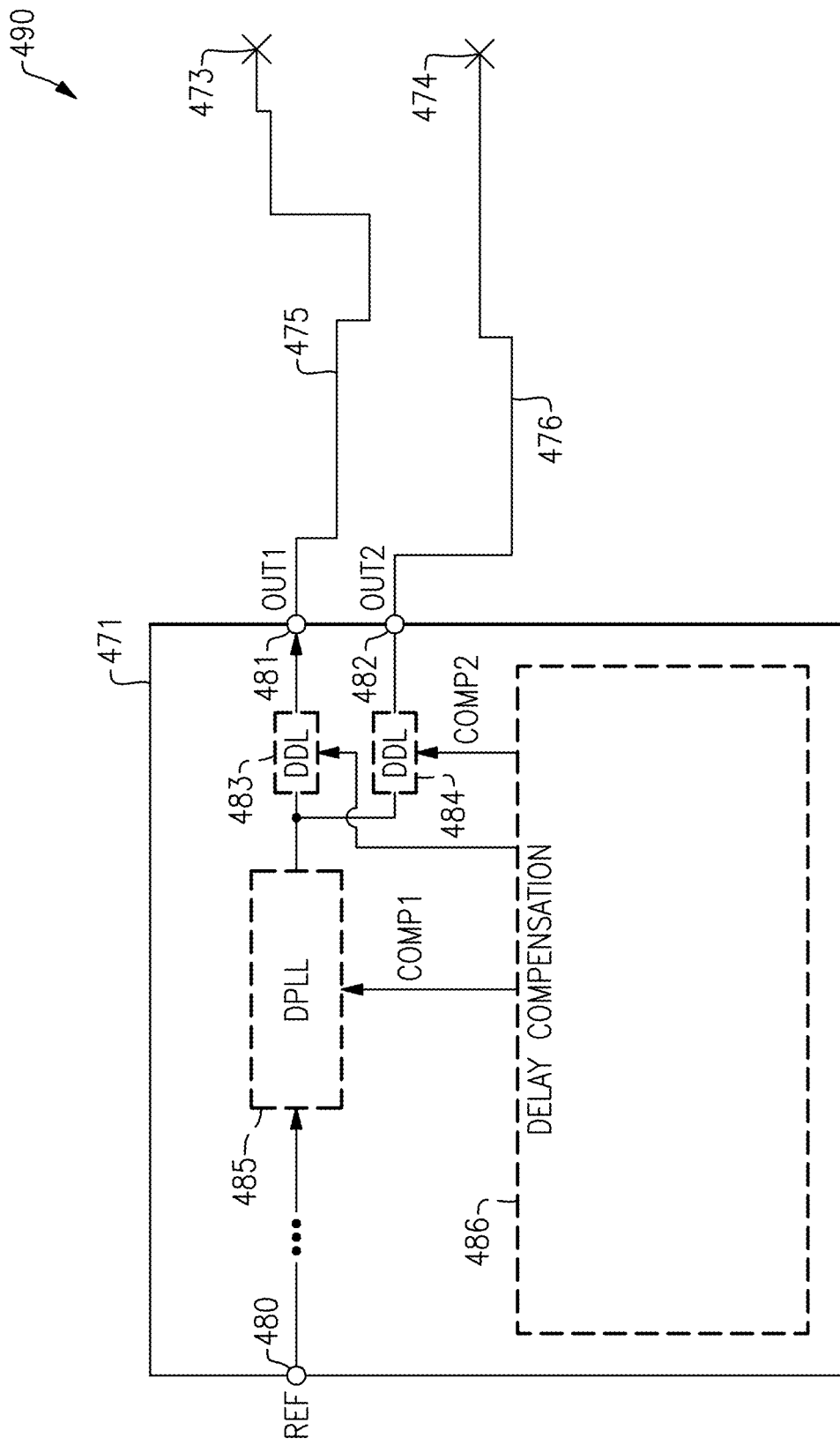
FIG. 20 is a schematic diagram of another embodiment of an electronic system with delay compensation.

FIG. 20 is a schematic diagram of another embodiment of an electronic system 490 with delay compensation. The electronic system 490 includes an IC 471 including a reference pin 480, a first clock output pin 481, a second clock output pin 482, a first digitally-controllable delay element 483 (a DDL, in this example), a second digitally-controllable delay element 484, a DPLL 485, and a delay compensation circuit 486.

In the illustrated embodiment, the DPLL 483 generates an output clock signal that is provided to the first output clock pin 481 via the first digitally-controllable delay element 483 and to the second output clock pin 482 via the second digitally-controllable delay element 484. Additionally, the output clock signal travels from the first output pin 481 to a first destination node 473 via a first signal path 475, and to a second destination node 474 via a second signal path 476.

The first and second signal paths 475, 476 can have different nominal delays and/or delay variations with operating conditions. In the illustrated embodiment, the delay compensation circuit 486 provides separate digital compensation signals COMP1, COMP2 to the digitally-controllable delay elements 483, 484, respectively.

Using digitally controllable delay elements (for instance, DDLs) outside the loop of a DPLL or other timing circuit can provide independent or separate control in implementations including multiple output pins routed to different destinations.

In certain implementations, control over one or more digitally controllable delay elements is combined with digital adjustment to a DPLL via another compensation signal. For example, certain digitally controllable delay elements may have settings that are relatively coarse and/or that exhibit a setting-dependent jitter. Thus, certain implementations combine phase adjustment via digitally controllable delay elements outside of a DPLL's loop with a phase adjustment to a DPLL's loop.

Reference Monitors with Dynamically Controlled Latency

The average period of a clock signal can be estimated by measuring a time interval between two points of the clock signal, and dividing by the number of clock cycles present between the points.

However, an accurate time-base is needed to accurately measure an interval of time. For example, measured time intervals can be ratio-metrically related to the time-base, and thus any deviation in average accuracy will be related to the time-base. Instantaneous deviations in accuracy, as characterized by measurement jitter, can arise from the time-base and/or the clock measurement device that generates measurements based on the time-base.

The measured clock signal is also subject to phase jitter, which combines with the measurement jitter to provide an uncertainty in the measured time interval. As the duration of measurement increases (for instance, increasing a number of cycles of the clock signal over which the measurement is taken), the uncertainty becomes small relative to the time interval. Thus to achieve a smaller uncertainty, a longer measurement duration can be used.

A value of the uncertainty can be assumed, and a measurement latency can be chosen to be sufficiently long to account for the assumed uncertainty. However, using an assumed uncertainty value has significant drawbacks. For example, when the assumed uncertainty value is too large, the measurement duration is needlessly long. However, when the assumed uncertainty is smaller than the actual uncertainty, the measured time interval has a precision that violates the required tolerance, and thus may be inaccurate.

In certain implementations herein, a clock measurement circuit operates to generate digital measurements of a reference clock signal based on timing of a system clock signal. Additionally, a reference monitor processes the digital measurements from the clock measurement circuit to statistically estimate the uncertainty in the digital measurements. Additionally, the reference monitor uses the estimate of the uncertainty to control a latency of the reference monitor in detecting whether or not the reference clock signal is within a tolerance specified by one or more tolerance parameters.

In certain applications, an estimate of the uncertainty can be detected in less time than it takes to satisfy the measurement tolerance indicated by the tolerance parameters. Thus, the reference monitor can detect whether or not the reference clock signal is within the tolerance with lower latency and higher speed.

Reducing a latency of the reference monitor can provide a number of advantages. For example, quickly determining whether or not the reference clock signal is within the tolerance provides a system with additional time to react to the change in the clock signal status, for instance, in response to a change of the reference clock signal from within the tolerance to outside of the tolerance.

Furthermore, for larger shifts in frequency, the reference monitor can detect when the reference clock signal is out of tolerance more quickly. For example, when the error band around the frequency measurement no longer intersects with the tolerance window around the expected frequency, the reference monitor can determine that the reference clock signal has failed the monitoring comparison. Although the error band decreases in size over longer intervals, a relatively large error band may still cause the comparison to fail. For example, because the measured value can be further from the ideal to accommodate the larger band, larger frequency offsets can be detected earlier.

Since the measurement is of the average frequency over the interval, longer intervals are less sensitive to shifts in frequency in the short term. Once the desired precision is met, the measurement can be concluded, and a new measurement can begin. In certain implementations, the reference monitor performs frequency measurements over multiple overlapping intervals simultaneously, thereby improving reaction time.

Allowing for near minimal observation intervals, quickly detecting larger shifts in frequency, and/or maintaining sensitivity to shifts in frequency aid in reducing frequency detection latency.

Figure 21:
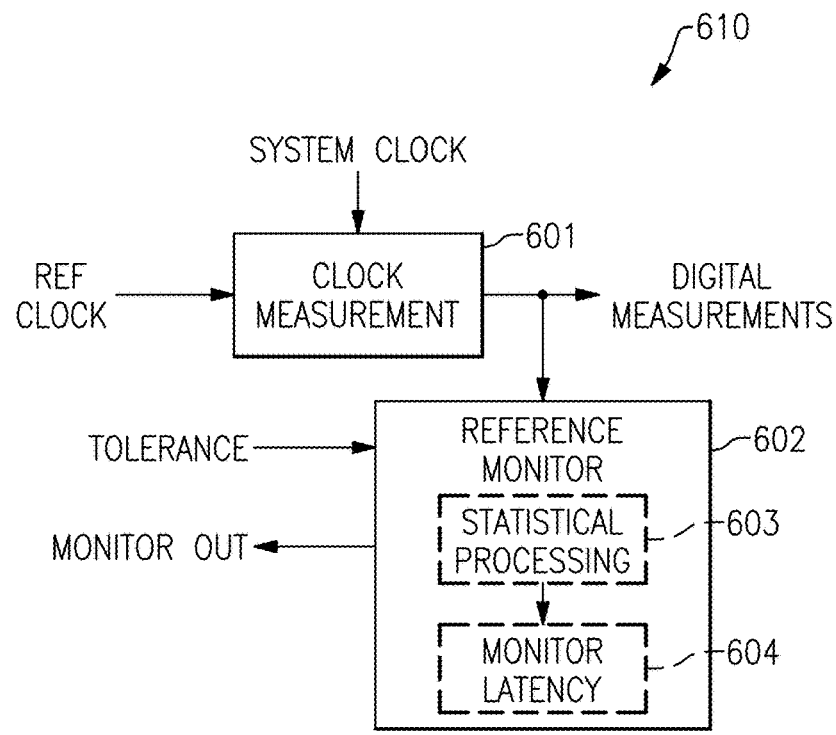
FIG. 21 is a schematic diagram of one embodiment of a reference monitoring system.

FIG. 21 is a schematic diagram of one embodiment of a reference monitoring system 610. The reference monitoring system 610 includes a clock measurement circuit 601 and a reference monitor 602.

As shown in FIG. 21, the clock measurement circuit 601 receives a reference clock signal (REF CLOCK). The reference clock signal can be received in a variety of ways, such as from a pin of an IC. Although the reference clock signal is illustrated as being directly provided to an input of the clock measurement circuit 601, in certain implementations the reference clock signal is processed prior to measurement. For example, the reference clock signal can be buffered, divided, inverted, and/or processed in other ways.

The clock measurement circuit 601 generates digital measurements (DIGITAL MEASUREMENTS) of the reference clock signal based on timing of a system clock signal (SYSTEM CLOCK). Thus, the system clock signal serves as a time base for generating the digital measurements.

The reference monitor 602 processes the digital measurements from the clock measurement circuit 601 to determine whether or not the reference clock signal is within a desired tolerance specified by one or more tolerance parameters (TOLERANCE). In certain implementations, the tolerance parameters indicate at least one of a tolerated error in frequency accuracy or a tolerated error in frequency stability.

As shown in FIG. 21, the reference monitor 602 generates a monitor output signal (MONITOR OUT) indicating whether or not the reference clock signal is within the tolerance. Additional signals may be outputted, for instance, signals that quantify the particular tolerance violated, in which direction, and by what magnitude.

The reference monitor 602 includes a statistical processing circuit 603, which processes the digital measurements from the clock measurement circuit 601 to statistically estimate the uncertainty in the digital measurements. Additionally, the statistical processing circuit 603 uses the estimate of the uncertainty to control a latency 604 of the reference monitor 602 in detecting whether or not the reference clock signal is within the tolerance indicated by the one or more tolerance parameters.

The statistical processing circuit 603 can use a wide variety of statistical processing, including, but not limited to, calculation of variance and/or mean of the digital measurements over a time window. Persons of ordinary skill in the art will appreciate that a statistical processing circuit can calculate variance directly or indirectly by calculating standard deviation and/or another statistical indicator of variation.

Uncertainty in measurements can arise from a number of sources, such as jitter of the system clock signal and/or jitter of the clock measurement circuit 601. By dynamically controlling the monitor's latency based on the estimate of the uncertainty, the delay of the reference monitor 602 can be dynamically adjusted as needed to obtain a desired measurement confidence.

For example, when the uncertainty of measurement is estimated to be relatively low, the statistical processing circuit 603 shortens the latency 604 of monitor 602, thereby generating the monitor output signal relatively rapidly while maintaining a desired confidence. However, when the uncertainty of the measurement is estimated to be relatively high, the statistical processing circuit 603 extends the latency 602 such that the reference monitor 602 determines whether or not the reference clock signal is within the tolerance with a desired confidence interval.

In contrast, a reference monitor that operates with an assumed or fixed uncertainty value can exhibit poorer performance. For example, when the assumed uncertainty value is too large, the measurement duration is needlessly long. However, when the assumed uncertainty value is smaller than the actual uncertainty, the measured value has a precision that violates the required tolerance, and thus measurement device can generate unreliable measurements.

In one embodiment, the reference monitor 602 has an initial estimate of the uncertainty, which can be obtained in a variety of ways, such as via user programming and/or implemented in the reference monitor 602 as part of design and/or during manufacture. For a given selection of tolerance parameters, the reference monitor 602 can have a nominal latency corresponding to the initial estimate of the uncertainty. Furthermore, the statistical processing circuit 603 lengthens or shortens the latency 604 of the frequency measurement relative to the nominal latency based on the estimated uncertainty.

Figure 22:
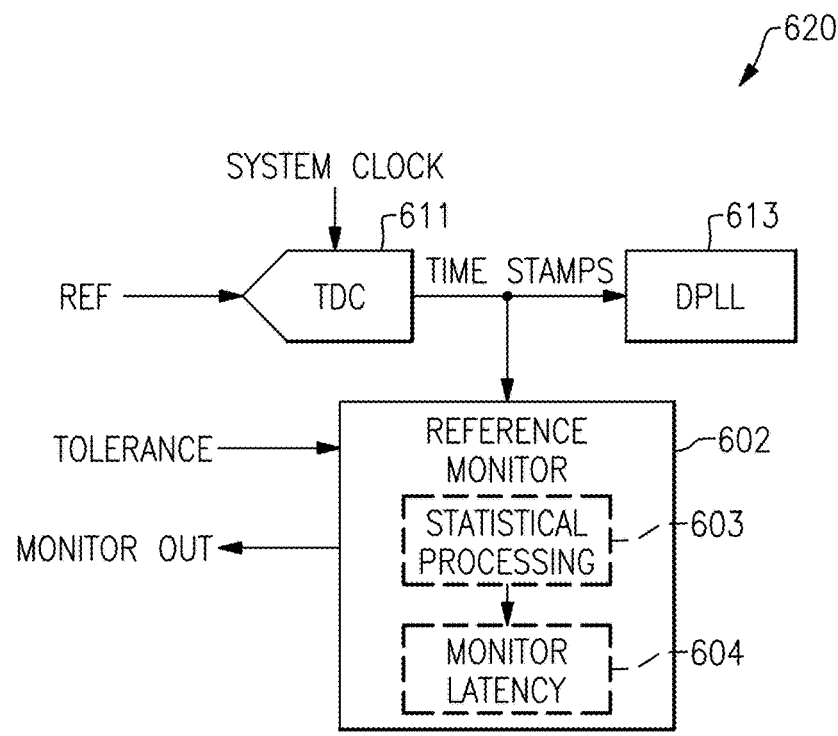
FIG. 22 is a schematic diagram of another embodiment of a reference monitoring system.

FIG. 22 is a schematic diagram of another embodiment of a reference monitoring system 620. The reference monitoring system 620 of FIG. 22 is similar to the reference monitoring system 610 of FIG. 21, except that the reference monitoring system 620 illustrates an implementation in which the clock measurement circuit is implemented as a TDC 611 that provides digital time stamps (TIME STAMPS) to a DPLL 613.

The TDC 611 provides time-to-digital conversion of the reference clock signal based on timing of the system clock signal. The reference monitor 602 processes the digital time stamps from the TDC 611 to determine whether or not the reference clock signal is reliable. Additionally, the DPLL 613 processes the digital time stamps to control phase locking.

There can be a trade-off between the accuracy of a reference monitor and a latency of the reference monitor. For example, the reference monitor can observe a reference clock signal over a relatively long window of time to determine the reliability of the reference clock signal with a relatively high confidence. In contrast, the reference monitor can observe the reference clock signal over a relatively short time window, but such an estimate may result in the reference monitor incorrectly determining whether or not the reference clock signal is within a desired tolerance.

In the illustrated embodiment, the reference monitor 602 observes the digital time stamps to determine whether or not the reference clock signal is within a tolerance. For example, a user can specify an expected periodicity and tolerance for error, for instance, 1 microsecond and 1 ppm, respectively. Additionally, the reference monitor 602 dynamically adjusts the length of the measurement window or latency 604 based on statistically processing the output of the TDC 611. Thus, the reference monitor 602 can be used to observe the period of output of the TDC 611, and to develop statistics of the period over multiple cycles of the reference clock signal. Additionally, a statistical model can be used to determine the length of observation.

The length of observation can be reduced when the statistics indicate that a measurement error arising from jitter is less than expected. Additionally, the length of observation can be increased when the statistics indicate that the measurement error arising from jitter is greater than expected. Thus, not only can the latency of a reference monitor be reduced, but the latency can be extended when an upper limit or bound on jitter error was incorrectly chosen. Accordingly, teachings herein can be used to provide robust reference monitoring, rather than being inoperable by an inaccurate upper bound to jitter error selected during design.

Figure 23:
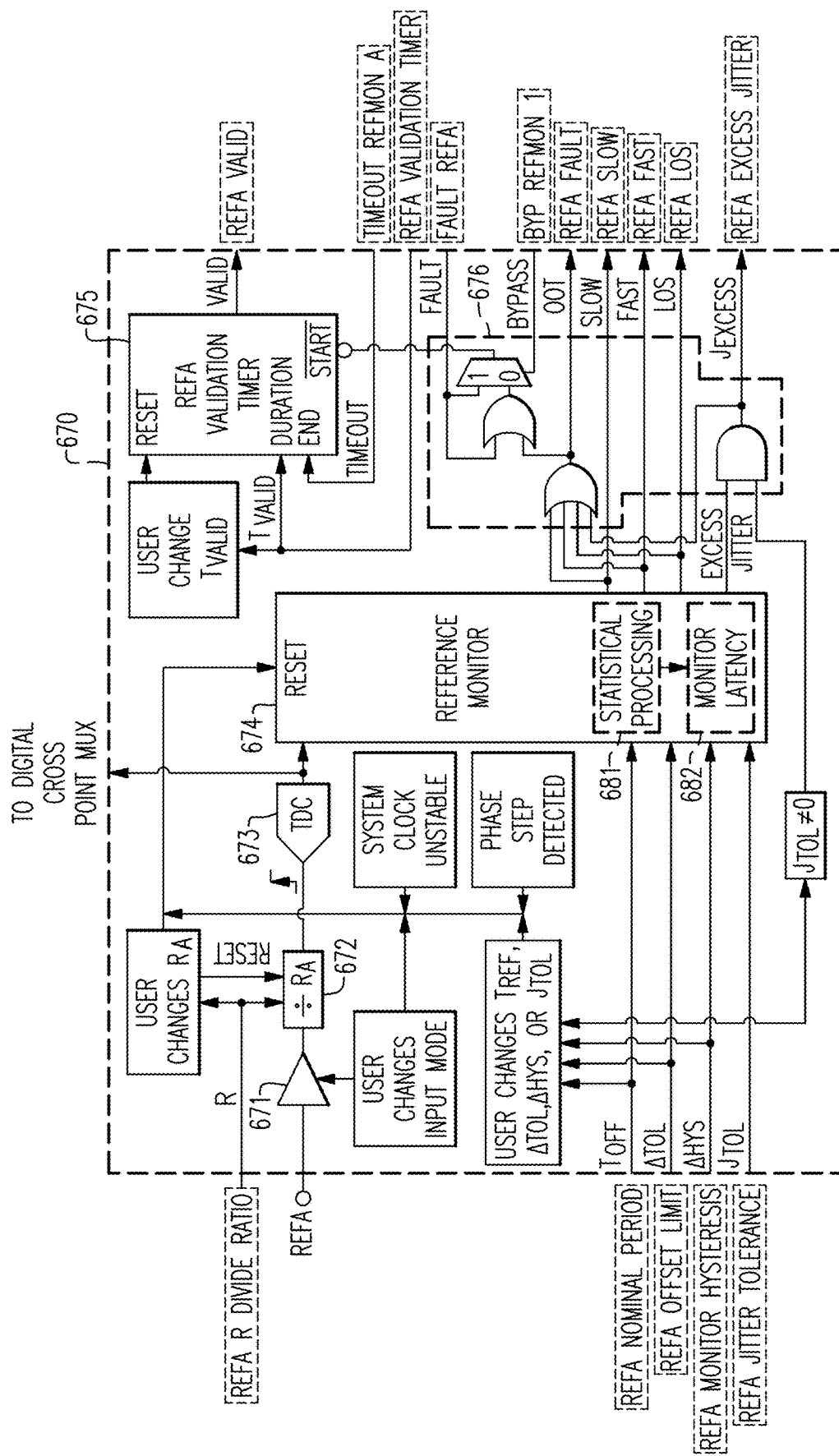
FIG. 23 is a schematic diagram of another embodiment of a reference monitoring system.

FIG. 23 is a schematic diagram of another embodiment of a reference monitoring system 670. The reference monitoring system 670 includes a reference clock buffer 671, a reference clock divider 672, a TDC 673, a reference monitor 674, a programmable validation timer 675, and output logic circuitry 676.

In the illustrated embodiment, the reference buffer 671 buffers the reference clock signal REFA. The buffered clock signal is provided to the reference clock divider 672, which operates to selectively divide the reference clock signal REFA by a divisor $R_A$. The TDC 673 processes the reference clock signal from the divider 672 to generate digital time stamps for the reference monitor 674. In one embodiment, the digital time stamps are also provided to a digital cross point multiplexer (for example, the digital cross point multiplexer 5 of FIG. 1). In another embodiment, the digital time stamps are obtained from the digital cross point multiplexer, rather than directly from the TDC 673.

The reference monitor 674 processes the digital time stamps to determine whether or not the reference clock signal REFA is within a desired tolerance as indicated by various tolerance parameters. In this example, the tolerance parameters include a nominal period $T_{REF}$, an offset limit ΔTOL relative to the nominal period, a hysteresis threshold ΔHYS, and a jitter limit $J_{TOL}$. However, other implementations of tolerance parameters are possible. In certain implementations, the tolerance parameters are provided via user input, for instance, via programming an interface, such a serial port.

In the illustrated embodiment, the reference monitor 674 generates output signals indicating whether or not the reference clock signal REFA is within the desired tolerance. Furthermore, the output logic circuitry 676 provides further logical processing to generate various status signals of the reference clock signal REFA.

In this example, the status signals include an excess jitter signal $J_{EXCESS}$ indicating whether or not the clock reference signal REFA is outside the jitter limit $J_{TOL}$, a loss of reference signal LOS indicating whether or not the clock reference signal REFA has been lost, a fast signal FAST indicating whether or not the clock reference signal REFA is outside of the offset limit ΔTOL for being too fast, and a slow signal SLOW indicating whether or not the clock reference signal REFA is outside of the offset limit ΔTOL for being too slow. The status signals further includes a fault signal OOT, which indicates when the reference clock signal REFA fails any of the tolerance parameters and thus is outside of the tolerance.

The status of the reference clock signal REFA (as indicated by one or more of the status signals) can be used to control a variety of functions of an IC, such as automatic reference switching. For instance, when the reference monitoring system 670 is implemented in the IC 40 of FIG. 1, the status of one or more reference clock signals received on the input reference pins (REFA, REFAA, REFB, REFBB) can be provided to the reference switching circuit 19 to control reference switching. The status of the reference clock signals can also be provided to one or more pins, for instance, via the serial port pins (SERIAL PORT) and/or multifunction pins (M PINS).

In the illustrated embodiment, the reference monitor 674 serves to monitor the reference clock signal REFA for both frequency accuracy and frequency stability. For example, the offset limit ΔTOL can indicate a maximum amount the period may deviate from the nominal period $T_{REF}$, and thus can be used to monitor for frequency accuracy. Furthermore, the jitter limit $J_{TOL}$ indicates a maximum amount of jitter (for instance, root mean square jitter), and thus can used to monitor for frequency stability.

Implementing the offset limit ΔTOL as a proportional value rather than an absolute offset can provide a number of advantages. For example, the reference monitor 682 can detect whether or not the reference clock signal REFA is in tolerance without needed to know the division value of the reference divider 672. Rather, the reference monitor 674 can continually observe the difference between successive time stamps and compare the statistics of those observations relative to the offset limit ΔTOL to determine the reliability of the reference signal, for instance, whether the reference is fast, slow, absent, and/or exhibits excessive jitter.

With continuing reference to FIG. 23, the reference monitor 674 further receives a ΔHYS signal, which is used by the reference monitor 674 after the reference clock signal REFA has faulted (is outside of the tolerance). For example, the ΔHYS signal can be used to determine a maximum amount the period may deviate from $T_{REF}$ for a faulted reference clock signal before indicating that the reference clock signal REFA is no longer faulted (within the tolerance).

Jitter introduces uncertainty in the time measurement between successive edges (for instance, successive rising edges) of the reference clock signal REFA. Furthermore, the internal time base (for example, the system clock signal) that the TDC 673 uses to make its measurements also introduces jitter uncertainty.

Both jitter sources compromise a monitor's ability to determine when the reference is truly in or out of tolerance. That is, jitter dilutes the confidence of the monitor's ability to make an accurate decision. Furthermore, a reference monitor may have no a priori knowledge of the magnitude or spectral distribution of the jitter present on a particular reference clock signal. Furthermore, jitter characteristics can vary over time.

The illustrated reference monitor 674 includes the statistical processing circuit 681, which processes the numeric time stamps from the TDC 673 to measure the reference period, including calculating statistics (mean and variance, in this embodiment) of the reference clock signal REFA as it observes period samples.

The statistical processing circuit 681 uses the calculated statistics to estimate the actual uncertainty of measurement arising from jitter. For example, by comparing the calculated variance with the offset limit ΔTOL, the statistical processing circuit 681 determines how many period samples are needed to arrive at a period estimate with sufficient confidence to decide whether or not the reference clock signal REFA is in or out of tolerance. Thus, the statistical processing circuit 681 dynamically varies the latency 682 of the monitor 674 based on the calculated statistics.

Implementing the reference monitor 674 with the statistical processing circuit 681 enables the reference monitor 674 to perform a high confidence period estimate of the reference clock signal REFA with reduced or near optimal minimum observation time. In certain implementations, the reference monitor 674 is implemented as a state machine.

In certain implementations, the statistical processing circuit 681 generates estimates of uncertainty over multiple time windows that are partially overlapping, thereby providing multiple simultaneous frequency measurements to further improve reaction time.

In one embodiment, rather than measuring the actual period of the reference clock signal REFA, the statistical processing circuit 681 estimates a deviation of the period relative to a scaled value of the nominal period $T_{REF}$ to a sufficiently high degree of confidence. Accordingly, certain statistical algorithms can have a confidence requirement integrated into its design.

Under certain conditions, a decision time of a marginally out of tolerance reference signal can vary with a ratio of the square root of the measured jitter variance to the offset limit ΔTOL. Thus, the smaller the variance of the measured jitter, the less averaging and the shorter the decision making time.

The statistical processing circuit 681 controls the latency 682 of the monitor 674 based on processing the time stamps to estimate the uncertainty of measurement. Thus, the latency or decision delay of the monitor 674 is not deterministic, but rather based on the value of the offset limit ΔTOL and the actual jitter present.

Although jitter plays a role in the decision time of the reference monitor 674 under normal operation, it has relatively little effect on the decision time when the reference period is much greater than the scaled TREF value (that is, TREF multiplied by the divisor of the divider 672) or when the reference signal disappears completely. For example, the reference monitor 674 operates on time stamps from the TDC 673, and thus a loss of the clock reference signal REFA stalls the reference monitor's period estimation process.

In the illustrated embodiment, the reference monitor 674 uses its local time base and the scaled TREF value to predict when the next edge will arrive. When the edge is relatively late (for instance, 15% beyond the prediction of the next reference input edge), the monitor 674 activates the loss of reference signal LOS. Implementing the monitor 674 in this manner aids in detecting when the reference clock signal REFA is no longer present.

In the illustrated embodiment, the reference monitor 674 generates the fault signal OOT indicating whether or not the reference clock signal REFA is within tolerance. After the reference clock signal REFA faults, the reference monitor 674 monitors the reference signal for an in tolerance condition. When the reference clock signal REFA returns to tolerance, the fault signal OOT is controlled to indicate a non-fault condition.

For certain applications, it is desirable for the reference clock signal REFA to be in a non-faulted condition for a period of time before the reference clock signal REFA is considered to be usable or valid. To accommodate such applications, the reference monitor 674 includes the programmable validation timer 675.

For example, the programmable validation timer 675 can start in response to the reference monitor 674 transitioning the fault signal OOP from a faulted state to a non-faulted state. Thereafter, the timer 675 counts down, and activates the valid signal VALID to indicate that the reference is available for use in response to expiration of the timer. In this example, the programmable validation timer 675 receives the timer validation signal $T_{VALID}$ indicated a count-down period of the timer 675. The value of $T_{VALID}$ can be provided by the user in whole or in part; augmentation of this value can be included to accommodate variation in the monitor's detection latency. In the illustrated embodiment, a user also can force a start condition via a fault signal FAULT and a bypass signal BYPASS.

In the illustrated embodiment, the programmable validation timer 675 stops counting down whenever the reference status becomes faulted (as indicated by the fault signal OOT). A subsequent start event results in the timer 675 reinitiating a count down from the programmed value of the timer validation signal programmable. Thus, in the example, the reference clock signal REFA does not attain valid status unless the reference clock signal REFA remains in tolerance for the full duration of the validation timer.

The illustrated timer 675 further receives the timeout signal TIMEOUT, which can be used to force the timer 675 to end its count. In this manner, if a faulted reference has returned to a non-faulted state and is awaiting validation, the user can override the timer, if desired, thereby bringing the reference clock signal to valid status.

Precision Timing Distribution and Recovery

Timing can be distributed within an electronic system by way of transition edges of a reference signal, such as a level shifts of voltage or current, or pulses of light.

However, since the edges can occur at any point in the continuum of time, such timing information is inherently analog. Although a wide variety of information in an electronic system is represented digitally and is able to benefit from fast and/or dense digital data transfer techniques, timing remains stubbornly analog.

Analog-to-digital converters (ADCs) provide a method to represent voltages or currents as ratios of well-defined quantities, the Volt and Amp. Not only are the magnitude of these values relatively easy to approximate locally, they have easy to represent zero values. Time and the second are more difficult to meter and there is no universally accepted, locally available, zero.

Two converters can be said to agree if their local meters, of whatever measurement unit, do not differ by more than a specified number of minimum fractional units, or least significant bits (LSBs). The greater the dynamic range, or number of significant bits in the conversion result, the more difficult it is for two converters to agree. For example, 8-bit converters can be made to agree with relative ease, 16-bit converters may require careful matching and trim to agree, beyond that, more exotic techniques may be needed.

In certain implementations herein, timing of transitions of a reference signal is digitized using a time-to-digital converter (TDC). For example, the TDC can generate digital time stamps representing time instances at which transitions (for instance, rising and/or falling edges) of the reference signal occur.

Certain TDCs may have a dynamic range with a resolution of 1 picosecond and full-scale of 1 microsecond to 1 millisecond or more, for instance, 20-30+ bits. Even in the presence of a convenient local time meter, obtaining agreement between such TDCs can be challenging.

Crystal oscillators or other autonomous frequency generators can be used as a local time meter. However, crystal oscillators can be of insufficient accuracy for many applications. For example, typical references are accurate to tens of parts per million (ppm) or worse, which can correspond to less than 17 bits of resolution. Furthermore, instantaneous accuracy varies substantially with environmental factors, such as temperature.

To overcome such limitations, an electronic system can operate without local reference dependency and share a common reference between all devices exchanging TDC samples. Regardless of the absolute accuracy and stability of the common reference, as long as all devices share the same impairments, they can agree on TDC values, although specific applications may have bounds on absolute accuracy.

In certain implementations herein, source devices provide destination devices with TDC time stamps. Additionally, the source devices are implemented with a format conversion circuit for interpreting digital time stamps consistently throughout the system.

Certain applications operate with timing achieved using both frequency information (periods of signals) and phase information. Sharing both frequency and phase information requires a common sense of zero time. Unlike other physical quantities, zero time may be defined cyclically, like January 1st, midnight, or the start of every hour. By providing both frequency and phase information, timing information can be unambiguously interpreted, for instance, when represented relative to the prior or next zero.

When timing information is transmitted between a sender and receiver there is a delay between the composition of the message and the comprehension of that message. In order for the message to be understood unambiguously, the zero value to which the message is relative should be known. If the cyclic duration between zeros is much longer than the longest transmission delay (uncertainty), the correct zero can be properly determined.

In certain implementations, a fixed transmission delay can be characterized and accounted for. For example, consider a message sent with the time X units prior to zero. If this message is received shortly before a zero, it can be assumed that the zero referred to by the message is the next zero. However, if the message is received shortly after a zero, it can be determined that the message referred to that zero which just passed. Any other inferences for zero would imply a transmission delay greater than, or approaching, the cyclic period of zeros.

A specific timing event on a shared timing meter reference can be designated as zero, therefore allowing it to be a complete timing reference. When the periodicity of the reference is much lower than the message transmission delays, then every event can be designated as zero. However, there are many practical considerations which make this configuration unrealistic. Unfortunately, any reference rate faster than the message propagation delay cannot use (unidirectional) messaging alone to designate which subset of events represent zero. Zero events can be indicated via a parallel analog timing signal or by embedding indicator data within the timing reference signal itself.

With a shared timing meter reference, intervals between timing events can be shared within a system. With a complete timing reference, individual timing events can be shared. Which timing information is shared and thus the relative complexity of the timing solution can be based on application.

Techniques for distributing and utilizing a shared timing reference, both with and without zero synchronization, are described in greater detail herein. In certain implementations, electronic systems that are capable of conveying both frequency and phase timing information are provided. Furthermore, provided herein are algorithms and applications that can be built on top of such systems.

Figure 24:
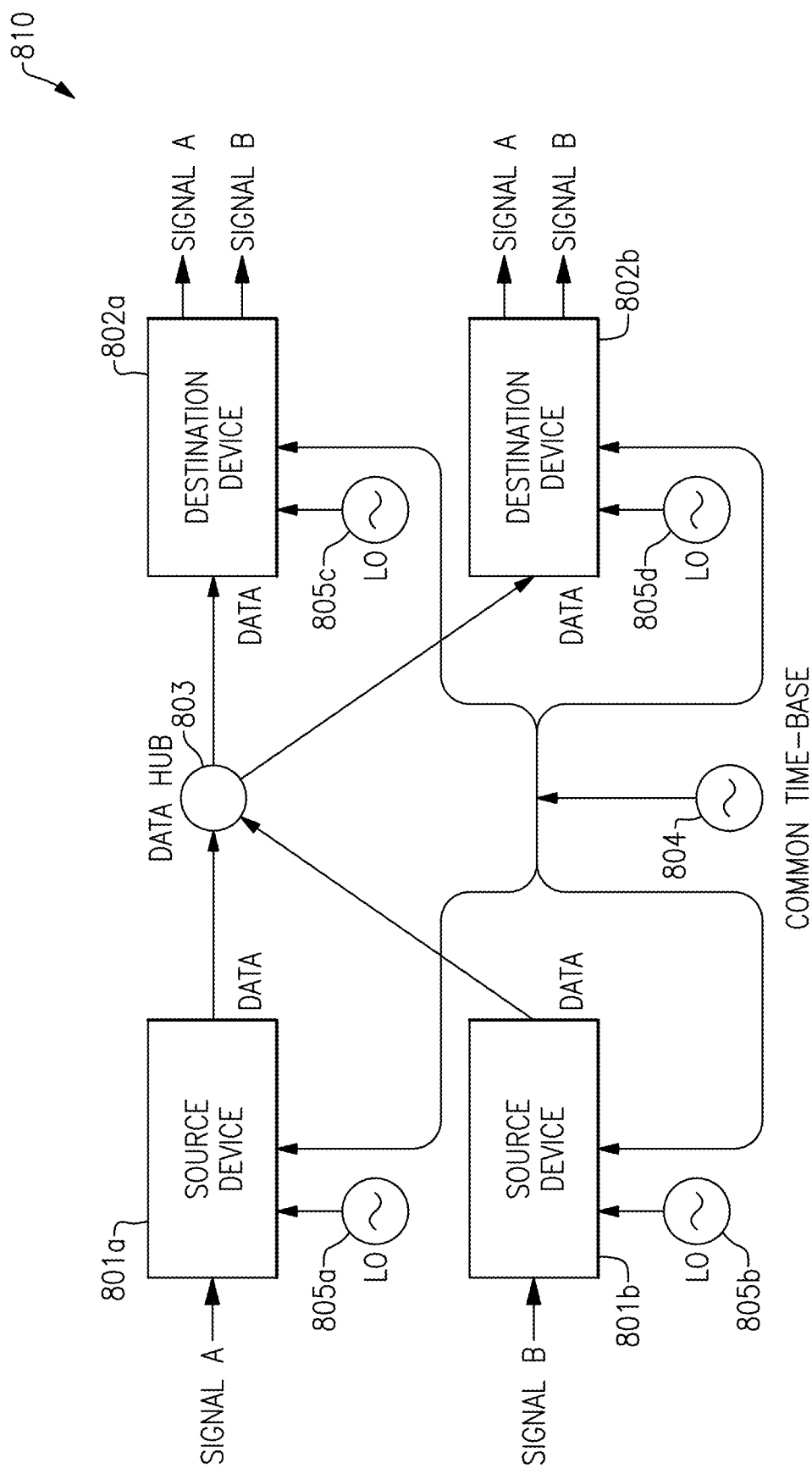
FIG. 24 is a schematic diagram of an electronic system according to another embodiment.

FIG. 24 is a schematic diagram of an electronic system 810 according to another embodiment. The electronic system 810 includes a first source device 801a, a second source device 801b, a first destination device 802a, a second destination device 802b, a data hub 803, a common timebase 804, and local oscillators (LOs) 805a-805d.

The first source device 801a receives a first signal (signal A), a common clock signal from the common time base 804, and a first local clock signal from the LO 805a, which are used to transmit data indicating timing of the signal A over the data hub 803. Additionally, the second source device 801b receives a second signal (signal B), the common clock signal from the common time base 804, and a second local clock signal from the LO 805b, which are used to transmit data indicating timing of the signal B over the data hub 803. Although an example with two source devices is shown, more or fewer source devices can be included.

As shown in FIG. 24, the first destination device 802a receives data from the data hub 803, the common clock signal from the common time base 804, and a third local clock signal from the LO 805c, which are used to recover signal A and/or signal B with proper timing. Additionally, the second destination device 802b receives data from the data hub 803, the common clock signal from the common time base 804, and a fourth local clock signal from the LO 805d, which are used to recover signal A and/or signal B with proper timing.

The electronic system 810 can be used to digitally distribute a periodic timing signal, either physical or logical, from one point in the system 810 to another point in the system 810 where it is regenerated, either logically or physically. The regenerated or recovered signal possesses the precise average frequency of the original and may also replicate its phase to within a certain accuracy.

The system 810 allows for the sharing of digital timing information across distributed devices. An application of the system 810 is to replicate qualities of a periodic signal (frequency and optionally phase) from one point to one or more additional points by means of digital data transfer rather than analog signal transfer.

For example, utilizing analog signaling, network equipment chassis, timing cards, and line cards are designed with knowledge of the chassis size (maximum number of line cards). Backplane connectors vary based on the maximum number of ingress/egress ports per card. With analog signaling, these systems can be made less sensitive to the total size and port count of the chassis, but at the expense of functionality.

In contrast, physical data connections (lanes) are much more flexible and efficient than physical clock signals due to packetized multiplexing, carrier detect multiple access (CDMA), error detection and correction, and/or scalable throughput rate. Migrating timing information from clock signals to data lanes has clear advantages in scalability.

Sending the signal information requires continually capturing timing information about the source signal and encapsulating that data in a message transmitted to the receiver. Timing for a physical signal can be captured, for instance, via a TDC, while logical (non-physical) signal event timing may be determined in a variety of ways. The timing information may be for all events, i.e. all rising and falling edges of the signal waveform, a regular subset of events, i.e. only the rising edges or only every Nth rising edge, or an irregular subset of events.

When timing information of an irregular subset of events is provided, additional information can be sent along with the message which identifies the subset, which may be explicit or implicit (inferred contextually). In one example, the sender may indicate how many intermediate events were skipped, or, if the nominal period is known with sufficient accuracy, the receiver may be able to infer the number of skipped events. In another example, each event can be serialized with an incrementing value such that the difference between identifiers indicates the number of events, thereby providing limited loss of messages to occur between the sender and receiver without damaging the integrity of the sequence. Other information about the events may also be included, such as identifying a specialized subset.

Regeneration of periodic analog timing signals can be performed in a variety of ways, such as by delay or phase lock loops (DLLs or PLLs), or a combination thereof. For digital timing signals, the digital equivalent of these loops can be used (DDLLs or DPLLs). The output of either digital loop can be logical or physical. Both loops can use digital phase detectors (DPDs) to determine the error vector between the source signal and the regenerated signal.

In certain implementations, the source signal is the digital timing data received from the remote source and the regenerated signal is represented by a time stamp produced by the local logical or physical clock output. The error vector is used to control (often indirectly) either a delay element or oscillator which produces the regenerated signal.

To determine the correct error vector, the DPD identifies which source event corresponds to which regenerated event (because of the feedback loop configuration, the regenerated event is also referred to as a feedback event). Due to latency and loss of events (either by design or due to data loss), particularly in the source path, the DPD should account for these effects when determining correspondence between source and feedback events.

Stability of PLLs (including DPLLs) can be achieved by updating the error vector frequently. Interpolation of lost (or late) source data is one technique which can keep the error vector current. If the timing references between the source and receiver are not zero aligned to each other, source events and feedback events will have an arbitrary average offset. Because the offset is arbitrary, it is not possible for the recovered timing to necessarily share the same phase as the source. The offset (which can be estimated from the initial difference) should be recorded and nulled from all subsequent error vectors. Even with shared zero alignment between devices, the accuracy of the zero alignment will directly affect the quality of the regenerated phase. Note that even when zero alignment is present, the receiver may choose to null any offset.

Figure 25:
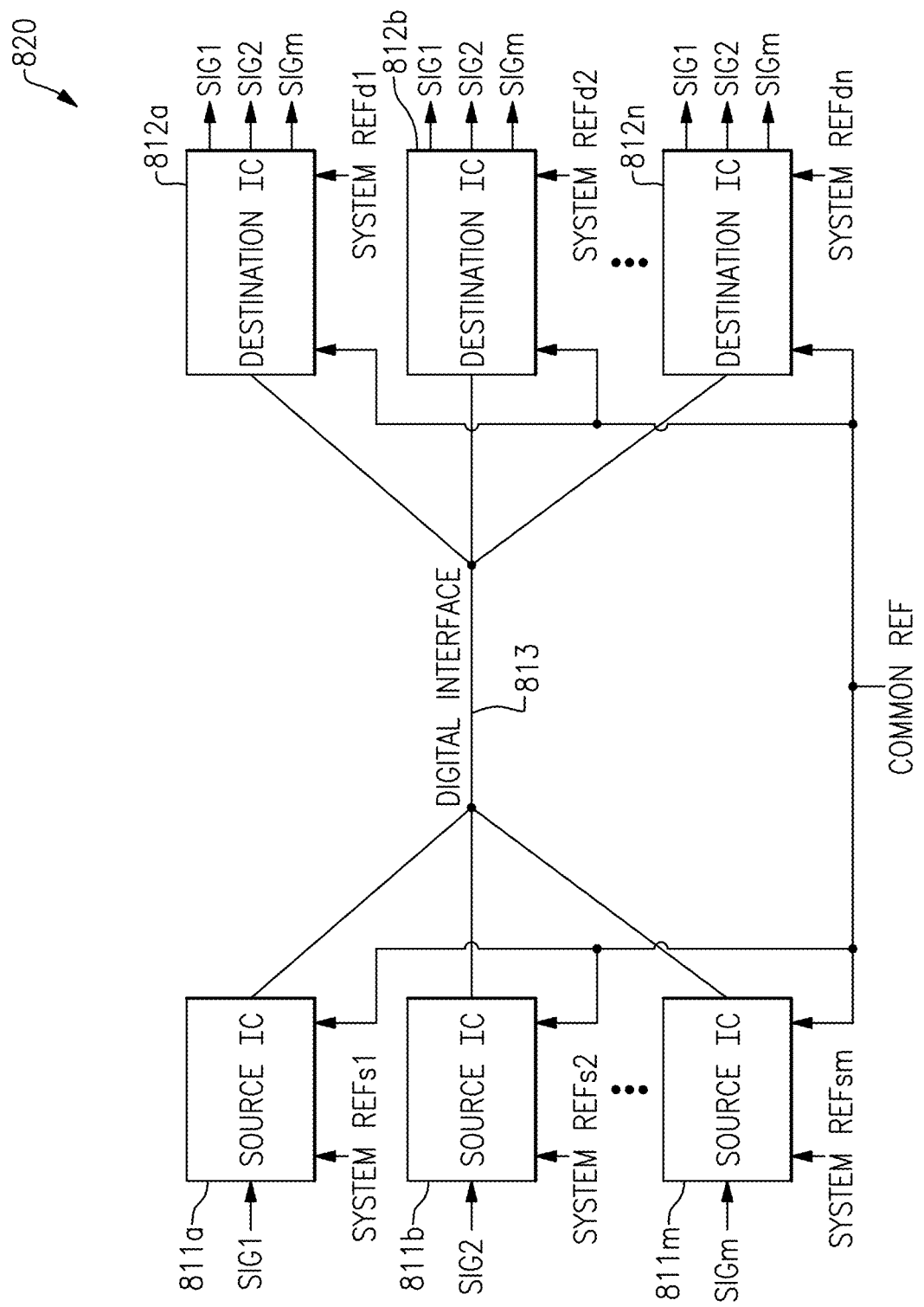
FIG. 25 is a schematic diagram of an electronic system according to another embodiment.

FIG. 25 is a schematic diagram of an electronic system 820 according to another embodiment. The electronic system 820 includes source ICs 811a, 811b, . . . 811m and destination ICs 812a, 812b, . . . 812n, which are electrically connected to one another via a digital interface 813.

The source ICs 811a, 811b, . . . 811m receive signals SIG1, SIG2, . . . SIGm, respectively. Although an example with three source ICs is shown, and number of source ICs can be included (for instance, one source IC, two source ICs, or three or more source ICs). Furthermore, although each source IC is shown as receiving one signal for distribution over the digital interface 813, one or more of the source ICs can distribute multiple signals.

As shown in FIG. 25, the source ICs 811a, 811b, . . . 811m each receive a common reference signal (COMMON REF). The source ICs 811a, 811b, . . . 811m also receive separate system reference signals SYSTEM REFs1, SYSTEM REFs2 . . . . SYSTEM REFsm, respectively. Although an example with separate system reference signals is shown, one or more of the source ICs 811a, 811b, . . . 811m can share a system reference signal. Furthermore, in certain implementations, the common reference signal is used as the system reference signal for of one or more of the source ICs.

The source ICs 811a, 811b, . . . 811m operate to generate digital representations of the timing of the signals SIG1, SIG2, . . . SIGm using the common reference signal and the local system reference signals SYSTEM REFs1, SYSTEM REFs2, . . . SYSTEM REFsm, respectively. The digital timing representations of the signals SIG1, SIG2, . . . SIGm are provided over the digital interface 813 to the destination ICs 812a, 812b, . . . 812n.

The digital interface 813 can be implemented in a wide variety of ways. In one example, the digital interface 813 is an Ethernet interface. In another example, the digital interface 813 is an I²C, SPI, or other serial interface. Although various examples of the digital interface 813 have been provided, any suitable digital interface can be used, including both standardized and custom interfaces.

The destination ICs 812a, 812b, . . . 812n receive the digital representations of the timing of the signals SIG1, SIG2, . . . SIGm, via the digital interface 813. Although an example with three destination ICs is shown, and number of destination ICs can be included (for instance, one destination IC, two destination ICs, or three or more destination ICs).

As shown in FIG. 25, the destination ICs 812a, 812b, . . . 812n each receive the common reference signal (COMMON REF) that is also common to the source ICs 811a, 811b, . . . 811m. The destination ICs 812a, 812b, . . . 812n also receive separate system reference signals SYSTEM REFd1, SYSTEM REFd2, . . . SYSTEM REFdn, respectively. Although an example with separate system reference signals is shown, one or more of the destination ICs 812a, 812b, . . . 812n can share a system reference signal. Furthermore, in certain implementations, the common reference signal is used as the system reference signal for of one or more of the destination ICs.

The destination ICs 812a, 812b, . . . 812n operate to recover one or more of the signals SIG1, SIG2, . . . SIGm based on the received digital timing representations, the common reference signal, and the local system reference signals SYSTEM REFd1, SYSTEM REFd2, . . . SYSTEM REFdn, respectively. Both frequency and phase of the signals SIG1, SIG2, . . . SIGm can be recovered.

Although each destination IC is shown as recovering each of the signals SIG1, SIG2, . . . SIGm, any combination of signals can be recovered as desired.

The electronic system 820 can be used to provide precise distribution of signals (including, but not limited to, clock signals) to multiple destination ICs. For example, in certain applications, tens or hundreds of clock signals can be digitally communicated to a large number of ICs using a digital bus.

Figure 26A:
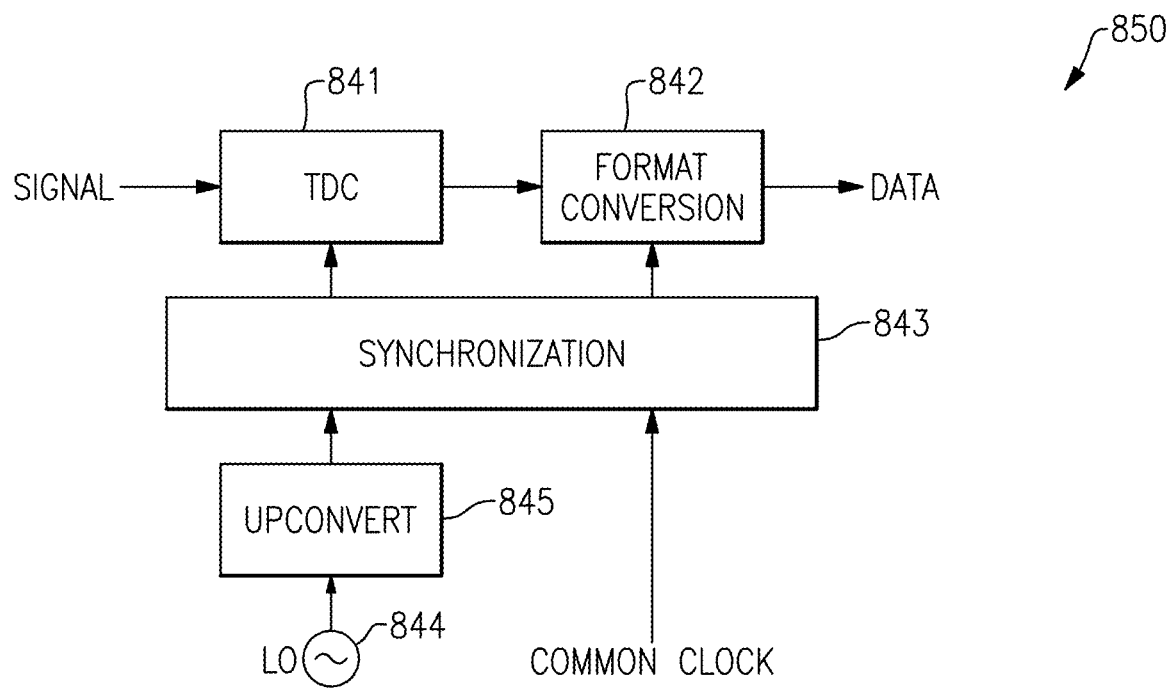
FIG. 26A is a schematic diagram of a source device according to one embodiment.

FIG. 26A is a schematic diagram of a source device 850 according to one embodiment. The source device 850 includes a TDC 841, a format conversion circuit 842, a synchronization circuit 843, an LO 844, and an upconvert circuit 845.

The upconvert circuit 845 provides frequency upconversion to a local oscillator signal received from the LO 844 to generate an upconverted clock signal for the synchronization circuit 843. The synchronization circuit 843 compares the upconverted clock signal to the common clock signal to control synchronization of the TDC 841 and the format conversion circuit 842.

The TDC 841 generates digital time stamps representing transition times of the input signal. The digital time stamps are processed by the format conversion circuit 842, which aids in converting the digital time stamps to a format suitable for a common interpretation of time stamps across multiple distributed destination devices.

Figure 26B:
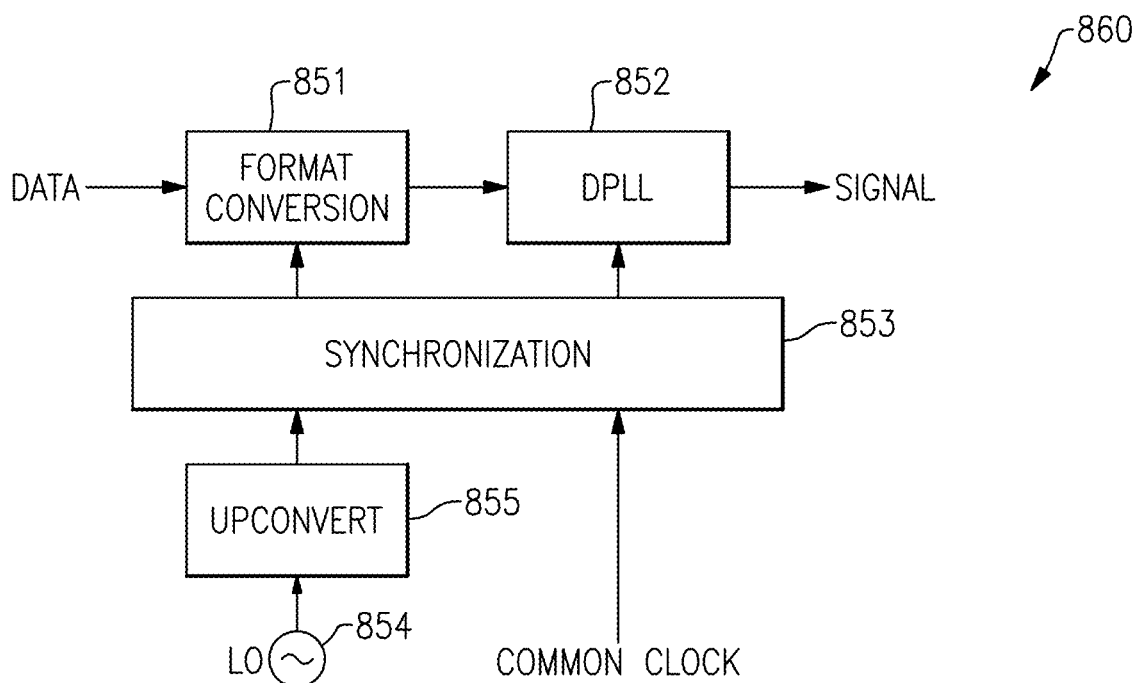
FIG. 26B is a schematic diagram of a destination device according to one embodiment.

FIG. 26B is a schematic diagram of a destination device 860 according to one embodiment. The destination device 860 includes a format conversion circuit 851, DPLL 852, a synchronization circuit 853, an LO 854, and an upconvert circuit 855.

The upconvert circuit 855 provides frequency upconversion to a local oscillator signal received from the LO 854 to generate an upconverted clock signal for the synchronization circuit 853. The synchronization circuit 853 compares the upconverted clock signal to the common clock signal to control synchronization of the format conversion circuit 851 and DPLL 852.

The format conversion circuit 851 interprets a time reference point of the received digital time stamps, and converts the digital time stamps to a format suitable for processing by the DPLL 852. The DPLL 852 processes the digital time stamps to recover the signal.

In certain implementations, the DPLL 852 recovers both the frequency and phase of the signal received by a corresponding source device. When such a signal is distributed to multiple destination devices (for instance, tens or hundreds of destination devices) each destination device can recover the original signal with precise frequency and accurate phase.

Figure 27A:
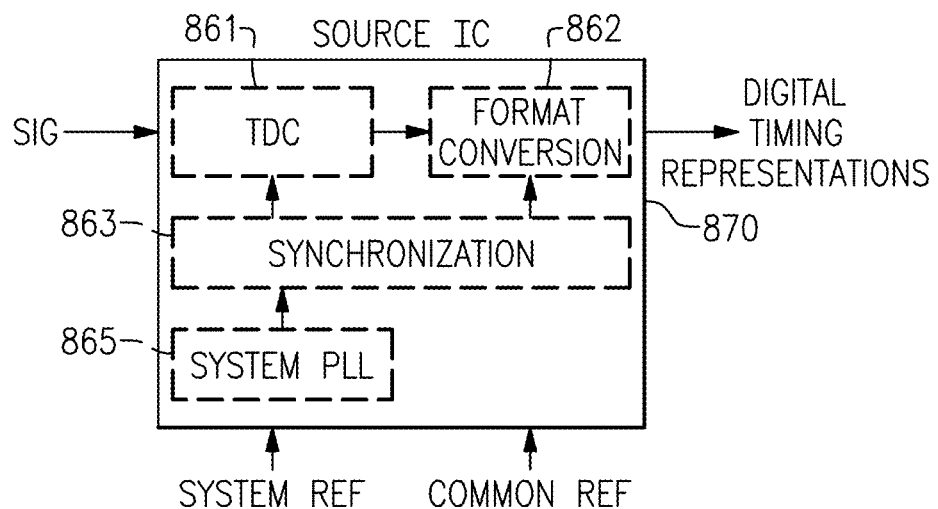
FIG. 27A is a schematic diagram of a source IC according to one embodiment.

FIG. 27A is a schematic diagram of a source IC 870 according to one embodiment. The source IC 870 includes a TDC 861, a format conversion circuit 862, a synchronization circuit 863, and a system PLL 865, which serves as an upconvert circuit. The source IC 870 includes pins for receiving a signal (SIG), a system reference signal (SYSTEM REF), and a common reference signal (COMMON REF), and for sending the digital timing representations of the signal.

The system PLL 865 generates a system clock signal for the synchronization circuit 863. The synchronization circuit 863 compares the system clock signal to the common reference signal to control synchronization of the TDC 861 and the format conversion circuit 862.

Figure 27B:
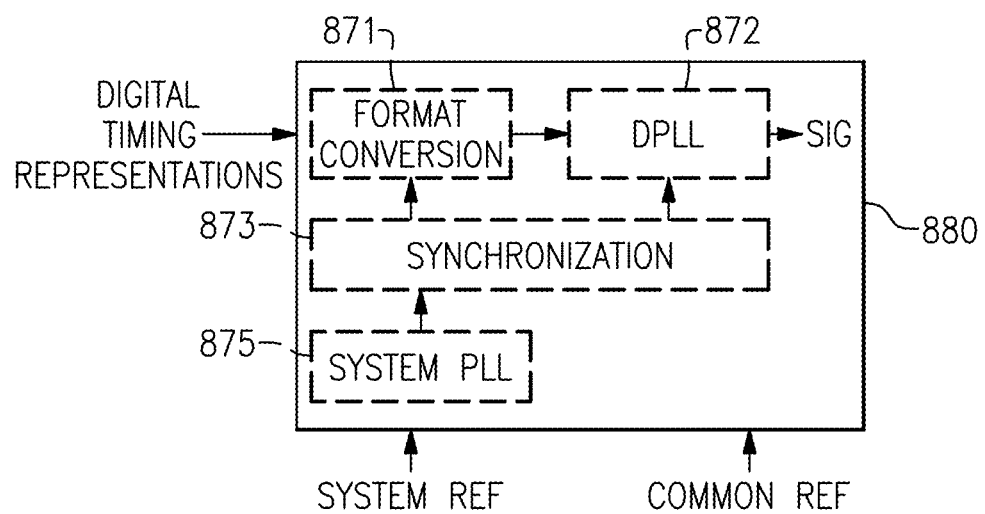
FIG. 27B is a schematic diagram of a destination IC according to one embodiment.

FIG. 27B is a schematic diagram of a destination IC 880 according to one embodiment. The destination IC 880 includes a format conversion circuit 871, a DPLL 872, a synchronization circuit 873, and a system PLL 875, which serves as an upconvert circuit. The destination IC 880 includes pins for receiving digital timing representations from a source IC (for instance, from the source IC 870 of FIG. 27A), a system reference signal (SYSTEM REF), and a common reference signal (COMMON REF), which is common to the source IC. The digital timing representations are received from the source IC over a digital interface.

The system PLL 875 generates a system clock signal for the synchronization circuit 873. The synchronization circuit 873 compares the system clock signal to the common reference signal to control synchronization of the format conversion circuit 871 and the DPLL 872. As shown in FIG. 27B, the DPLL 872 recovers the signal, including frequency and phase information. The signal can be used locally and/or distributed off-chip.

Figure 28:
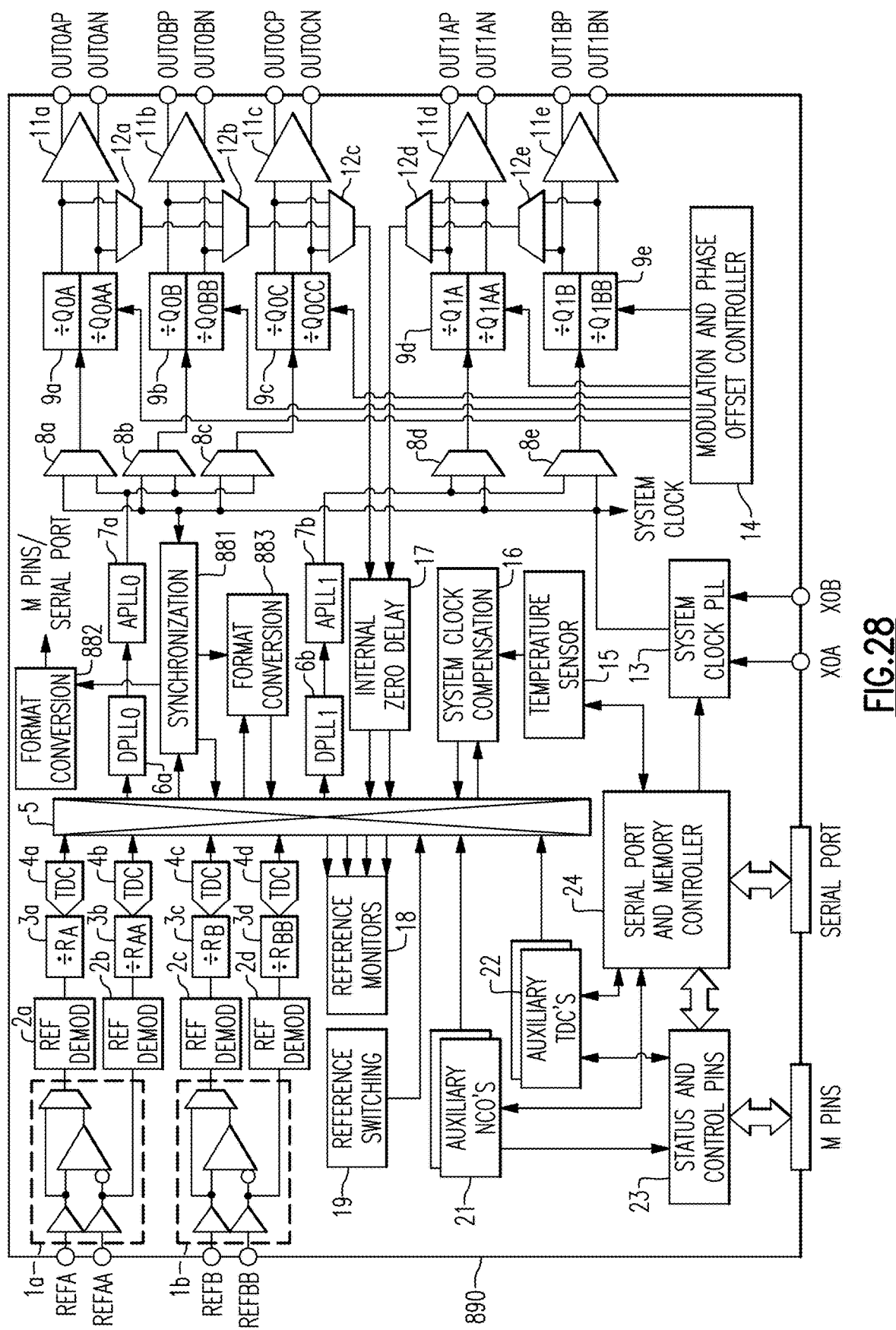
FIG. 28 is a schematic diagram of another embodiment of a clock synchronization and frequency translation IC.

FIG. 28 is a schematic diagram of another embodiment of a clock synchronization and frequency translation IC 890. The IC 890 illustrated one example of an IC that can be used as either a source IC or destination IC, thereby enhancing flexibility. For example, a first instantiation of the IC 890 can be used as a source IC and a second instantiation of the IC 890 can be used as a destination IC.

The IC 890 of FIG. 28 is similar to the IC 40 of FIG. 1, except that the IC 890 further includes a synchronization circuit 881, a source format conversion circuit 882, and a destination format conversion circuit 883.

When operating as the source IC, time stamps of an input signal can be generated in a variety of ways, such as by using any of TDCs 4a-4d and/or auxiliary TDCs 22. The source format conversion circuit 882 formats the time stamps to generate data suitable for transmission off-chip in a variety of ways, such as via the serial port, the multifunction pins (M PINS), and/or separate pins. Additionally, the system clock PLL 13 serves as an upconvert circuit for a system reference signal received on the system reference pins (XOA, XOB). In certain implementations, the synchronization circuit 881 provides source synchronization. However, other configurations are possible. For example, in another implementation, the synchronization circuit 881 is omitted in favor of providing synchronization using the system clock compensation circuit 16 operating in the closed loop configuration shown in FIG. 10 in combination with the auxiliary NCOs 21.

When operating as the destination IC, digital timing representations can be received via the IC's pins, for instance using the serial port, the status and control pins 23 interface (for instance, by way of a university asynchronous receiver-transmitter or UART), and/or suitable digital interface. The digital timing representations are processed by the destination formation conversion circuit 883, and thereafter provided to a DPLL (for instance DPLL 6a, DPLL 6b, and/or a dedicated DPLL) to recover the signal. Additionally, the system clock PLL 13 serves as an upconvert circuit for a system reference signal received on the system reference pins (XOA, XOB), and the synchronization circuit 881 can be used to provide synchronization.

Extrapolation of Timing Events for Enhanced PLL Update Rate

A PLL generates an output signal (also referred to as a generated signal or synthesized signal), which is provided by feedback to the PLL's phase detector. The phase detector compares the feedback signal to a reference signal to generate a phase error signal used for controlling the PLL's loop and generation of the output signal. At the PLL's phase detector, the feedback signal is the coherent with the reference signal.

The feedback signal and/or the reference signal can be decimated (for instance, by integer frequency division) prior to reaching the phase detector. The pre-decimated signals are coherent frequency multiples, and thus are coherent once per cycle of the respective decimated signal. Additionally, the reference signal and the generated signal are also coherent multiples, though their periodicity corresponds to the least common multiple (LCM) of the two decimation ratios after common divisors are removed.

A PLL can decimate or divide signals for a variety reasons. In a first example, decimation is used to provide frequency translation. For instance, since coherence of the reference signal and the feedback signal is enforced at the phase detector, decimation permits the generated signal frequency to be a rational multiple of the reference input frequency. In a second example, decimation is used to operate components of the PLL within their operating frequency ranges.

Clock signals can be characterized by the timing of one of the edge events (rising or falling), designated as phase 0 (zero), and thus their phase is observable periodically. Thus, a PLL operates as a sampled control system.

PLLs often operate at a relatively low update rate to preserve valuable timing information. However, operation at higher update rates can have benefits to certain performance metrics of the PLL. For example, when clocks are decimated, the timing information present on the skipped events is lost, depriving the PLL of information.

In certain embodiments herein, a PLL is implemented to retain the timing from some or all of the lost timing events arising from decimation.

Implementing the PLL in this manner can enhance certain performance metrics of the PLL. For example, in the reference signal path, it allows higher oversampling relative to the control loop bandwidth and thus better filtering of certain types of phase jitter. Furthermore, in both the reference signal path and the feedback signal path, operating with a higher rate can provide a quicker indication of shifts in frequencies. For example, operating with higher update rate in the reference path provides the PLL's loop with better tracking capability, while operating higher update rate in the feedback path permits wider control loop bandwidths and consequently faster acquisition.

In certain configurations, a reference signal of the PLL has a carrier frequency and an embedded subcarrier frequency. Providing a reference signal with an embedded subcarrier can provide a number of advantages. For example, the carrier frequency can convey desired frequency information while the subcarrier frequency can convey desired phase information. Additionally, the PLL recovers timing events associated with the sub-carrier, and processes the timing events to extrapolate timing events at a frequency greater than the subcarrier frequency.

In applications in which the subset of events selected by decimation is non-arbitrary, such as when using a reference signal with an embedded sub-carrier, intermediate stages of decimation can be used to meet the maximum operating rates of PLL components. When the timing of the non-arbitrary subset is conveyed to the phase detector, the PLL will align to these events. For example, one or more decimations stages can be synchronized to pass special events associated with a sub-carrier that provides phase information.

Figure 29:
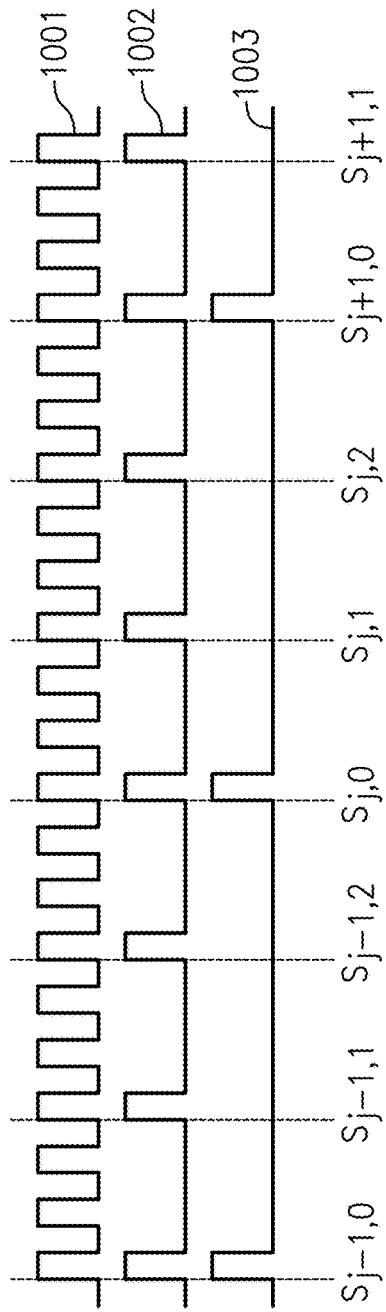
FIG. 29 is a schematically depicts various timing event sequences for one example of intermediate decimation.

FIG. 29 is a schematically depicts various timing event sequences for one example of intermediate decimation. A first signal 1001, a second signal 1002, and a third signal 1003 are depicted. In one embodiment, the first signal 1001 represents an input reference signal that includes an embedded sub-carrier including phase information, the second signal 1002 represents the input reference signal after an intermediate decimation, and the third signal 1003 represents the embedded sub-carrier after final decimation of the first signal 1009. Although FIG. 29 illustrates an intermediate decimation by 3 and a total decimation by 9, any suitable values of decimation can be used.

Various timing event sequences are shown in FIG. 29, including a sequence $\{S_{j,k}\}$ of timing events resulting from intermediate decimation, and a sequence $\{S_{j,0}\}$ of timing events resulting from final decimation. The entire sequence $\{S_{j,k}\}$ represents a coherent frequency multiple.

As shown in FIG. 29, there is a regular relationship between the sequence $\{S_{j,k}\}$ of timing events and the sequence $\{S_{j,0}\}$ of timing events. In particular, the sequence $\{S_{j,0}\}$ is a sub-set of the entire sequence $\{S_{j,k}\}$.

Accordingly, any event from the superset or full sequence $\{S_{j,k}\}$ can be used to estimate one or more elements from the subset or sub-sequence $\{S_{j,k}\}$. For example, using an estimated and/or ideal periodicity of the superset events, $\Delta T$, the value of $S_{j,0}$ can be approximated as $S_{j,k} - k \cdot \Delta T$.

In certain implementations, $\Delta T$ can be estimated from the sequence itself, such as by using a time-variant estimation that does not adversely impact the PLL's dynamic response.

Within the implementation of a DPLL, each element of this sequence can be represented by a digital time stamp indicating the timing of the event. Accordingly, in certain implementations, the sequence $\{S_{j,k}\}$ of timing events is digitally represented using time stamps from a TDC.

Figure 30A:
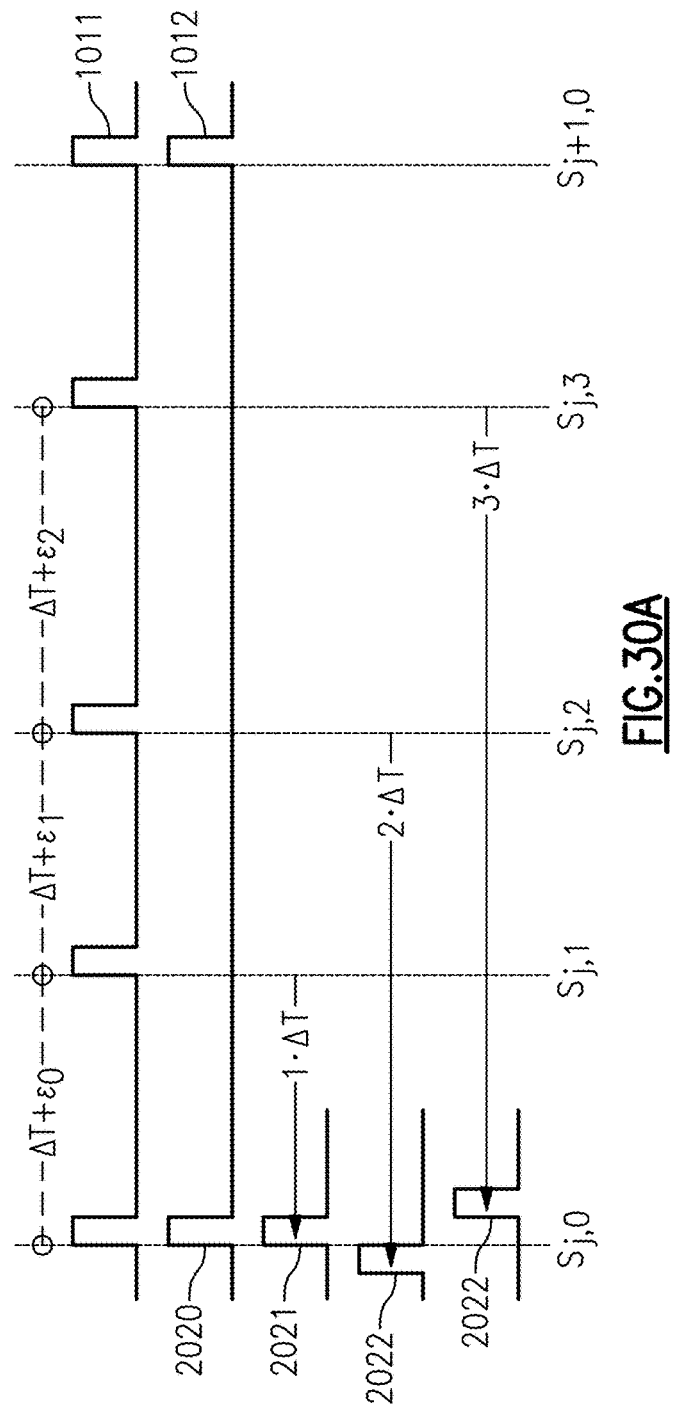
FIG. 30A illustrates one example of a backward extrapolation of a sequence of timing events.

FIG. 30A illustrates one example of a backward extrapolation of a sequence of timing events. As shown in FIG. 30A, a signal 1011 is illustrated along with a decimated signal 1012 corresponding to the signal 1011 divided by a factor of four. Although decimation by 4 is illustrated, any suitable values of decimation can be used.

As shown in FIG. 30A, the timing events of the sequence $\{S_{j,k}\}$ are not ideally spaced. Rather, the timing events include timing information $\varepsilon_0, \varepsilon_1, \ldots \varepsilon_2$ indicating phase jitter and/or instantaneous frequency of the signal 1011.

Various timing events have been extrapolated to relative to an edge of the decimated signal 1012, corresponding to timing information at $S_{j,0}$. Additionally, a first extrapolated timing event 2021 has been used to estimate the value of $S_{j,0}$ as $S_{j,1} - 1 \cdot \Delta T$, a second extrapolated timing event 2022 has been used to estimate the value of $S_{j,0}$ as $S_{j,2} - 2 \cdot \Delta T$, and a third extrapolated timing event 2023 has been used to estimate the value of $S_{j,0}$ as $S_{j,3} - 3 \cdot \Delta T$.

The extrapolated timing events 2021-2023 include timing information $\varepsilon_0, \varepsilon_1, \ldots \varepsilon_2$ indicating phase jitter and/or instantaneous frequency of the signal 1011. If the goal were to accurately estimate that specific event $S_{j,0}$, the timing information $\varepsilon_0, \varepsilon_1, \ldots \varepsilon_2$ may not be useful.

However, providing information about the phase jitter and/or instantaneous frequency of the signal 1011 to a phase detector of a PLL allows the phase detector to measure coherence of the reference and generated signal sequences at the lowest rate of timing, but with information that is updated at a higher rate.

Figure 30B:
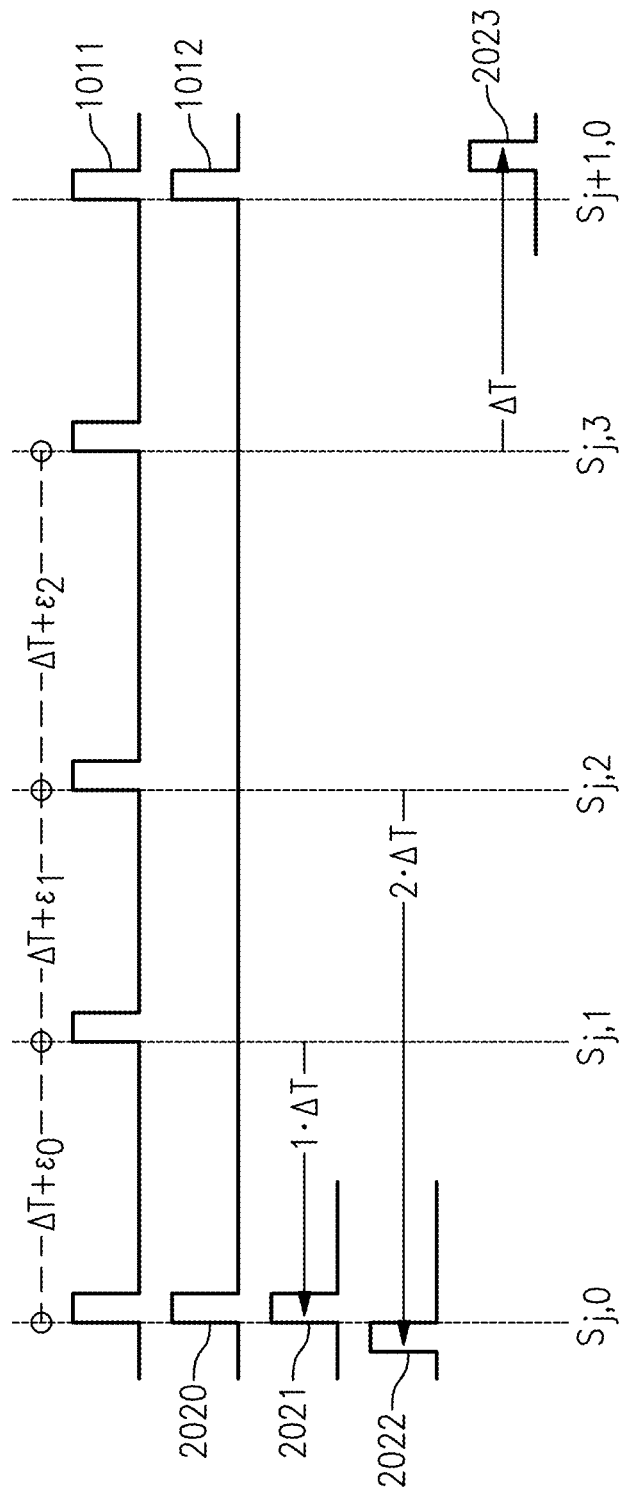
FIG. 30B illustrates one example of forward and backward extrapolation of a sequence of timing events.

FIG. 30B illustrates one example of forward and backward extrapolation of a sequence of timing events. FIG. 30B is similar to FIG. 30A, except that FIG. 30B illustrates forward extrapolation of the third extrapolated timing event 2023 to the event $S_{j,1}$ rather than to backward extrapolation to the event $S_{j,1}$.

Timing events can be extrapolated in a wide variety of ways, including, but not limited to backward extrapolation, forward extrapolation, or a combination thereof.

Figure 31:
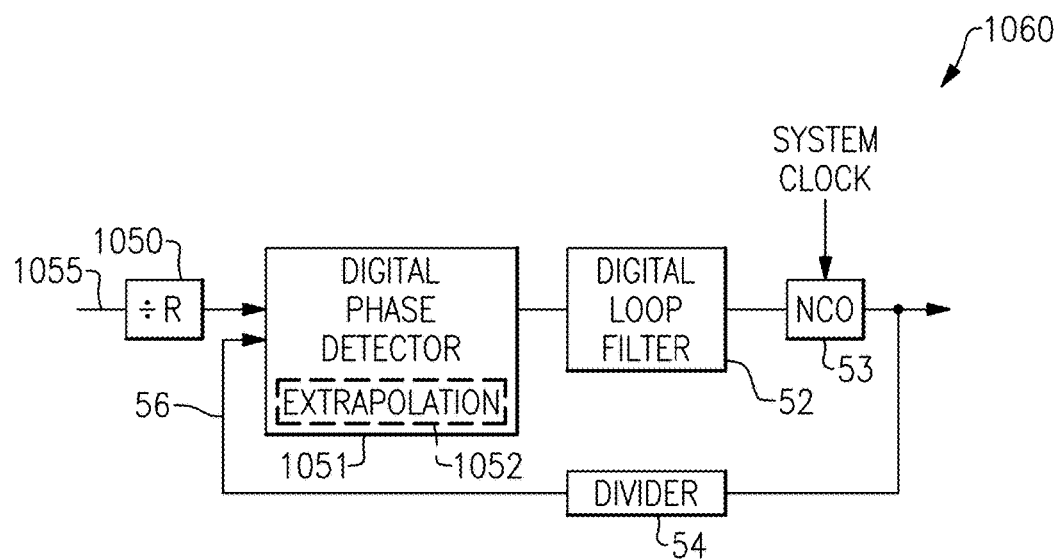
FIG. 31 is a schematic diagram of a DPLL according to another embodiment.

FIG. 31 is a schematic diagram of a DPLL 1060 according to another embodiment. The DPLL 1060 of FIG. 31 is similar to the DPLL 50 of FIG. 2A, except that the DPLL 1060 of FIG. 31 includes an input divider 1050 and a digital phase detector 1051. The digital phase detector 1051 includes an extrapolation circuit 1052, which generates one or more extrapolated timing events to enhance the operation of the DPLL 1060. The extrapolated timing events can be for the reference signal and/or feedback signal.

In one embodiment, the input signal 1055 can include a carrier frequency (for instance, 10 MHz) and an embedded subcarrier frequency (for instance, 1 kHz). Additionally, the carrier frequency provides frequency information and the subcarrier frequency provides phase information. Although the input divider 1050 could have a division value selected to recover only the subcarrier (for instance, R=10,000 for a 10 MHz carrier and 1 kHz sub-carrier), running the DPLL with a relatively low update rate can provide poor performance.

In contrast, the illustrated DPLL 1060 includes the extrapolation circuit 1052 for generating extrapolated timing events. For example, the extrapolated events can include extrapolations of timing events of the carrier frequency used to estimate the sub-carrier events. Since the extrapolated timing events include phase jitter and/or instantaneous frequency information, the operation of the DPLL 1060 is enhanced. The extrapolated timing events can be for the reference signal and/or feedback signal.

For example, providing information about the phase jitter and/or instantaneous frequency of the signal 1055 to the phase detector 1051 allows measurement of coherence of the signal sequences at a desired low rate of timing, but with information that is updated at a higher rate.

Figure 32:
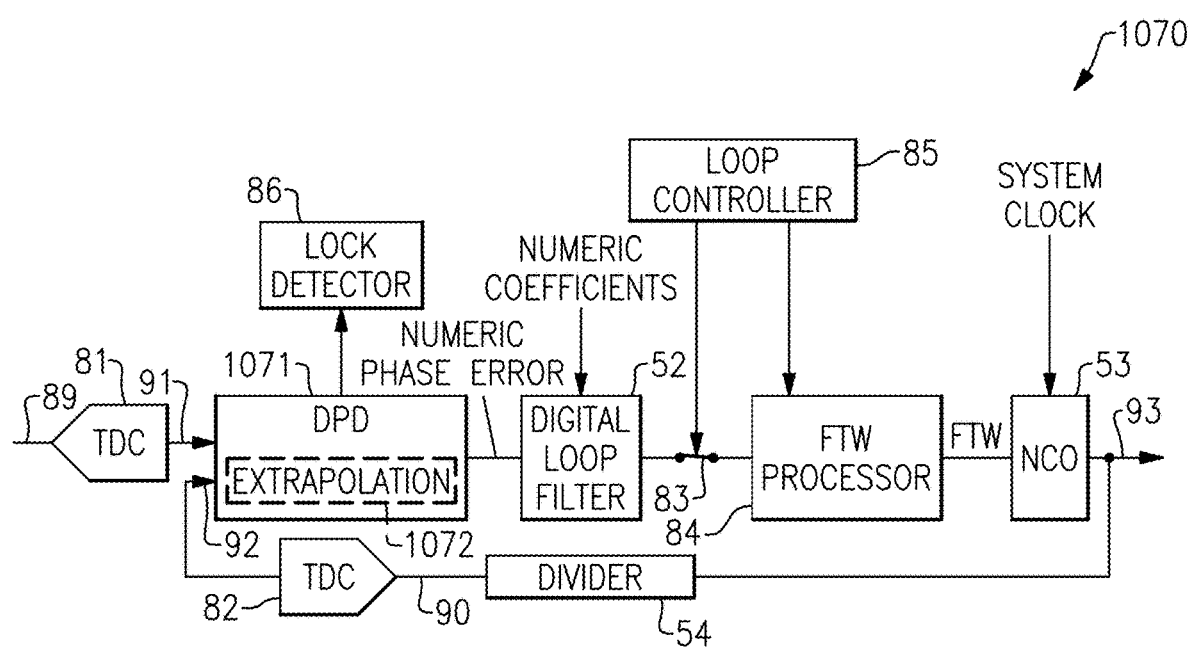
FIG. 32 is a schematic diagram of a DPLL according to another embodiment.

FIG. 32 is a schematic diagram of a DPLL 1070 according to another embodiment. The DPLL 1070 of FIG. 32 is similar to the DPLL 80 of FIG. 3, except that the DPLL 1070 of FIG. 32 includes a digital phase detector 1071 including an extrapolation circuit 1071. The extrapolation circuit 1071 generates one or more extrapolated timing events in accordance with the teachings herein. The extrapolated timing events can be for the reference signal and/or feedback signal.

Figure 33:
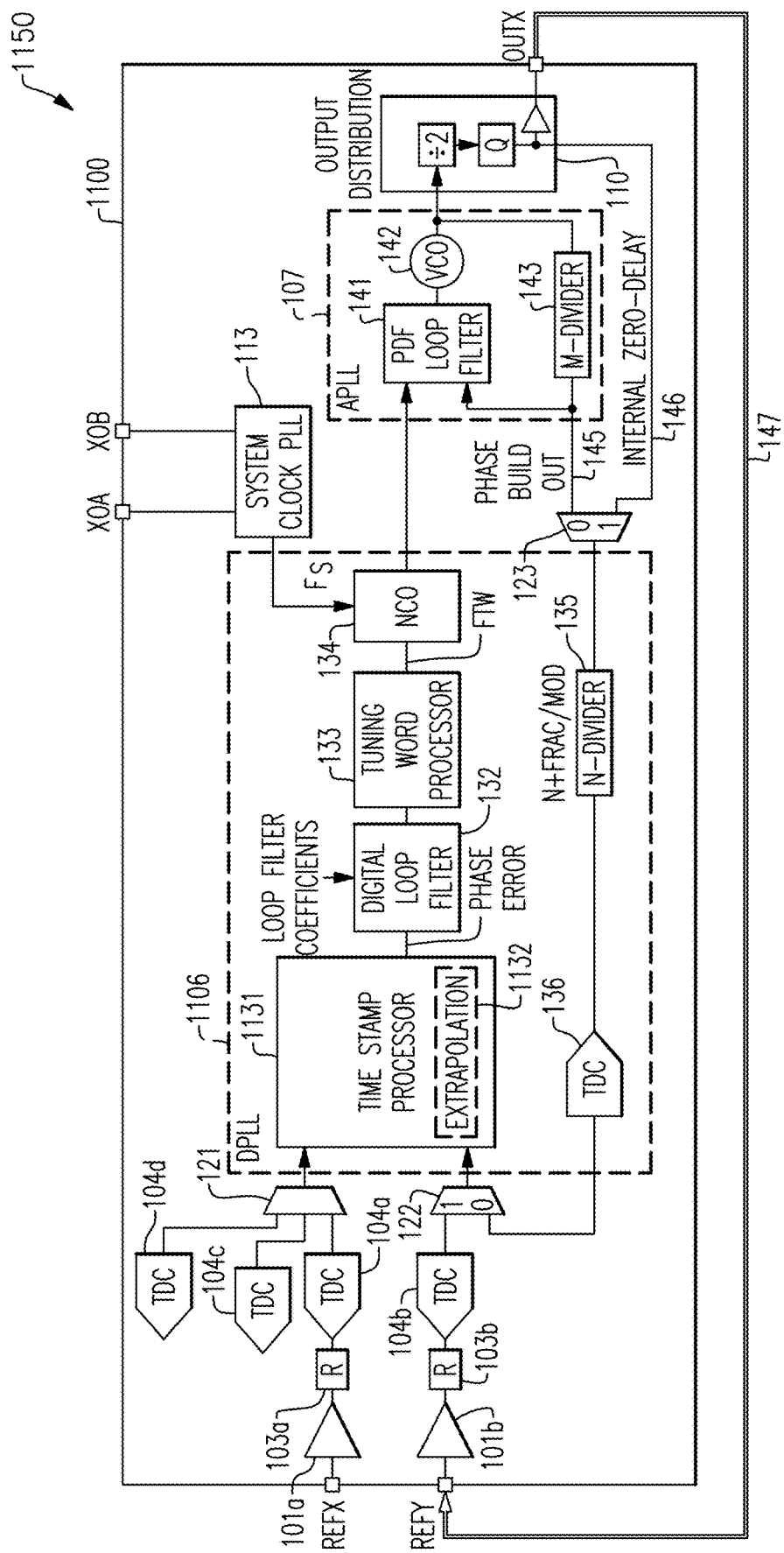
FIG. 33 is a schematic diagram of another implementation of frequency translation loops for a clock synchronization and frequency translation IC.

FIG. 33 is a schematic diagram of another implementation of frequency translation loops 1150 for a clock synchronization and frequency translation IC. The frequency translation loops 1150 of FIG. 33 are similar to the frequency translation loops 150 of FIG. 5, except that FIG. 33 illustrates an embodiment including a DPLL 1106 that includes a time stamp processor 1131 implemented with an extrapolation circuit 1132. The extrapolation circuit 1132 generates one or more extrapolated timing events in accordance with the teachings herein. The extrapolated timing events can be for the reference signal and/or feedback signal.

Fast Locking PLLs for Low Loop Bandwidth

A locking time of certain PLLs can be relatively long. For example, a zero-delay PLL with low loop bandwidth and a low frequency reference signal can have a prohibitively long locking time.

A PLL's locking time is based on a transient response of the closed loop negative feedback system of the PLL. For example, the duration of the locking transient can depend on local oscillator frequency offset relative to the reference frequency, initial phase offset present at the phase detector, and low pass filter parameters (for instance, bandwidth and phase margin).

In certain implementations herein, a PLL is locked in multiple steps, including an initial frequency acquisition step in which the PLL is operated open loop. By executing an algorithm to separate and correct for individual components of the PLL in a suitable order, the duration of the locking transient can be reduced or minimized.

Frequency is the derivative of phase. In certain implementations, a frequency offset between the reference input clock signal and the PLL's local oscillator (i.e. feedback clock signal) is minimized by a frequency offset correction. In certain implementations, the frequency offset correction is executed without inclusion of an initial phase offset parameter.

A DPLL can provide suitable processing for facilitating implementation of such an algorithm.

For example, an adjustment to a digital phase detector (DPD) is one example of a suitable mechanism for correcting phase offset. For instance, the initial phase offset can be quantified and subtracted from DPD outputs to the loop filter. Implementing the adjustment in this manner provides a number of advantages, such as injecting only the residual phase offsets generated by the frequency mismatch between DPD inputs. Once the DPLL achieves steady state, the loop filter output is stored in memory for use as the initial loop filter output in the subsequent algorithm step.

In implementations in which the DPLL implements feedback frequency tuning via a numerically controlled oscillator (NCO), consecutive phase measurements of each DPD input can be differentiated and compared. Additionally, the result of the comparison can be used to calculate the fractional frequency error (for instance, normalize frequency error) of the feedback source relative to the reference input clock. The calculated fractional frequency error can then scale the current oscillator control value (including application of a control value versus frequency linearization transfer function) to produce a frequency correction value normalized to the NCO control word. Updating the active NCO control value with the summation of the previous control word and the frequency correction value provides relatively low instantaneous frequency offset of the DPLL's NCO output, yielding an initial feedback frequency for the subsequent algorithm step.

Performing the application of the correction factor to the active NCO control value in multiple steps with magnitude determined based on a programmable limit and the time duration between consecutive updates allows for the implementation of a controlled rate of change of the frequency transition. Implementing the DPLL in this manner provides enhanced performance for systems in which the output clock of the NCO is used externally to the device.

Once the frequency error has been reduced or minimized, the phase offset between the DPD's inputs is approximately constant and an offset correction may be implemented.

In certain implementations, phase correction is provided by physically synchronizing the dividers between the highest intermediate frequency synchronous to the DPLL's local oscillator and the DPD's feedback input using the DPD's reference input signal as the synchronization source. This can result in the first edge out of the synchronized dividers being phase aligned to the DPD's reference input signal within 1 UI of the frequency at the input of the first affected divider.

When it is desirable to limit the frequency deviation incurred as a function of the phase offset, the phase offset may be quantified and translated to a representation as the integration of the frequency deviation limit over a calculable time duration. This frequency offset can then be negated and applied to the feedback source for the calculated time duration to achieve the desired phase alignment without exceeding the frequency deviation limits.

Once the frequency and phase offsets between DPLL reference and feedback sources have been reduced or minimized, the DPLL is operated in closed loop operation to compensate for any error in the calculation of the aforementioned correction factors.

To minimize the duration of this correction stage, a bandwidth reduction algorithm can be implemented to begin loop acquisition at a much larger loop bandwidth and progressively decay versus time to a final operating bandwidth for steady state operation and adherence to system specifications.

Figure 34:
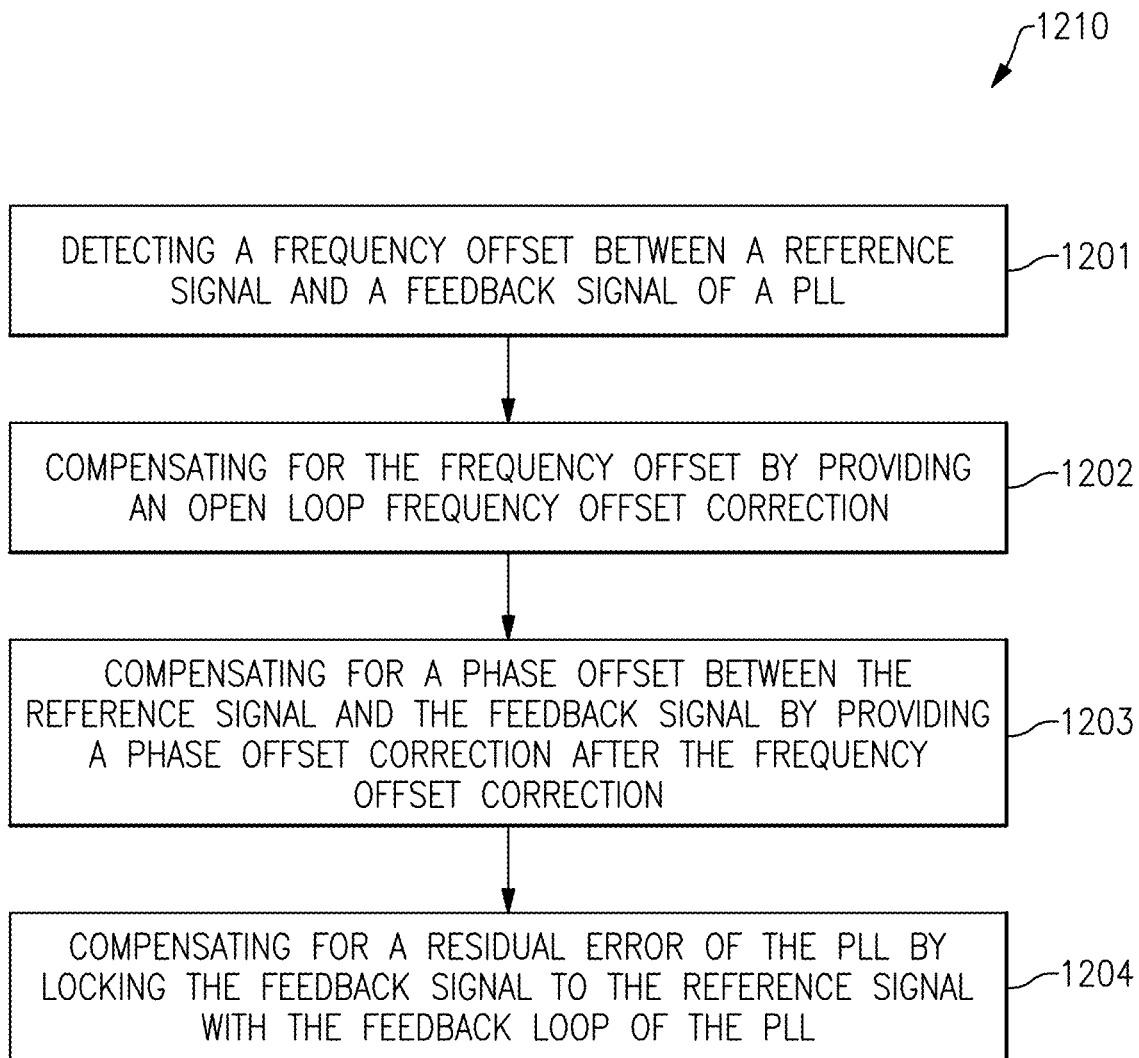
FIG. 34 is a method of phase and frequency locking according to one embodiment.

FIG. 34 is a method 1210 of phase and frequency locking according to one embodiment. The method 1210 can be implemented, for example, using any suitable PLL described herein.

The method starts at step 1201, where a frequency offset between a reference signal and a feedback signal of a PLL is detected. In one embodiment, the method is implemented in the clock synchronization and frequency translation IC 40 of FIG. 1.

The frequency offset can be detected in a variety of ways, including open loop or closed loop detection using any suitable frequency offset detection circuit. In one example, reference monitors (for instance, the reference monitors 18 of FIG. 1) are used to detect the frequency difference. In another example, the frequency offset is detected by subtracting an initial phase offset from an output of a digital phase detector, and detecting the frequency offset based on a residual phase offset of the digital phase detector. In yet another example, a derivative of successive phase measurements of the reference clock signal is compared to a derivate of successive phase measurements of the feedback clock signal.

The method 1210 continues to step 1202, in which the frequency offset of the PLL is compensated by providing an open loop frequency offset correction. Thus, the feedback loop of the PLL is opened or broken when provided the frequency offset correction. The frequency offset of the PLL can be compensated in a wide variety of ways. In one example, a loop filter output value is controlled to provide compensation. In another example, an NCO is adjusted based on normalizing a fractional frequency error by a control word of an NCO, and updating the NCO based on the normalized frequency error (for instance, updating the active NCO control value with the summation of the previous control word and the frequency correction value).

The PLL's loop can be opened and closed in a wide variety of ways, such as by using a loop controller (for instance, the loop controller 85 of FIG. 3). In certain implementations, the loop controller controls and/or coordinates the operations of step 1202.

In certain implementations, the frequency offset is gradually provided to limit change to an output frequency of the PLL.

The method continues to a step 1203, in which a phase offset between the reference signal and the feedback signal is compensated by providing a phase offset correction after the frequency offset correction. The phase offset correction can be provided in a variety of ways. In one example, a feedback divider of the PLL is synchronizing based on timing of the reference clock signal. For instance, a PLL's dividers can be physically synchronized to a highest intermediate frequency synchronous to the PLL's local oscillator and the phase detector's feedback input using the reference input signal as the synchronization source. Such a phase alignment can result in the first edge out of the synchronized dividers being phase aligned to the reference input signal within 1 UI of the frequency at the input of the first affected divider.

In certain implementations, the phase offset is compensated by gradually providing phase adjustment to limit an output frequency deviation of the PLL.

In certain implementations, the loop controller controls and/or coordinates the operations of step 1203.

In an ensuing step 1204, a residual error of the PLL is compensated by locking the feedback signal to the reference signal with the feedback loop of the PLL. Thus, the PLL's feedback loop is closed when correcting the residual error. In certain implementations, the loop bandwidth of the PLL is changed over time to enhance locking speed. For instance, a bandwidth reduction algorithm may be implemented to begin loop acquisition at a much larger loop bandwidth and progressively decay versus time to a final operating bandwidth for steady state operation and adherence to system specifications. The loop bandwidth can be changed in a variety of ways, such as by programming different numeric coefficients of a digital loop filter (for example, FIG. 2A).

In certain implementations, the loop controller controls and/or coordinates the operations of step 1204.

FIGS. 35A-35E illustrate various embodiments of DPLL circuitry for phase and frequency locking.

Figure 35A:
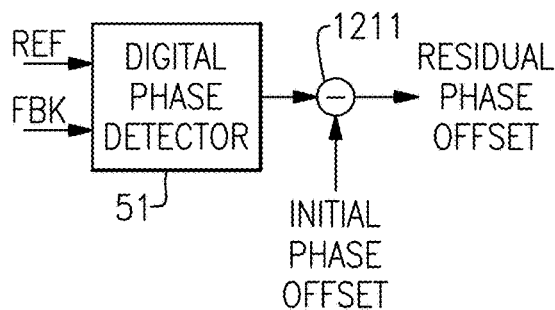
FIGS. 35A-35E illustrate various embodiments of DPLL circuitry for phase and frequency locking.

FIG. 35A illustrates a portion of a DPLL including a digital phase detector 51 and a subtraction circuit 1211. As shown in FIG. 35A, an initial phase offset is subtracted from the output of the digital phase detector 51.

Figure 35B:
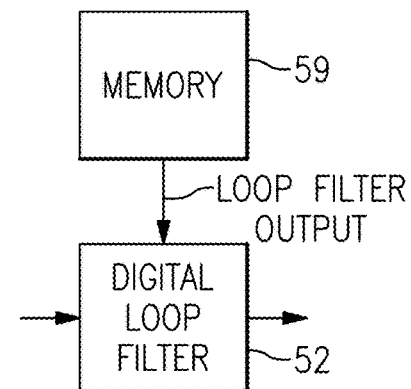

FIG. 35B illustrates a portion of a DPLL including a memory 59 and a digital loop filter 52. In certain implementations, a frequency offset correction is provided by loading a loop filter output value from the memory 59.

Figure 35C:
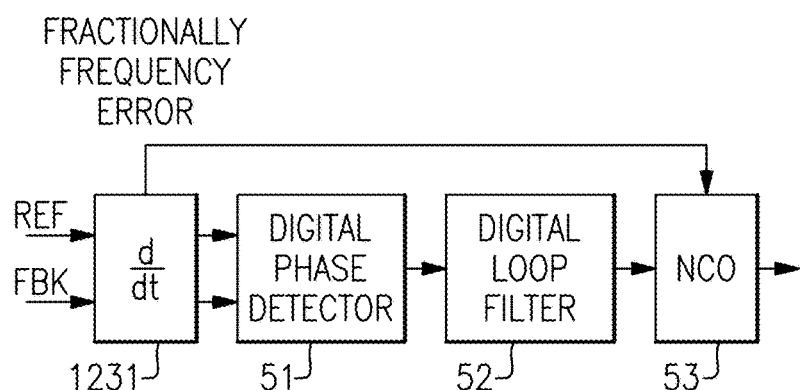

FIG. 35C illustrates a portion of a DPLL including a differentiation circuit 1231, a digital phase detector 51, a digital loop filter 52, and an NCO 53. In certain implementations, a frequency offset is detected by comparing a derivative of successive phase measurements of the reference clock signal to a derivate of successive phase measurements of the feedback clock signal. Additionally, a fractional frequency error is calculated based on the comparison, and the NCO adjusted based on the fractional frequency error. For example, fractional frequency error can be normalized to a control word of an NCO, and updated based on the normalized frequency error.

Figure 35D:
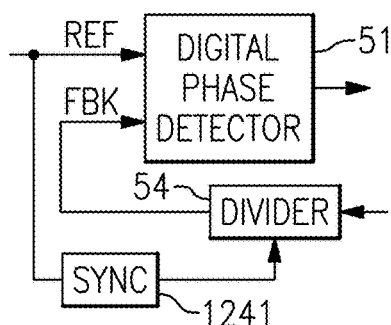

FIG. 35D illustrates a portion of a DPLL including a digital phase detector 51, a feedback divider 54, and a synchronization circuit 1241. In certain implementations, a phase offset is corrected by synchronizing the feedback divider 54 based on timing of the reference signal.

Figure 35E:
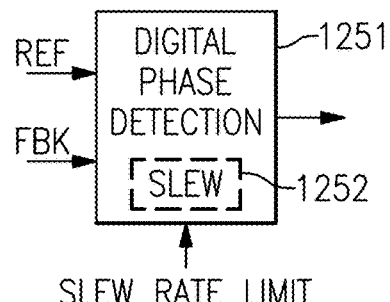
Figure 36A:
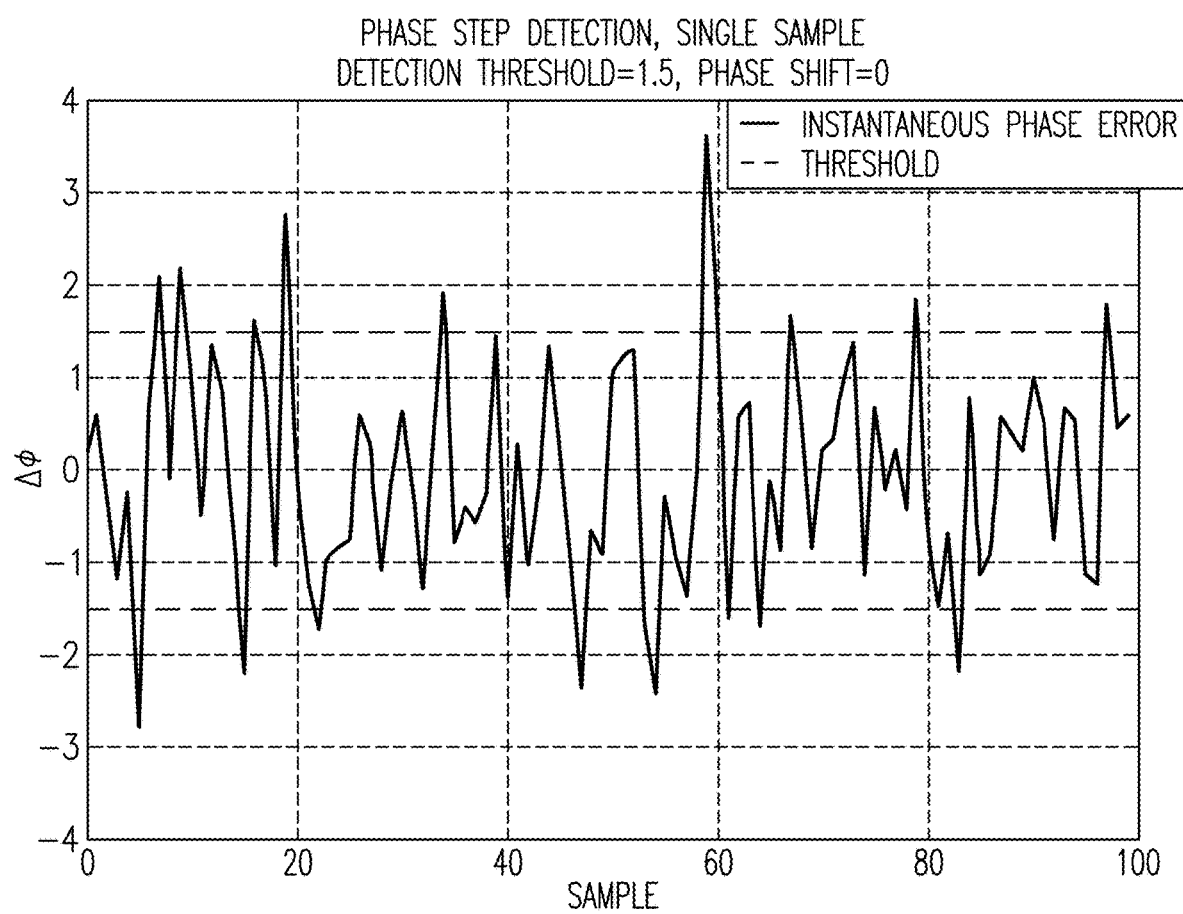
FIGS. 36A-36D are graphs of various example of phase step detection.
Figure 36B:
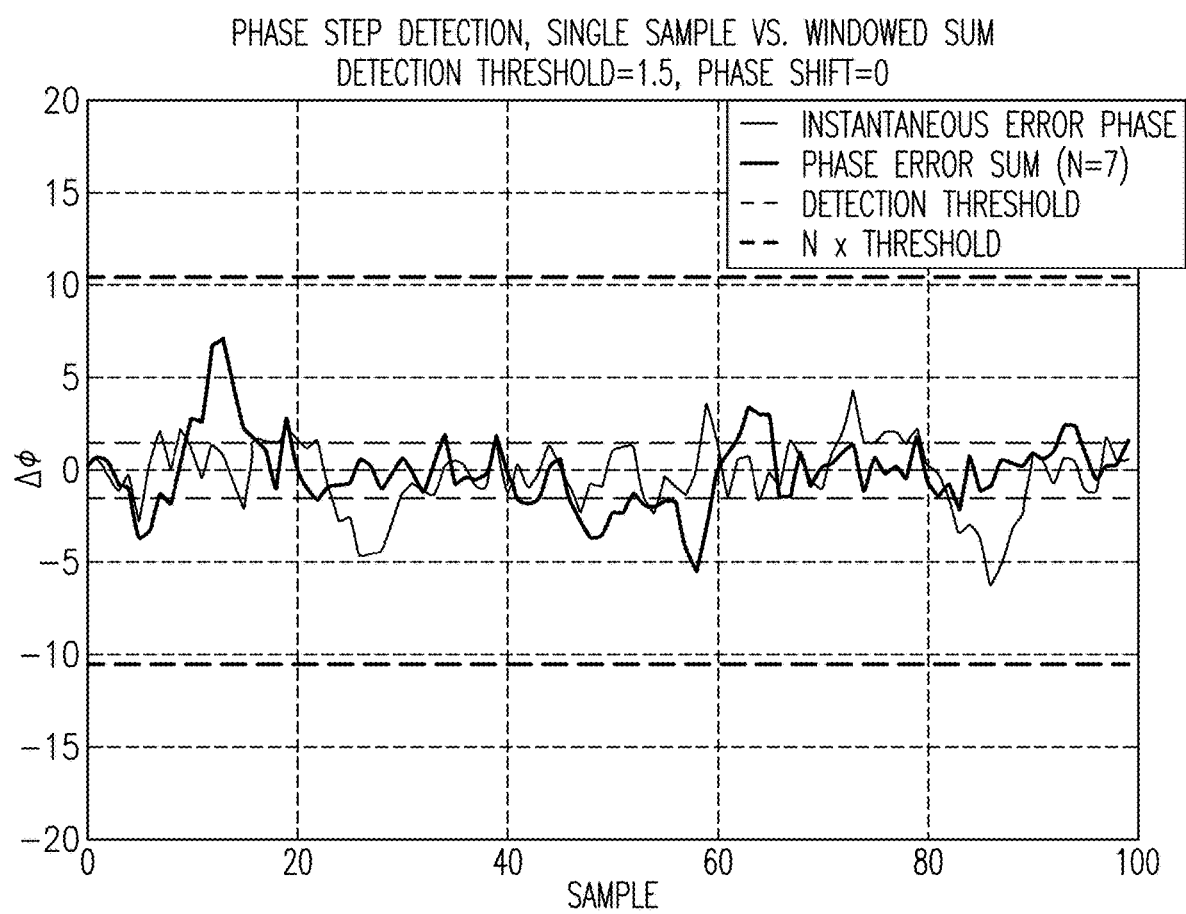
Figure 36C:
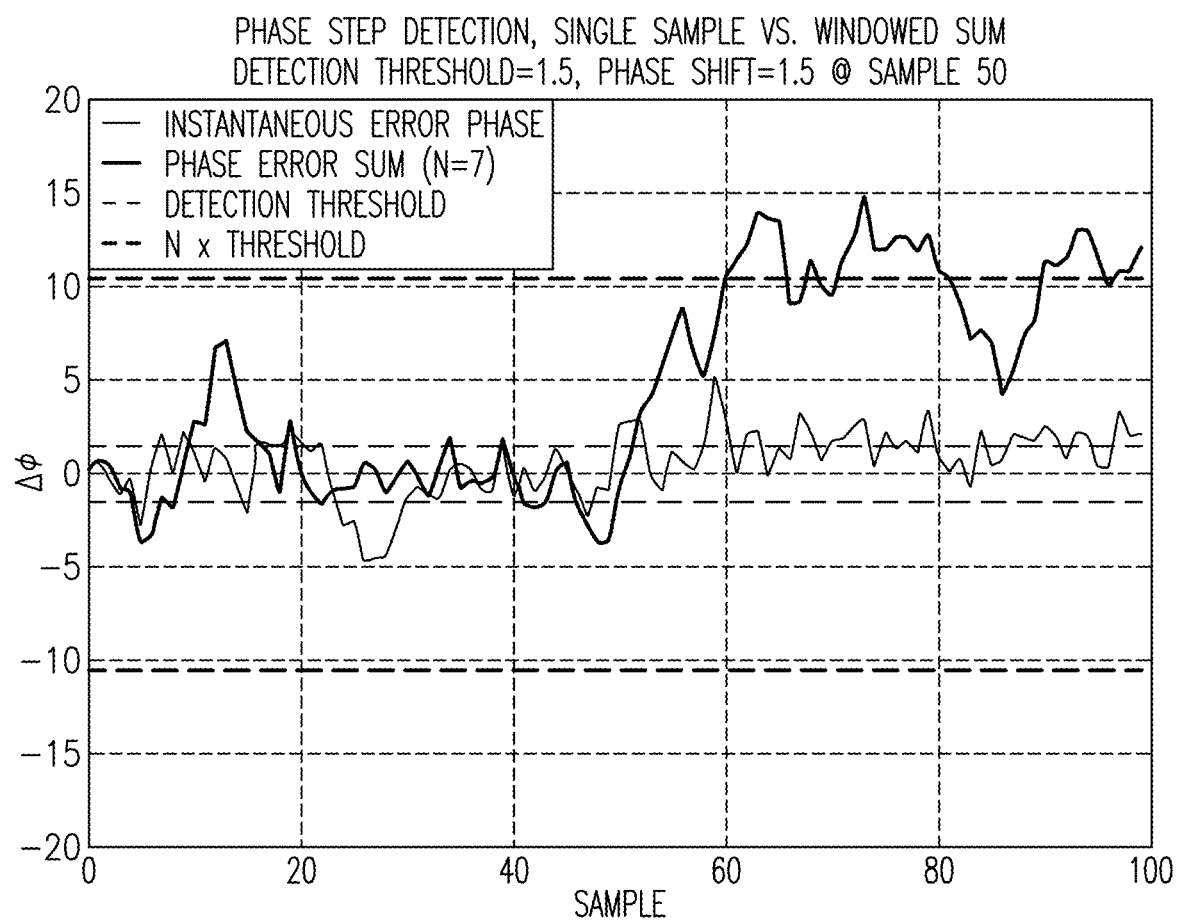
Figure 36D:
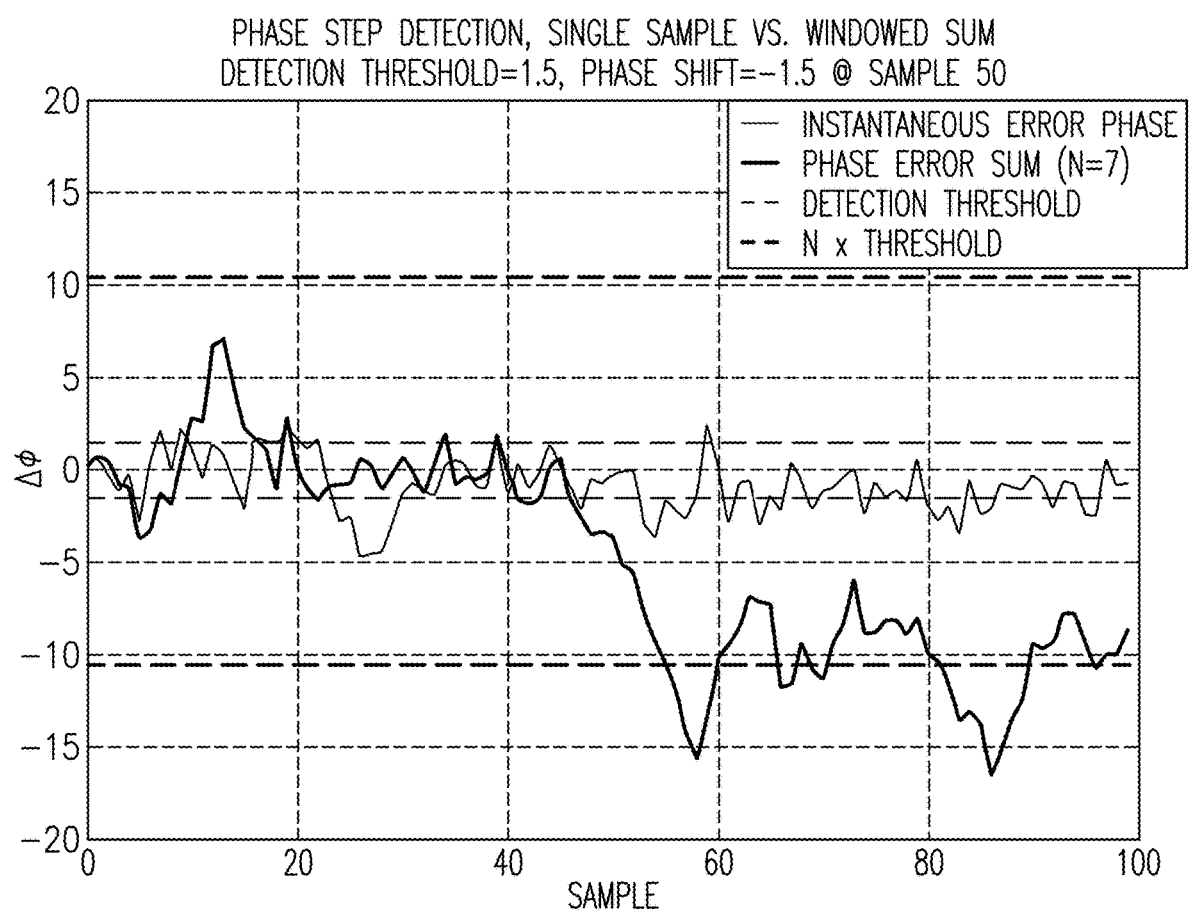

FIG. 35E illustrates a portion of a DPLL including a digital phase detector 1251. The digital phase detector 1251 includes a slew rate limiter 1252 for limiting a slew rate of the DPLL. In certain implementations, one or more components of a PLL operates with a slew rate limit to prevent sudden changes to the output clock signal.

Phase Shift Detection

In many applications, a phase locked loop (PLL) is deployed purely for frequency synchronization and the initial steady-state phase alignment between input timing reference and output clock is of no concern to the system's operation and therefore arbitrary.

Due to practical system operation, the source of a timing reference may be switched to a redundant, frequency synchronous source with arbitrary phase relationship to the original reference. In the event that such a switch occurs outside of the context of the PLL control logic, the phase difference between timing references is introduced to the PLL phase detector (PD) as phase error and results in an undesired, transient frequency deviation on the output clock.

Knowledge of the characteristics of such events allows for an implementation of appropriate detection circuitry to trigger proper handling of such phase shifts, preserving desired system operation.

It is often the case that sufficiently small phase shifts can result in transient effects which degrade system performance and, as a result, the magnitude of the phase shifts that are desirable to detect and compensate (i.e. detection threshold $T_R$) is on the order of or lower than the peak to peak noise of the timing reference itself.

In such a case, simply observing the phase error of each the timing input and comparing it to the detection threshold can result in the detection of false positives leading to the decimation of the timing reference's phase information.

One primary characteristic of a phase shift is that it has a non-zero mean, while the timing noise, assumed to be relatively Gaussian, is zero mean. Therefore, summing N consecutive samples will gain up the phase error contributed by a phase shift by a scalar of N, but not the timing noise contributors effectively increasing the signal to noise ratio of the detection circuitry.

This allows for the use of an extended detection threshold, $T_E$, as determined by: $T_E = N \times T_R$ while still detecting a phase shift of magnitude $T_R$ without resulting in false detections.

FIGS. 36A-36D are graphs of various example of phase step detection.

It should be noted that in lieu of using an extended threshold, the instantaneous phase error input may be differentiated prior to the windowed accumulation and compared against the original detection threshold. This would provide substantially the same increase in signal to noise ratio in the detection circuitry.

For further noise immunity, a majority rule processing is applied a set of N samples of the detection circuitry output can be used. This provides two distinct benefits.

First, by using a set of detector outputs versus a single positive output provides increased noise immunity against a false positive being declared in the event that a single phase error sample contained an excessively large amount of noise. As Gaussian noise is technically unbounded, the peak to peak noise grows with sample size, and systems are requested to run ad infinitum by customers, this is a valuable improvement. However, when a single phase error value is substantially large, a single shot measurement approach, with an independent detection threshold well in excess of the noise, can still be of value in conjunction with this invention.

Second, if a phase shift exactly equal to the detection threshold occurs, then it is likely that noise contributors will cause some detection decisions to yield a negative result while the mean phase shift measured is still greater than or equal to the detection threshold. If all N samples of the detection circuitry output are required to yield a positive result then minimum detectable the phase shift magnitude will be equal to the detection threshold plus the input noise of the timing reference.

Once the detection output yields positive results, but not enough subsequent samples have been collected to populate the N sample set entirely with post-shift sample which is required to detect a phase shift via majority rule, the output of the PD may be suppressed to prevent the PLL from responding to a potential phase shift. If after full population of the N sample set with post-shift samples, a majority rule vote does not confirm the potential step, the suppressed samples may be re-introduced downstream of the phase shift detector.

In one embodiment, a reference switching circuit (for instance, the reference switching circuit 19) is implemented in accordance with one or more of the features discussed above. In another embodiment, a reference monitor (for instance, the reference monitors 18 of FIG. 1, the reference monitor 602 of FIGS. 21 and 22, and/or the reference monitor 670 of FIG. 23) is implemented in accordance with one or more of the features discussed above.

Figure 37A:
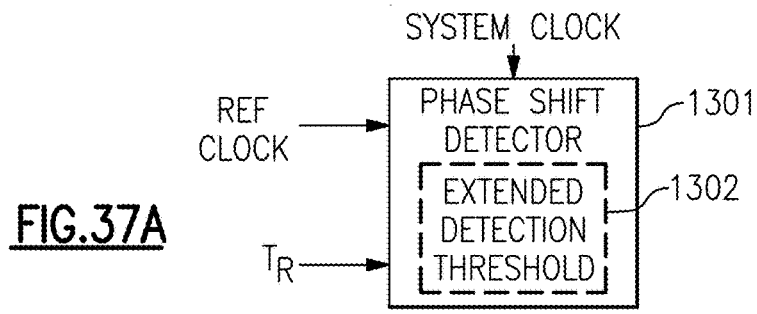
FIGS. 37A-37D are schematic diagrams of various embodiments of phase shift detectors.

FIG. 37A is a schematic diagram of one embodiment of a phase shift detector 1301. The phase shift detector 1301 detects a phase shift of a reference clock signal (REF CLOCK) based on timing of a system clock signal (SYSTEM CLOCK). The phase shift detector 1301 receives a detection threshold $T_R$. In certain implementations, the detection threshold $T_R$ is received from a user over an interface, such as a serial port.

In the illustrated embodiment, the phase shift detector 1301 operates with an extended detection threshold 1302. In certain implementations, the phase shift detector 1301 observes phase shift over N cycles of the reference clock signal. For instance, the phase shift detector 1301 can accumulate the detected phase shift over the N cycles, thereby calculating a windowed average. For example, summing N consecutive samples will gain up the phase error contributed by a phase shift by a scalar of N, but not the timing noise contributors effectively increasing the signal to noise ratio of the detection circuitry. Thus, a phase shift of magnitude $T_R$ can be detected without resulting in false detections.

Figure 37B:
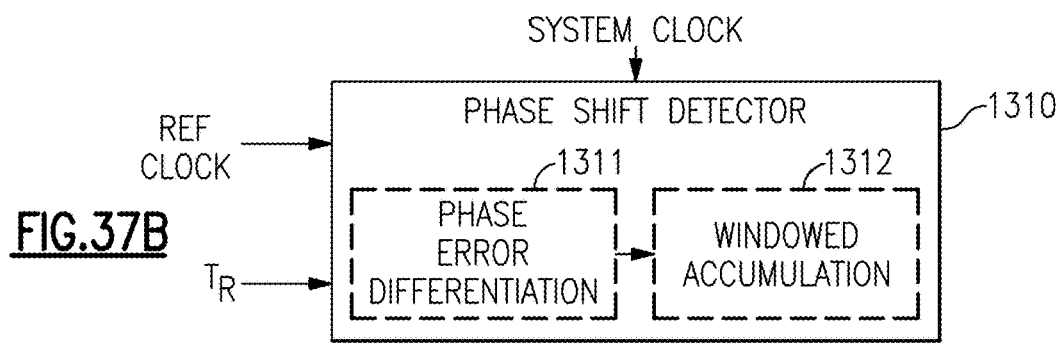

FIG. 37B is a schematic diagram of another embodiment of a phase shift detector 1310. The phase shift detector 1310 includes a phase error differentiation circuit 1311 and a windowed accumulator 1312.

Additionally or alternatively to an extended threshold, a phase shift detector can differentiate instantaneous phase error prior to windowed accumulation, and the result can be compared against the original detection threshold $T_R$.

Figure 37C:
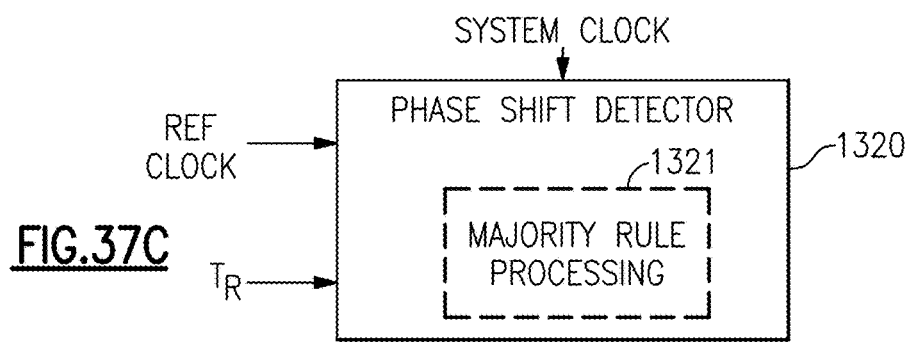

FIG. 37C is a schematic diagram of another embodiment of a phase shift detector 1320. The phase shift detector 1320 includes a majority rule processing circuit 1321, which is applied to a set of N samples of the reference clock signal taken by phase shift detector 1310.

The majority rule processing circuit 1321 increases noise immunity against a false positive being declared in the event that a single phase error sample contains an excessively large amount of noise. Additionally, when a phase shift substantially equal to the detection threshold occurs, then it is likely that noise contributors will cause some detection decisions to yield a negative result while the mean phase shift measured is still greater than or equal to the detection threshold. If all N samples of the detection circuitry output are required to yield a positive result, then minimum detectable the phase shift magnitude will be equal to the detection threshold plus the input noise of the timing reference.

Once the detection output yields positive results, but not enough subsequent samples have been collected to populate the N sample set entirely with post-shift sample to thereby detect a phase shift via majority rule, the output of the PD may be suppressed to prevent the PLL from responding to a potential phase shift. If after full population of the N sample set with post-shift samples, a majority rule vote does not confirm the potential step, the suppressed samples may be re-introduced downstream of the phase shift detector.

Figure 37D:
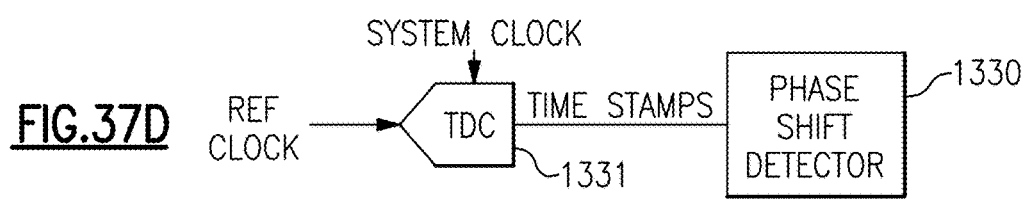

FIG. 37D is a schematic diagram of another embodiment of a phase shift detector 1330. The phase shift detector 1330 operates based on time stamps from a TDC 1331. The phase shift detector 1330 can include one or more of the features discussed above.

Reduction of Buildout Clock Switching Residue

Phase buildout clock switching can be used to reduce or minimize the output phase deviation resulting from the acquisition of a new reference clock by compensating for a phase difference equal to an estimate of the average offset.

In certain implementations herein, apparatus and methods for improving the quality of this estimate and thus reduce the residual phase error caused by the switch are provided.

Assuming the average phase difference in a phase lock loop (PLL) is constant over time (that is, the reference and output frequencies are nominally equal), the average of the first N phase error samples provides a better estimate of the offset as N increases. The exact rate of improvement varies with the statistical distribution of samples and the type of averaging performed (for instance, uniform or weighted).

The value of N cannot be arbitrarily large. Either the loop is inactive during sample collection, which delays the intended operation; or the loop is active and begins to react to phase errors, which affects the sample measurements. Furthermore, if the nominal frequencies are not equal, the phase error measurements will record a linear trend proportional to the frequency difference.

Restricting the maximum value of N such that the collection period is much less than the loop's time-constant can minimize the interaction between the phase averaging and the PLL operation. By temporarily increasing the loop's time-constant (reducing the bandwidth), the maximum value of N may be increased while limiting the interaction.

When there is an offset in frequencies, a deterministic time dependent phase offset is accumulated. The effect of this error can be mitigated by limiting N such that the error contributions in the average offset are dominated by random effects. Alternately, the linear trend may be canceled from the resulting average. The slope of the trend-line may be extracted from the samples themselves, or by some other estimate of the frequency offset.

Further variants to the phase offset data collection can be employed. Rather than using a fixed value of N, the noise and trend-line of the data may be examined, as it becomes available, to determine whether the collection period should be ended or extended. Also, adjustments made by the PLL to its output are known and this knowledge may be used to cancel the effects of these adjustments from the phase offset measurement.

A multi-sample average can be a better estimate for the offset than a single-sample. Although there are limitations to the amount of improvement possible, the significant error sources associated with the average may be limited or otherwise mitigated.

In certain embodiments herein, a deviation resulting from the acquisition of a new reference clock is compensated for a phase difference equal to an estimate of the average offset taken using a multi-sample average. In certain implementations, the estimate is obtained by comparing time stamps from TDCs (for example, the TDCs 4a-4d of FIG. 1). Additionally, rather than comparing one time stamp to another, the difference between multiple pairs of corresponding time stamps are calculated and averaged.

Figure 38:
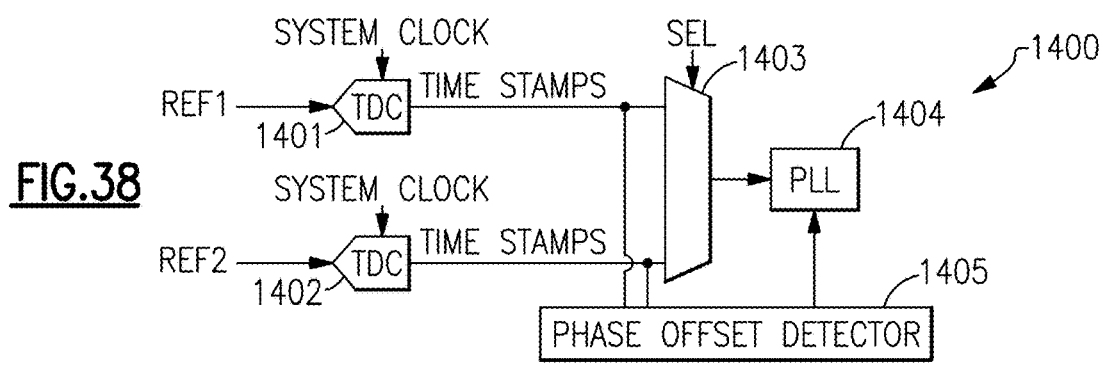
FIG. 38 is a schematic diagram of a phase offset detection system according to one embodiment.

FIG. 38 is a schematic diagram of a phase offset detection system 1400 according to one embodiment. The phase offset detection system 1400 includes a first TDC 1401, a second TDC 1402, a multiplexer 1403, a PLL 1404, and a phase offset detector 1405.

The phase offset detector 1405 detects a phase offset between the first reference clock signal (REF1) and the second reference clock signal (REF2) based on multiple samples of each clock signal. For example, a multi-sample average can be a better estimate for the offset than a single-sample. The phase offset detector 1405 can include one or more features discussed above. In certain implementations, the multiplexer 1403 is controlled by a reference switching circuit, such as the reference switching circuit 19 of FIG. 1. For example, the reference switching circuit can control which reference clock signal is provided to a phase and/or frequency detector of the PLL 1404 to serve as a timing reference.

As shown in FIG. 38, the phase offset detected by phase offset detector 1405 can be used to compensate the PLL 1404. For example, the detected phase offset can be used to reduce or minimize the output phase deviation resulting from the acquisition of a new reference clock by compensating for a phase difference equal to an estimate of the average offset. The phase offset detector 1405 can provide phase adjustment using the detected phase offset in any suitable manner.

The phase offset detection schemes described above can be incorporated into any of the PLLs described herein. For example, in one embodiment the clock synchronization and frequency translation IC 40 of FIG. 1 is implemented with one or more features of phase offset detection discussed above.

Aligning to Phase Information Lost in Decimation

In a zero-delay phase lock loop (PLL), it is often desirable to initialize the reference and output (feedback) clocks such that they exhibit minimal or relatively low initial skew (phase offset). This limits the phase error that the PLL pull-ins upon activation and reduces or minimizes the duration and magnitude of the phase/frequency transient response.

When decimation (such as by frequency division) of these clocks occur, the pair of edges which are best aligned may not be included in the set of edges available to the phase detector (PD). Knowledge of the decimation ratio for each clock signal can allow the device to extrapolate the timing of the best edge pairing, thus minimizing the initial phase error.

Zero-delay operation of a PLL describes the steady-state operation of the loop such that the reference and output clocks align—at least on a subset of the clock events. An extension to zero-delay, hitless operation, also defines that the loop acquisition transient is minimized.

When the clocks are decimated, to achieve frequency translation and/or meet the maximum frequency limits of the PLL components, the process of achieving hitless operation can be complicated. For a DPLL, it is possible for the PD to operate upon timestamps representing the reference and output signals. Calculations upon these timestamps provide a mechanism to address various challenges, including those that arise from implementation of hitless mode.

Given a timestamp, $S_j$, the interval between timestamps in a path, $T \approx S_{j+1} - S_j$, and the decimation ratio associated with that path, M, all the events between $S_j$ and $S_{j+1}$, which were lost, can be estimated. Denote the non-decimated sequence of events starting with $S_j$ as $S_{j,k}$, where $S_j = S_{j,0}$ and k is in [0 ... M−1]. Then $S_{j,k}$ can be approximated by $S_{j,k} \approx S_j + T \cdot k \div M$.

Figure 39:
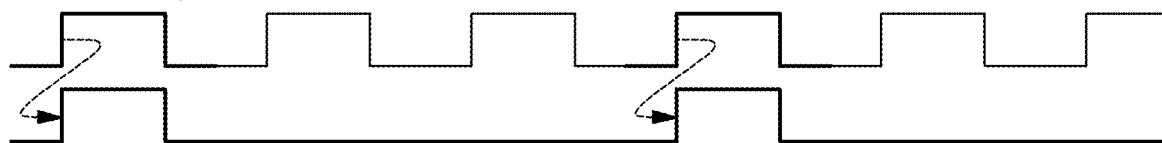
FIG. 39 is a graph of one example of possible phases after a divide by three.
Figure 39:
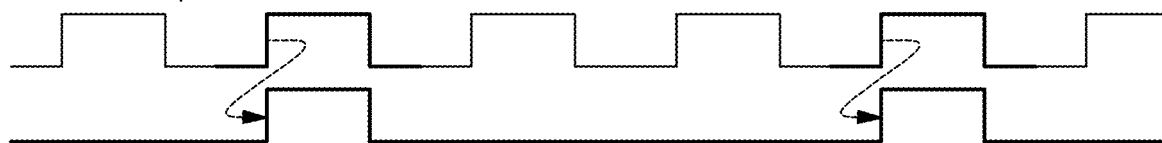
Figure 39:
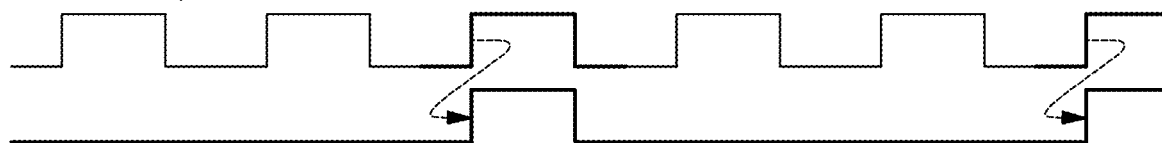

FIG. 39 is a graph of one example of possible phases after a divide by three.

Figure 40:
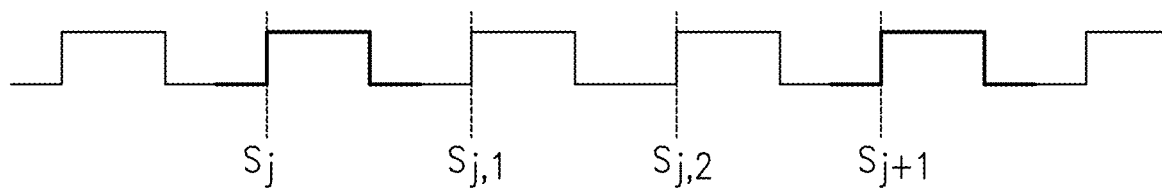
FIG. 40 is a graph of one example of time stamp interpolations.

FIG. 40 is a graph of one example of time stamp interpolations.

If the DPLL is configured such that the output frequency is an integer multiple of the reference frequency, every reference event has an exactly corresponding output event. In this case, interpolation applied to the output events will yield the nearest match.

In certain implementations, the time distance (D) to the nearest match is constrained to D≤0.5 UI, where the unit interval, UI=T÷M. For any reference event with timestamp X, there are consecutive decimated output events represented by $S_j$ and $S_{j+1}$ such that $S_j \leq X < S_{j+1}$. Let the divided phase of X relative to $S_j$ be denoted as $\varphi = (X - S_j) \div (S_{j+1} - S_j)$. Then the extrapolated output index which matches closest is $K = \text{round}(M \cdot \varphi)$. If K=M, $S_{j+1,0}$ is the nearest match, otherwise $S_{j,K}$ is the best. Recall $S_{j,K} \approx S_j + T \cdot K \div M$, so applying an offset of $T \cdot K \div M$ to the sequence of output timestamps will cause the DPLL to align to the pair of edges which match best, even when K≠0, that is, the alignment pair is obscured by the output decimation.

Similarly, if the reference frequency is an integer multiple of the output frequency, every output event has an exact corresponding reference event. As before, interpolation will yield the best matching pair, only now the extrapolation is performed upon the reference sequence.

In certain embodiments herein, one or more of the features discussed above is implemented in a digital phase detector (for example, the digital phase detector 51 of FIG. 3) and/or a time stamp process (for example, the time stamp processor 131 of FIG. 5).

Figure 41:
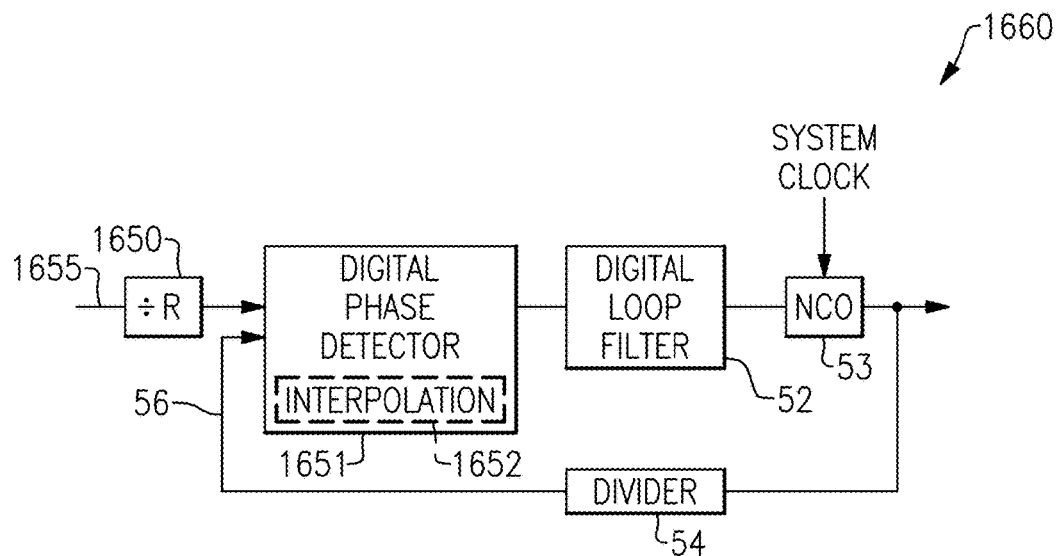
FIG. 41 is a schematic diagram of a DPLL according to another embodiment.

FIG. 41 is a schematic diagram of a DPLL 1660 according to another embodiment. The DPLL 1660 of FIG. 41 is similar to the DPLL 50 of FIG. 2A, except that the DPLL 1660 of FIG. 41 includes an input divider 1650 and a digital phase detector 1651. The input divider 1650 receives an input reference 1655. The digital phase detector 1651 includes an interpolation circuit 1652, which is implemented in accordance with one or more features discussed above. For example, the interpolation circuit 1652 can account for lost edges arising from decimation of the divider 1650 and/or the divider 54.

Implementing the DPLL 1660 with the interpolation circuit 1652 can provide a number of advantages. For example, knowledge of the decimation ratio for each clock signal can allow the device to extrapolate the timing of the best edge pairing, thus minimizing the initial phase error.

Figure 42:
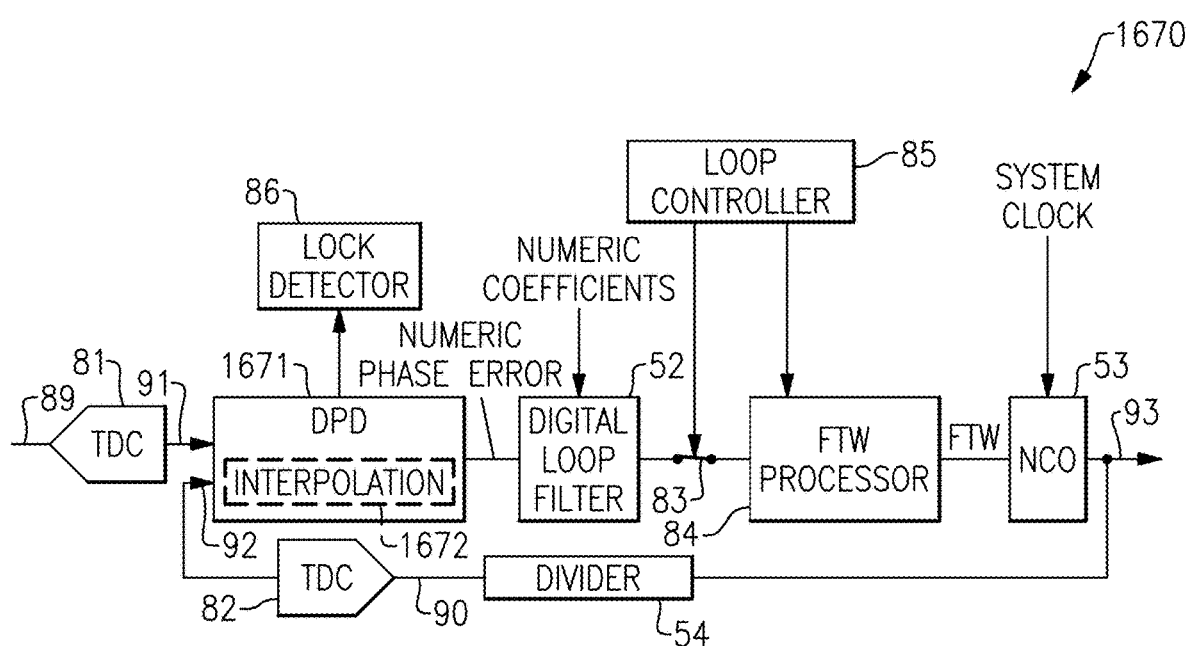
FIG. 42 is a schematic diagram of a DPLL according to another embodiment.

FIG. 42 is a schematic diagram of a DPLL 1670 according to another embodiment. The DPLL 1670 of FIG. 42 is similar to the DPLL 80 of FIG. 3, except that the DPLL 1670 of FIG. 42 includes a digital phase detector 1671 including an interpolation circuit 1671, which is implemented in accordance with one or more features discussed above.

Applications

Devices employing the above described schemes can be implemented into various electronic devices. Examples of electronic devices include, but are not limited to, consumer electronic products, parts of the consumer electronic products, electronic test equipment, communication infrastructure, etc. For instance, one or more clock synchronization and frequency translation ICs can be used in a wide range of analog, mixed-signal, and RF systems, including, but not limited to, data converters, chip-to-chip communication systems, clock and data recovery systems, base stations, mobile devices (for instance, smartphones or handsets), laptop computers, tablets, and wearable electronics. A wide range of consumer electronics products can also include such ICs for Internet of Things (IOT) applications. For instance, one or more clock synchronization and frequency translation ICs can be included in an automobile, a camcorder, a camera, a digital camera, a portable memory chip, a washer, a dryer, a washer/dryer, a copier, a facsimile machine, a scanner, a multi-functional peripheral device, or a wide range of other consumer electronics products. Furthermore, electronic devices can include unfinished products, including those for industrial, medical and automotive applications.

In one example, a clock synchronization and frequency translation IC provides jitter cleanup and synchronization in GPS, PTP (IEEE-1588), and/or SyncE applications. In a second example, a clock synchronization and frequency translation IC is included in a base station (for instance, a femtocell or picocell) to control clocking for baseband and radio. In a third example, a clock synchronization and frequency translation IC controls mapping/demapping for a transport network, such as an optical transport network (OTN), while providing jitter cleaning. In a fourth example, a clock synchronization and frequency translation IC provides holdover, jitter cleanup, and phase transient control for Stratum 2, 3e, and 3 applications. In a fifth example, a clock synchronization and frequency translation IC provides support for data conversion clocking, such as analog-to-digital (A/D) and/or digital-to-analog (D/A) conversion, for instance, for JESD204B support. In a sixth example, a clock synchronization and frequency translation IC provides timing for wired infrastructure support, such as cable infrastructure and/or carrier Ethernet.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A distributed timing system comprising:
   a source IC comprising a time-to-digital converter (TDC) configured to detect a timing of a signal by using a common reference signal to generate a plurality of digital time stamps representing a plurality of transition times of the signal, and to generate a digital timing signal that digitally represents the timing of the signal based on the plurality of digital time stamps;
   a digital interface electrically coupled to the source IC; and
   a destination IC configured to receive the digital timing signal from the digital interface and the common reference signal, wherein the destination IC configured to recover the signal based on the digital timing signal and the common reference signal.

2. The distributed timing system of claim 1, wherein the source IC comprises a format conversion circuit configured to generate the digital timing signal based on the plurality of digital time stamps.

3. The distributed timing system of claim 1, wherein the digital interface comprises a serial interface.

4. The distributed timing system of claim 1, further comprising one or more additional source ICs configured to provide one or more additional digital timing signals to the digital interface.

5. The distributed timing system of claim 1, wherein the destination IC comprises a format conversion circuit configured to process the digital timing signal to generate a plurality of reference digital time stamps representing the plurality of transition times of the signal.

6. The distributed timing system of claim 1, further comprising one or more additional destination ICs configured to receive the digital timing signal from the timing interface, and to recover the signal based on the digital timing signal and the common reference signal.

7. The distributed timing system of claim 1, wherein the destination IC recovers both a frequency of the signal and a phase of the signal.

8. The distributed timing system of claim 1, wherein the destination IC comprises a digital phase-locked loop (DPLL) configured to output a recovered signal having an average frequency that is precisely an average frequency of the signal.

9. The distributed timing system of claim 2, wherein the source IC further comprises a synchronization circuit configured to synchronize the TDC and the format conversion circuit based on the common reference signal and a local system clock signal.

10. The distributed timing system of claim 5, further comprising a DPLL configured to recover the signal based on the plurality of reference digital time stamps.

11. The distributed timing system of claim 5, wherein the source IC further comprises a synchronization circuit configured to synchronize the format conversion circuit based on the common reference signal and a local system clock signal.

12. The distributed timing system of claim 9, further comprising a system clock phase-locked loop (PLL) configured to generate the local system clock signal for the synchronization circuit based on a local system reference signal.

13. The distributed timing system of claim 11, further comprising a system clock PLL configured to generate the local system clock signal for the synchronization circuit based on a local system reference signal.

14. A clock synchronization and frequency translation integrated circuit (IC) comprising:
   a first pin configured to receive a digital timing signal indicating a plurality of digital time stamps generated using a common reference signal and representing a plurality of transition times of a signal;
   a second pin configured to receive the common reference signal;
   a format conversion circuit configured to process the digital timing signal to generate a plurality of reference digital time stamps;
   a digital phase-locked loop (DPLL) configured to recover the signal from the plurality of reference digital time stamps; and
   a synchronization circuit configured to synchronize the format conversion circuit and the DPLL based on the common reference signal and a local system clock signal.

15. The clock synchronization and frequency translation IC of claim 14, wherein the DPLL recovers both a frequency of the signal and a phase of the signal.

16. The clock synchronization and frequency translation IC of claim 14, further comprising a third pin configured to receive a local system reference signal, and a system clock PLL configured to generate the local system clock signal for the synchronization circuit based on the local system reference signal.

17. A method of distributed timing, the method comprising:
   detecting a timing of a signal by using a common reference signal to generate a plurality of digital time stamps representing a plurality of transition times of the signal using a time-to-digital converter (TDC) of a first IC;
   generating a digital timing signal that digitally represents the timing of the signal based on the plurality of digital time stamps using the first IC;
   transmitting the digital timing signal from the first IC to a second IC over a digital interface; and
   recovering the signal in the second IC based on the digital timing signal and the common reference signal.

18. The method of claim 17, wherein recovering the signal in the second IC comprises processing the digital timing signal to generate a plurality of reference digital time stamps representing the plurality of transition times of the signal using a format conversion circuit of the second IC.

19. The method of claim 18, wherein recovering the signal in the second IC further comprises using a digital phase-locked loop (DPLL) to recover the signal from the plurality of reference digital time stamps.

20. The method of claim 19, further comprising synchronizing the format conversion circuit and the DPLL based on the common reference signal and a local system clock signal using a synchronization circuit of the second IC.

* * * * *